United States Patent
Popescu et al.

(10) Patent No.: US 7,153,186 B2
(45) Date of Patent: Dec. 26, 2006

(54) JET SINGULATION

(75) Inventors: Ross Popescu, Morgan Hill, CA (US);
Clarence Tamargo, Stockton, CA (US);
Shan Jiang, Morgan Hill, CA (US)

(73) Assignee: Towa Intercon Technology, Inc.,
Morgan Hill, CA (US)

( * ) Notice: Subject to any disclaimer, the term of this patent is extended or adjusted under 35 U.S.C. 154(b) by 133 days.

(21) Appl. No.: 10/930,695

(22) Filed: Aug. 30, 2004

(65) Prior Publication Data

US 2005/0126472 A1 Jun. 16, 2005

Related U.S. Application Data

(63) Continuation-in-part of application No. 10/661,385, filed on Sep. 12, 2003.

(60) Provisional application No. 60/562,788, filed on Apr. 15, 2004, provisional application No. 60/410,744, filed on Sep. 13, 2002.

(51) Int. Cl.
*B24B 5/00* (2006.01)
*H01L 21/301* (2006.01)

(52) U.S. Cl. .............................. 451/6; 451/75; 451/87; 438/460

(58) Field of Classification Search ................... 451/6, 451/64, 75, 87, 88, 99; 438/460
See application file for complete search history.

(56) References Cited

U.S. PATENT DOCUMENTS

| | | | |
|---|---|---|---|
| 3,694,972 A | 10/1972 | Emeis | |
| 4,917,123 A * | 4/1990 | McConnell et al. | 134/95.2 |
| 5,671,910 A | 9/1997 | Davies et al. | |
| 6,113,473 A * | 9/2000 | Costantini et al. | 451/60 |
| 6,325,059 B1 | 12/2001 | Tieber | |
| 2002/0006769 A1* | 1/2002 | Tsuihiji et al. | 451/53 |
| 2002/0083938 A1 | 7/2002 | Tieber | |
| 2004/0198179 A1 | 10/2004 | Gadd | |
| 2005/0118790 A1* | 6/2005 | Lee et al. | 438/460 |
| 2005/0196940 A1* | 9/2005 | Yajima et al. | 438/460 |

FOREIGN PATENT DOCUMENTS

| | | |
|---|---|---|
| WO | WO 00/53382 | 9/2000 |
| WO | WO 02/35585 A1 | 5/2002 |
| WO | WO 02/085573 A1 | 10/2002 |
| WO | WO 03/055645 A1 | 7/2003 |
| WO | WO 03/055654 A1 | 7/2003 |
| WO | WO 2004/087378 A1 | 10/2004 |

* cited by examiner

*Primary Examiner*—Jacob K. Ackun, Jr.
(74) *Attorney, Agent, or Firm*—Beyer Weaver & Thomas, LLP

(57) ABSTRACT

Techniques for singulating a substrate into a plurality of component parts is disclosed. The singulation techniques include generating a jet stream in order to cut through large components so as to produce smaller components. The techniques are particularly suitable for singulating surface mount devices such as chip scale packages, ball grid arrays (BGA), flip chips, lead less packages (QFN) and the like. The techniques are also suitable for singulating photonic devices.

10 Claims, 43 Drawing Sheets

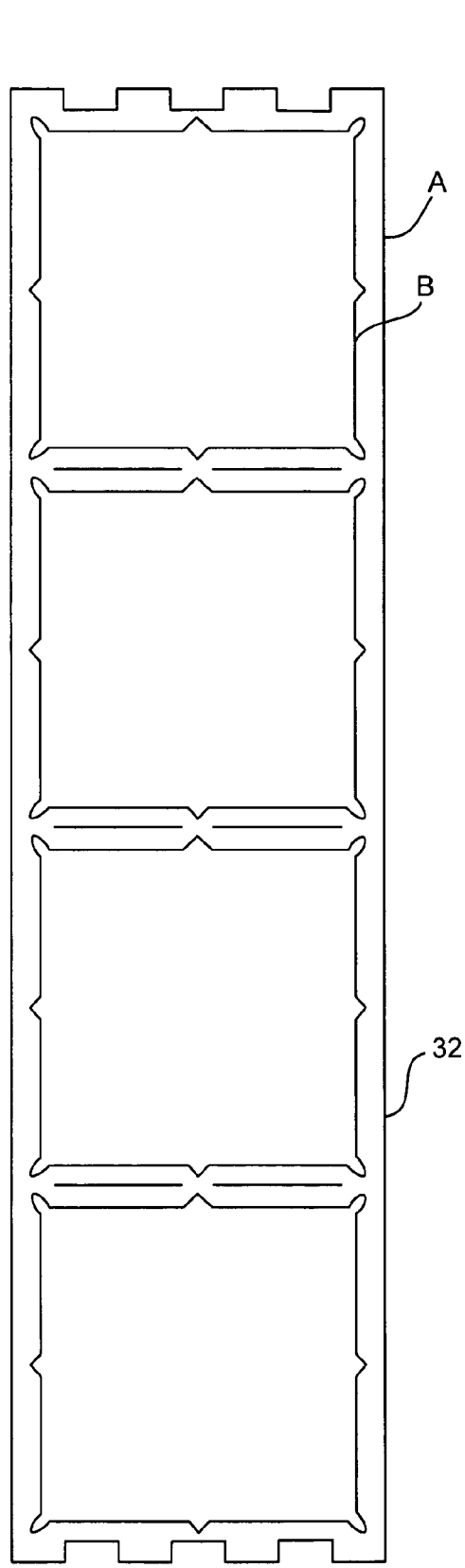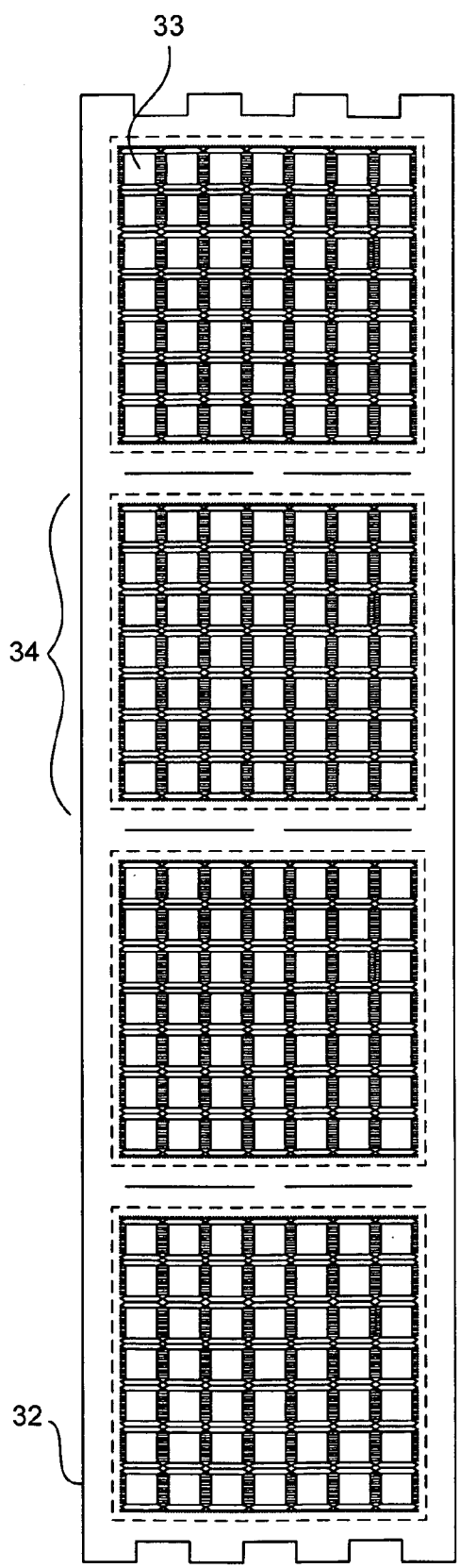
FIG. 3A                    FIG. 3B

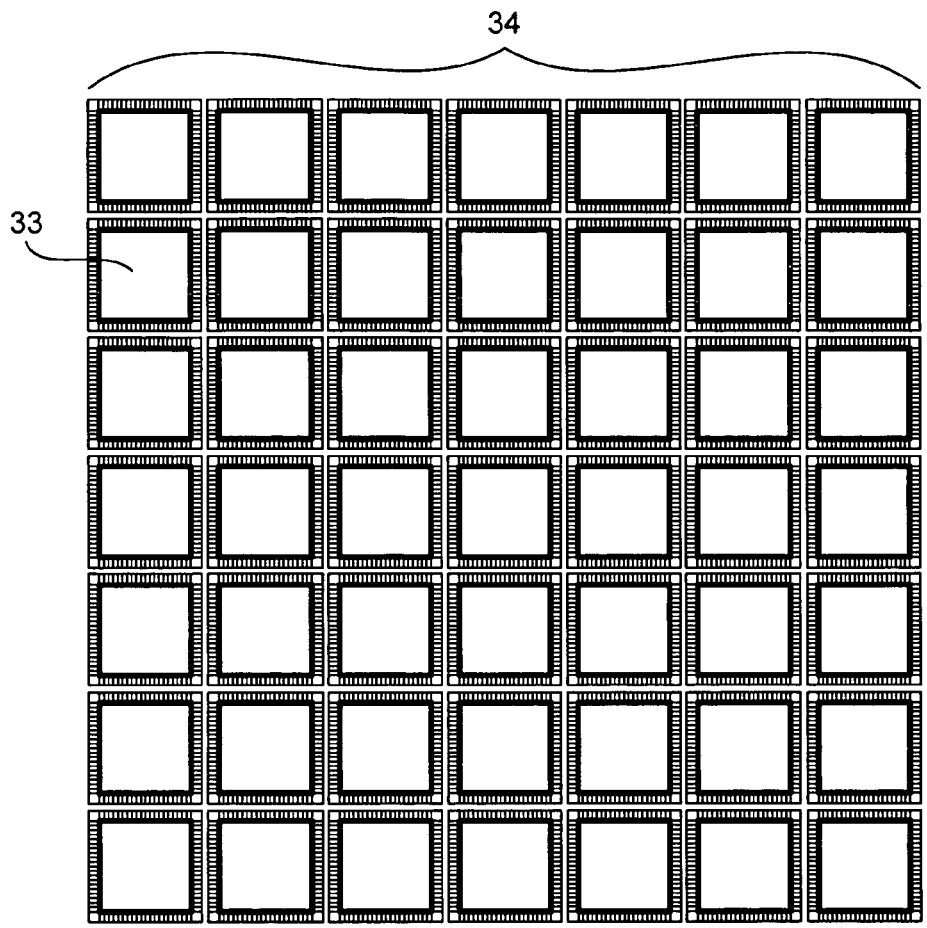
*FIG. 3C*
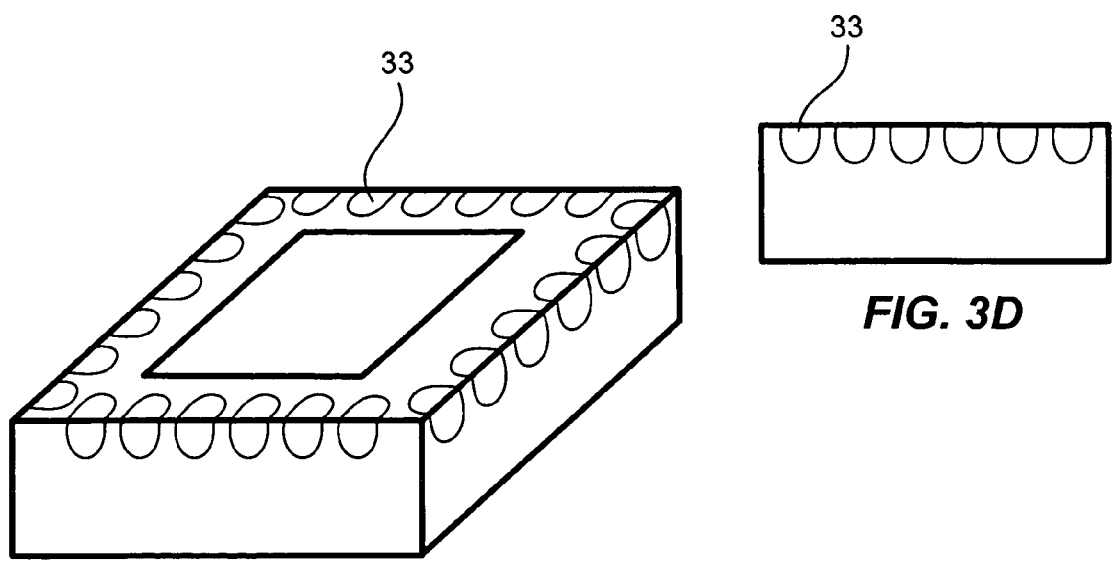
*FIG. 3E*
*FIG. 3D*

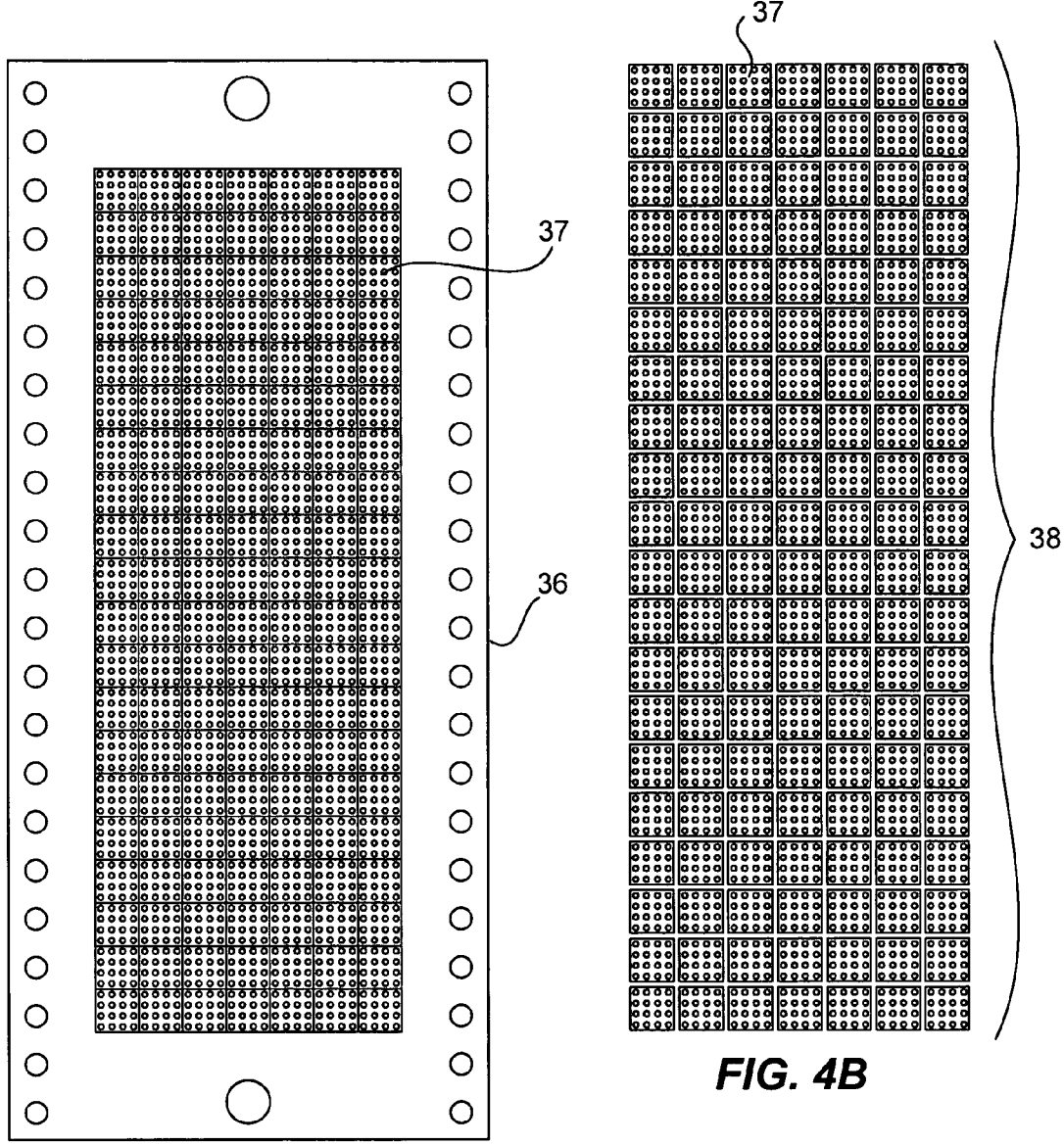
FIG. 4B
FIG. 4A
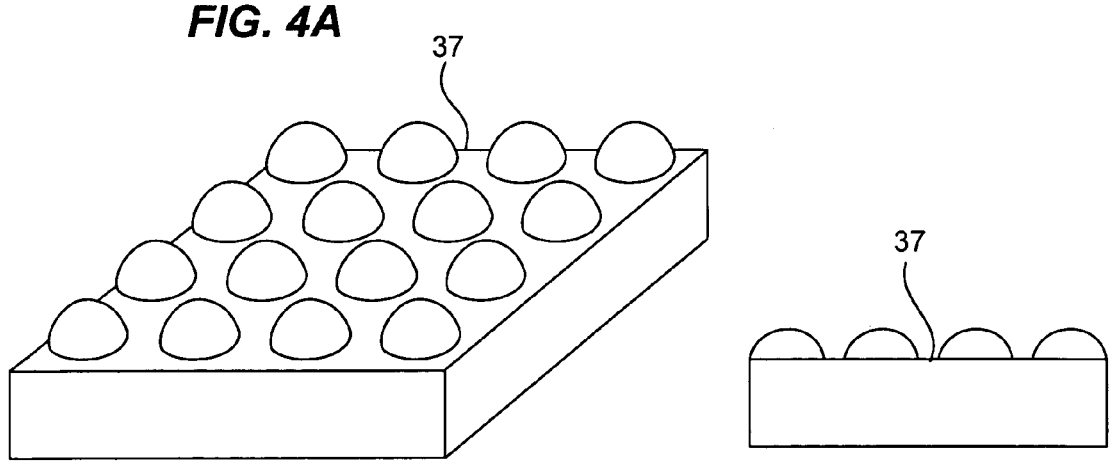
FIG. 4D
FIG. 4C

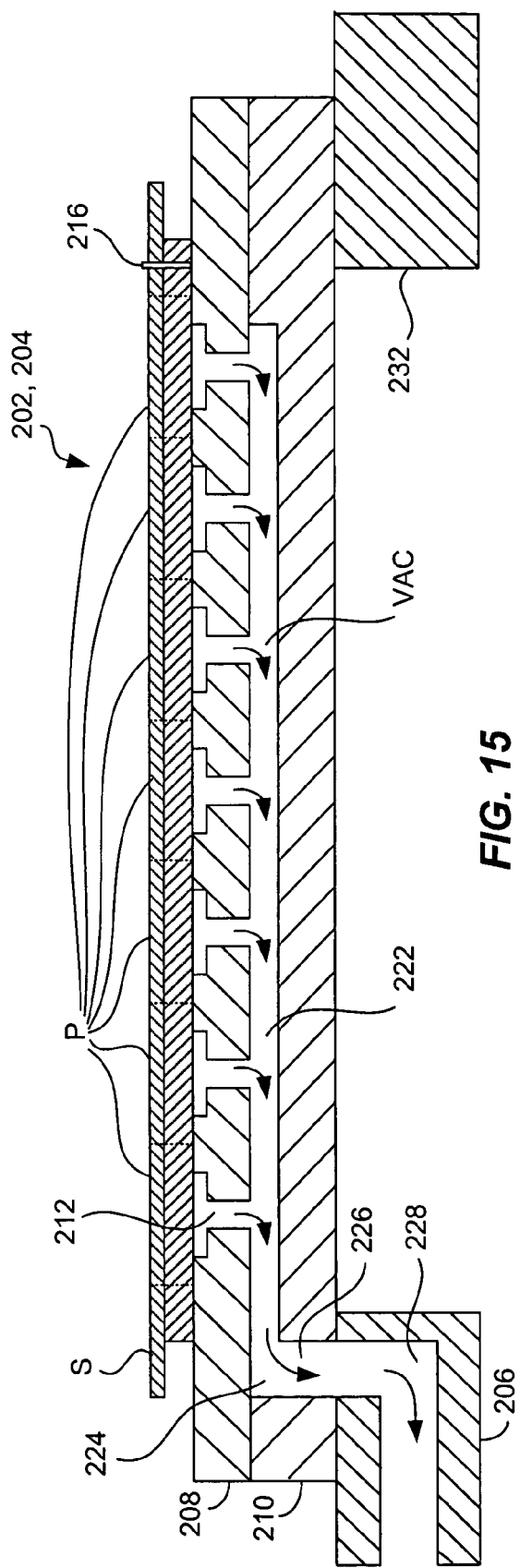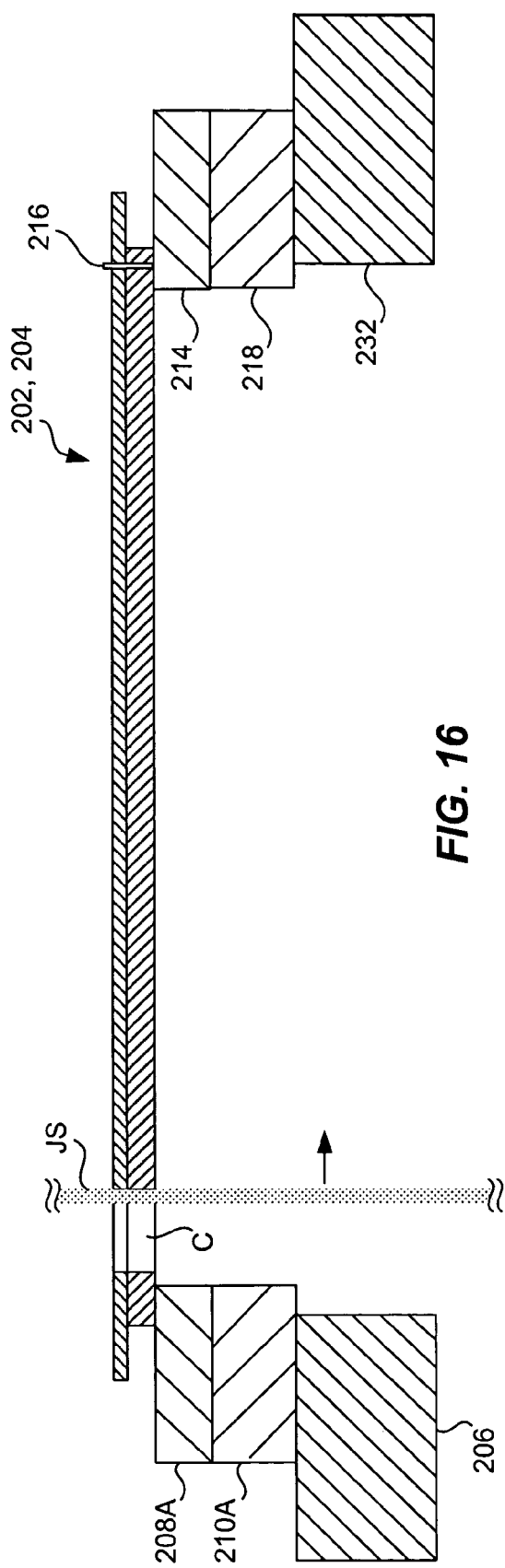
FIG. 15
FIG. 16

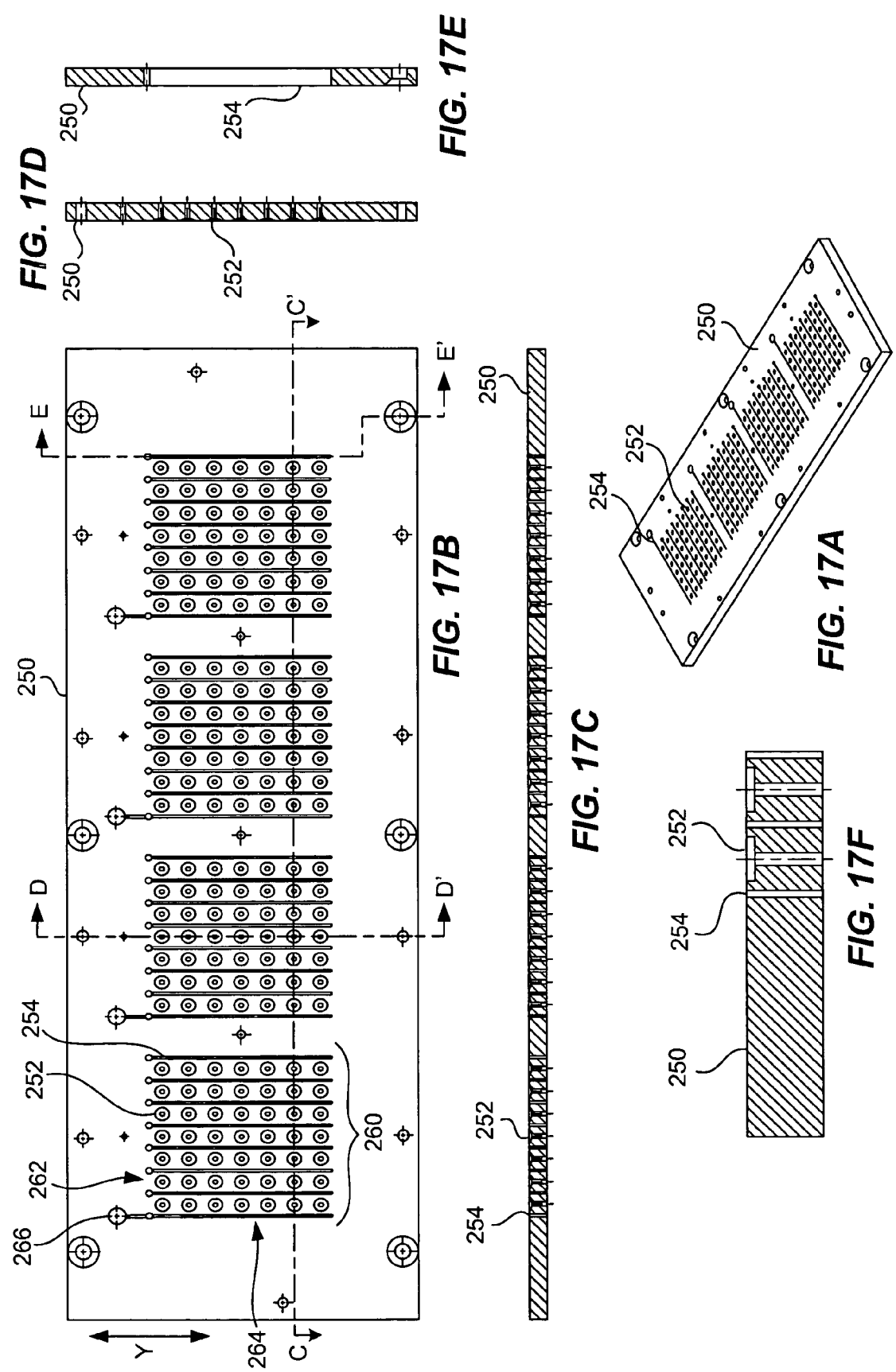

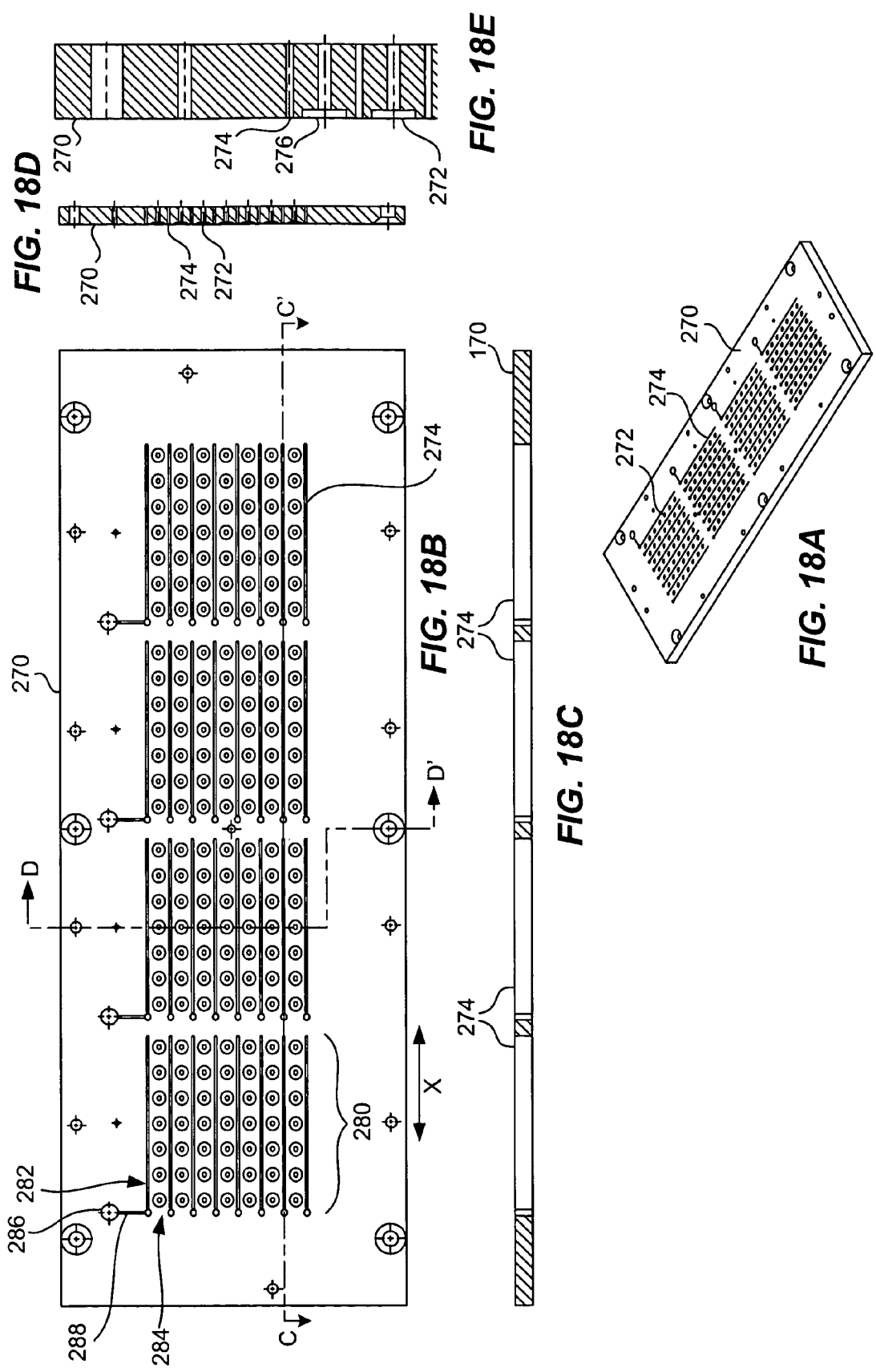

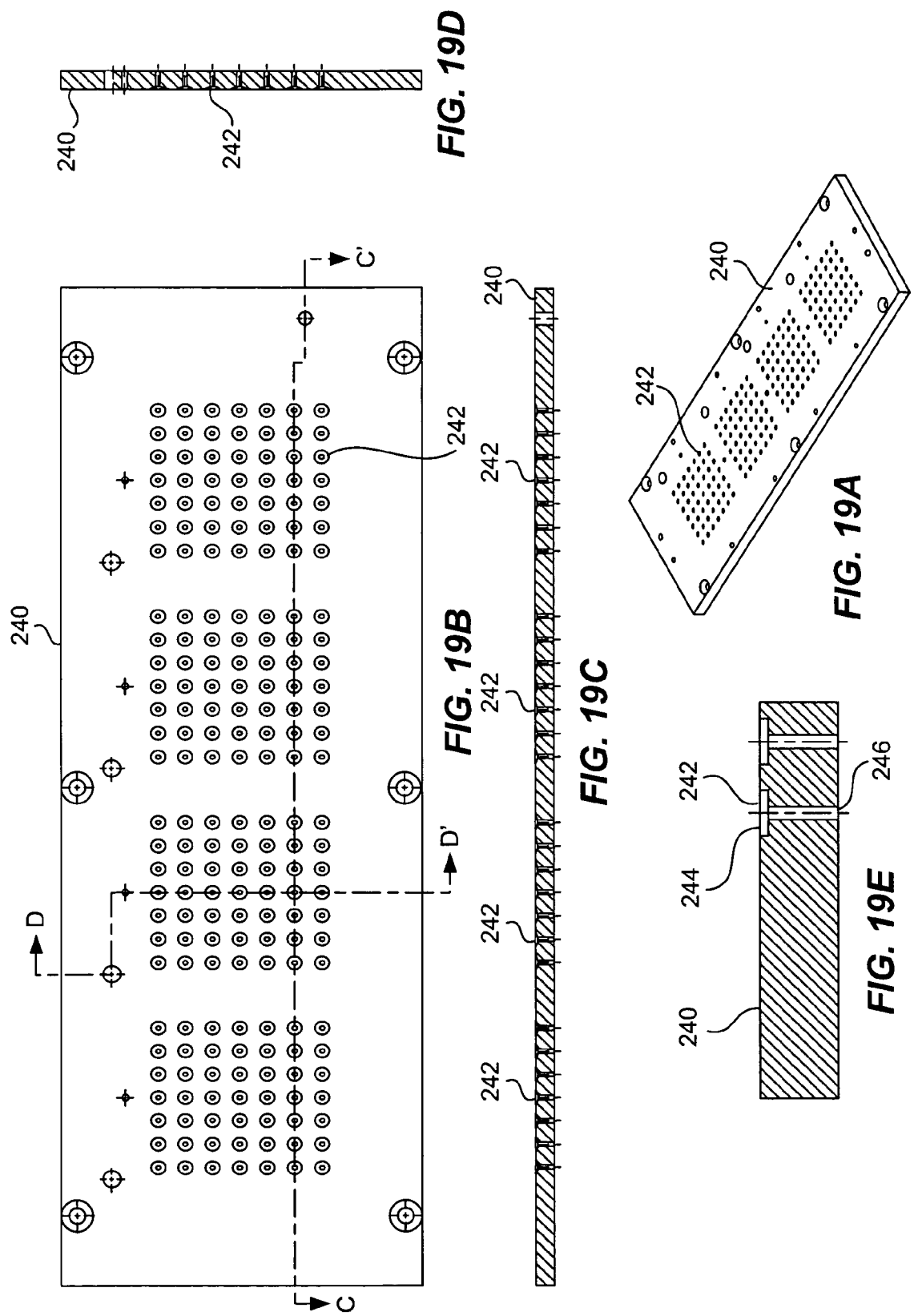

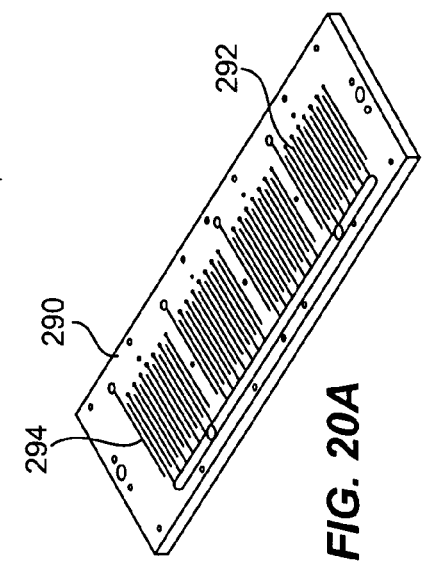
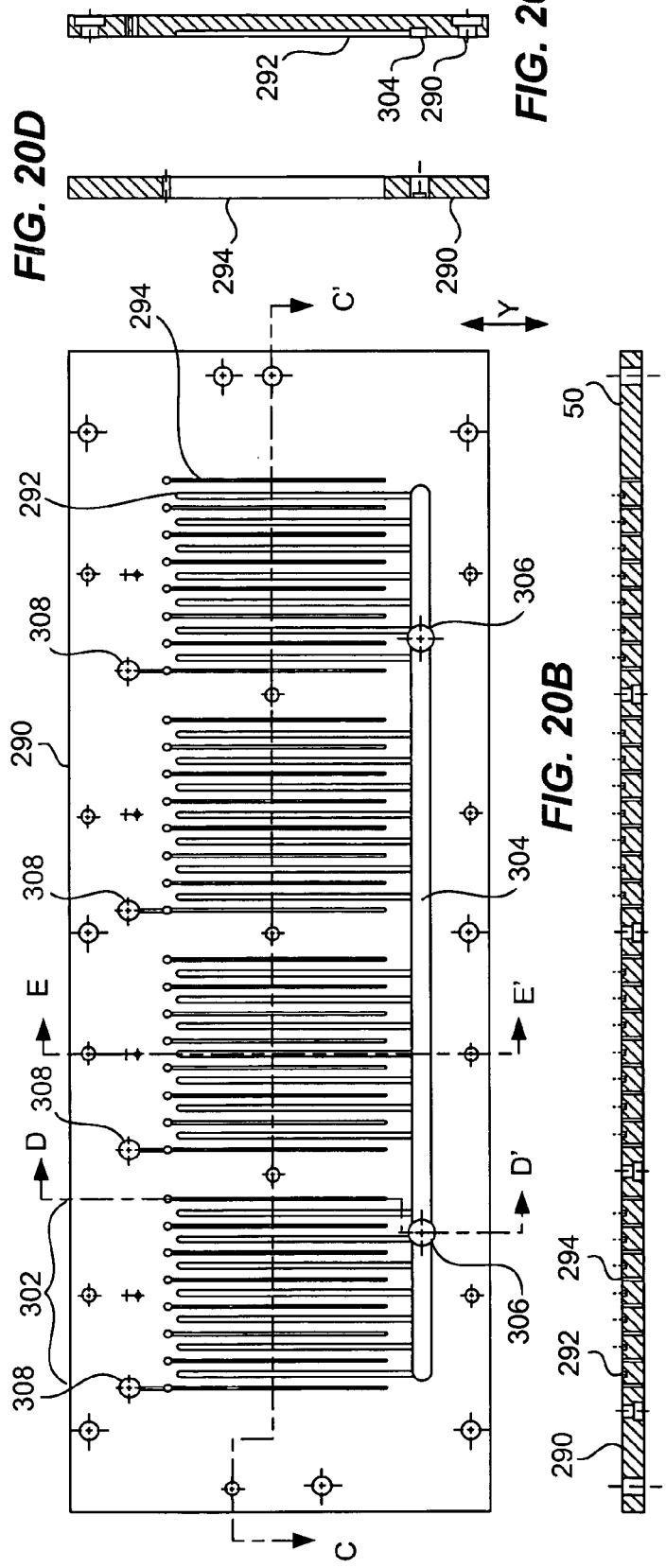
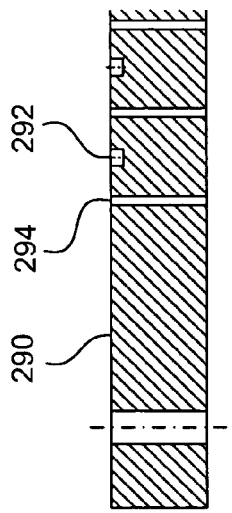

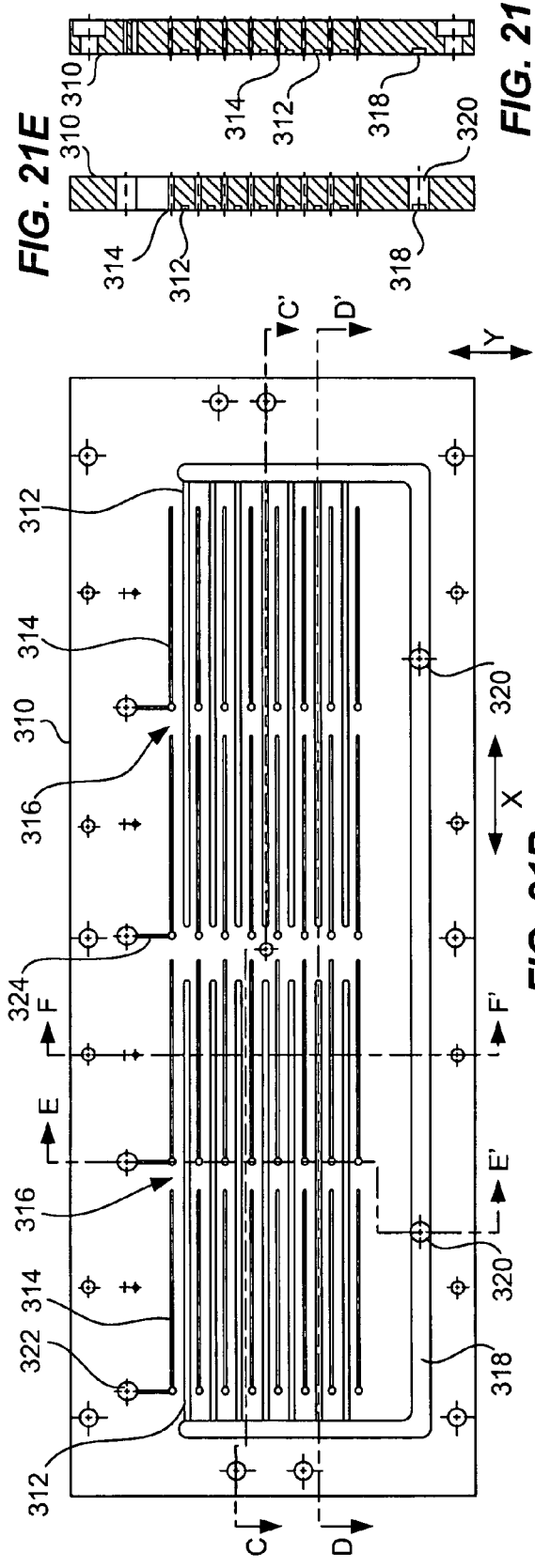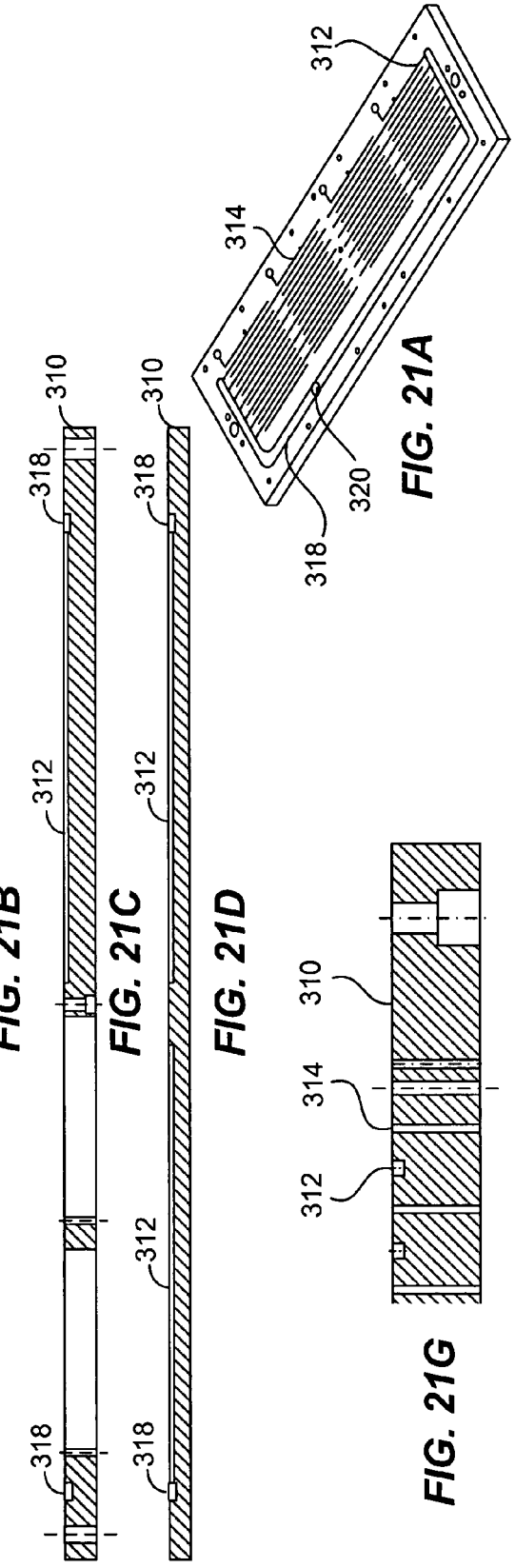

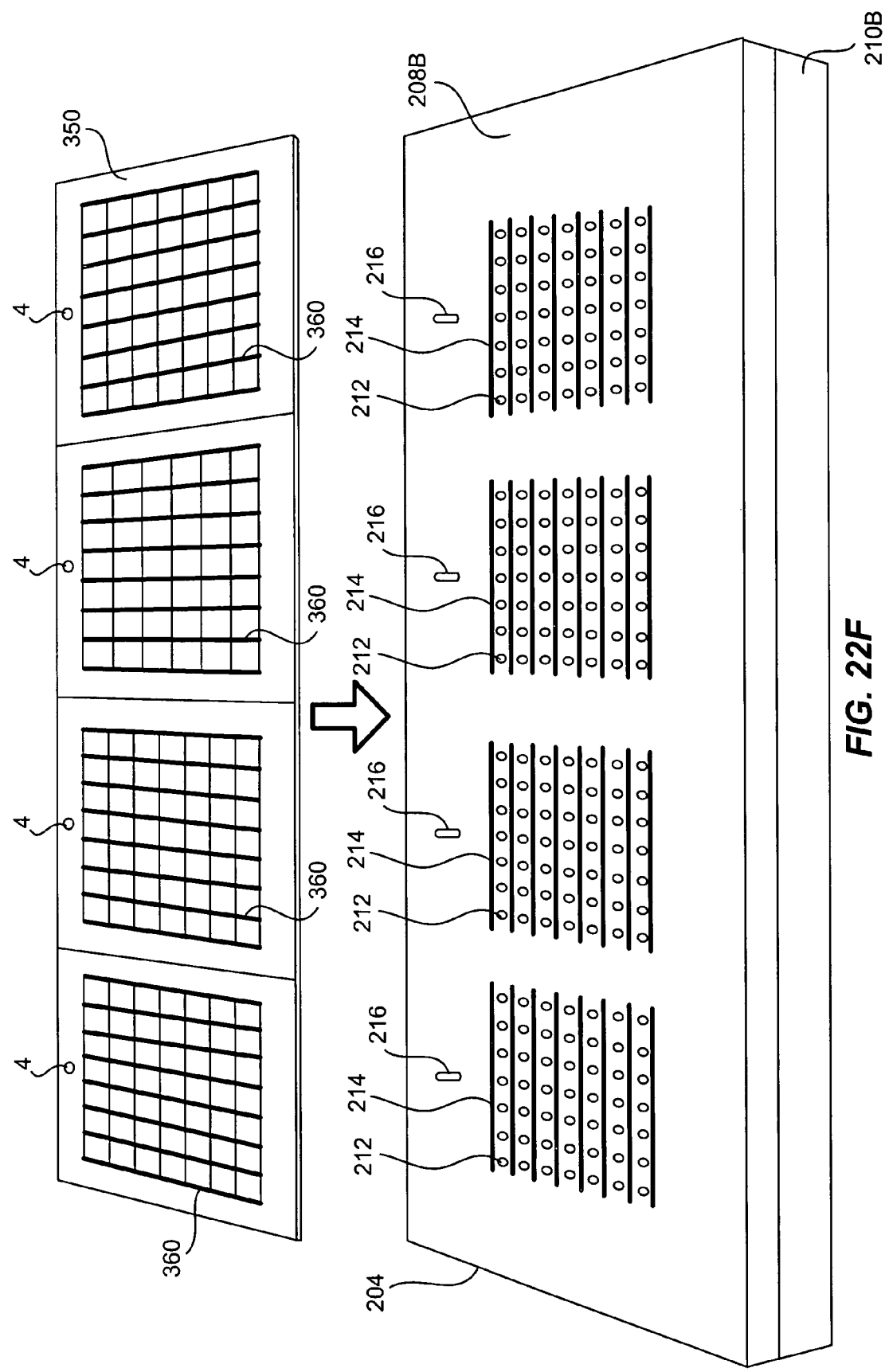

JET SINGULATION

CROSS REFERENCE TO RELATED APPLICATION

This application claims the priority of the following U.S. Patent Applications, which are hereby incorporated herein by reference:

U.S. patent application Ser. No. 10/661,385 filed on Sep. 12, 2003 and entitled JET SINGULATION, which claims priority to U.S. Provisional Application No. 60/410,744 entitled "JET SINGULATION", filed on Sep. 13, 2002 and U.S. Provisional Application No. 60/562,788 entitled "JET SINGULATION", filed on Apr. 15, 2004 which are all incorporated herein by reference.

FIELD OF THE INVENTION

The invention generally relates to integrated circuit processing equipment. More particularly, the invention relates to an improved apparatus and method of singulating a substrate into a plurality of component parts.

BACKGROUND OF THE INVENTION

A singulation procedure is typically performed to separate integrated circuit packages such as IC chips from a substrate such as a circuit board. During singulation, the substrate is typically held in place while one or more saw blades cut straight lines through the substrate to form the individual integrated circuit packages. Although dicing with saw blades has worked well, continuing advancements in the industry have tested the limitations of saw singulation.

Cutting small devices is particularly problematic for saw singulation. When device dimensions are small as for example less than 3 mm×3 mm, vacuum fixtures are unable to retain the small devices during sawing, with consistency. As the saw blade passes through a device, it is both rotating and translating relative to the device under process. The resulting force vectors have both vertical and shear components. As the shear component overwhelms the holding force of the vacuum fixture, the singulation yield drops due to non-conforming geometries, damage, or lost parts. As feed rates increase, the magnitude of the shear component increases commensurately and magnifies the device retention problem. Therefore, feed rates are minimized to protect yields. The result, however, is lower throughput.

High consumable cost is also problematic for saw singulation. Saw singulation may require specially formulated blades that must constantly expose new diamonds to the cut interface. As the diamonds remove material, they are "dulled" by the materials used in the substrate and must be sloughed-off as the blade wears at a higher-than-normal rate. The balance between blade wear and cut quality is a delicate trade-off requiring costly technology to extend blade life while minimizing burrs and chips.

Curvilinear cutting paths are also problematic for saw singulation. Many new devices as for example photonic devices are produced with precise curved boundaries rather than straight edges. Curved boundaries require curvilinear cut paths, which saw blades do not readily accommodate. By definition, the cut path of a rotating blade must be the straight line defined by the intersection of the blade plane and the device plane. Saw singulation simply does not lend itself to curvilinear cutting paths as needed by these new devices.

Based on the foregoing, there is desired an improved apparatus and method of singulating a substrate into a plurality of component parts.

SUMMARY OF THE INVENTION

The invention relates, in one embodiment, to a singulation engine for performing cutting operations on semiconductor substrates. The singulation engine includes a slurry vessel for mixing an abrasive slurry before the abrasive slurry is delivered to a nozzle system. The singulation engine also includes an abrasive source configured to introduce new abrasive into the slurry vessel. The singulation engine further includes a fluid source configured to introduce new fluid into the slurry vessel. The singulation engine additionally includes a recycled slurry source configured to reintroduce previously used abrasive slurry back into the slurry vessel. Moreover, the singulation engine includes one or more concentration sensing devices configured to perform measurements so that the abrasive slurry concentration can be ascertained, and a controller configured to control the amount of abrasive, fluid and recycled abrasive slurry introduced into the slurry vessel based on the concentration measurements.

The invention relates, in another embodiment, to an optical concentration sensor for measuring a moving abrasive slurry associated with a singulation engine capable of cutting semiconductor substrates. The optical concentration sensor includes a housing that defines a slurry passage therein. The slurry passage is configured to distribute a moving slurry between an inlet coupling and an outlet coupling. The housing includes one or more windows that provide optical access to the slurry passage. The windows are formed from a light passing material that substantially withstands a moving abrasive slurry and does not contribute to contamination of the moving abrasive slurry. The optical concentration sensor also includes a light source configured to direct light into the slurry passage through the window. The light is configured to intersect an abrasive slurring moving through the slurry passage. The optical concentration sensor further includes one or more light detectors configured to detect light traveling out of the slurry passage through one or more windows. The light detectors produce signals in accordance with the light intensity of the light traveling out of the slurry passage through the one or more windows. The light intensity varies in accordance with the concentration of the moving abrasive slurry.

The invention relates, in another embodiment, to a slurry control method. The method includes performing measurements on a moving slurry. The method also includes translating measurements into measured concentration. The method further includes comparing measured concentration with a desired concentration. The method additionally includes controlling an input to the moving slurry based on the comparison.

The invention relates, in another embodiment, to an abrasive source. The abrasive source includes a removable abrasive canister that is preloaded with an abrasive material. The preloaded removable canister is configured for manipulation by an operator. The abrasive source also includes an abrasive delivery receptacle that resides within an abrasive delivery system and that operatively couples the removable abrasive canister to the abrasive delivery system.

BRIEF DESCRIPTION OF THE DRAWINGS

The invention may best be understood by reference to the following description taken in conjunction with the accompanying drawings in which:

FIG. 3A is a bottom view of a substrate having a plurality of lead less integrated circuit packages formed thereon.

FIG. 3B is a top view of a substrate having a plurality of lead less integrated circuit packages formed thereon.

FIG. 3C is a top view of a group of singulated lead less integrated circuit packages.

FIG. 3D is a side view of a singulated integrated circuit package.

FIG. 3E is a perspective view of a singulated integrated circuit package.

FIG. 4A is a top view of a substrate having a plurality of ball grid array (BGA) integrated circuit packages formed thereon.

FIG. 4B is a top view of a group of singulated BGA integrated circuit packages.

FIG. 4C is a side view of a singulated BGA integrated circuit package.

FIG. 4D is a perspective view of a singulated BGA integrated circuit package.

FIG. 15 is a simplified side view, in cross section, of a chuck, in accordance with one embodiment of the present invention.

FIG. 16 is a simplified side view, in cross section, of a chuck, in accordance with one embodiment of the present invention.

FIGS. 17A–F are diagrams of a vacuum platform, in accordance with one embodiment of the present invention.

FIGS. 18A–E are diagrams of a vacuum platform, in accordance with one embodiment of the present invention.

FIGS. 19A–E are diagrams of a rubber like vacuum platform, in accordance with one embodiment of the present invention.

FIGS. 20A–F are diagrams of a vacuum manifold, in accordance with one embodiment of the present invention.

FIGS. 21A–G are diagrams of a vacuum manifold, in accordance with one embodiment of the present invention.

FIGS. 22A–J illustrate a cutting sequence using the gang manifold assembly shown in FIGS. 7A and 7B and the chuck assembly shown in FIGS. 13 and 14, in accordance with one embodiment of the present invention.

DETAILED DESCRIPTION OF THE INVENTION

The present invention generally relates to an improved apparatus and method for singulating a substrate into a plurality of component parts. More particularly, the invention relates to a singulation system capable of singulating integrated circuit devices (e.g., dies, unpackaged chips, packaged chips, and the like). The singulation system is configured to generate a jet stream that contains an abrasive and fluid that cuts through large components so as to produce smaller components. The system described herein is particularly suitable for singulating surface mount devices such as chip scale packages, ball grid arrays (BGA), flip chips, lead less packages (QFN) and the like. The system is also suitable for singulating photonic devices.

Water jet machining has been available for decades; however, its potential has never been realized in semiconductor manufacturing. The fine geometries required by semiconductor manufacturers were beyond the reach of traditional water jets and their nozzle technologies. Though small aperture nozzles delivered sufficiently fine beams of water, the nozzle aperture would increase with use causing unacceptable deviations from target geometries. In addition, traditional water jets rely on the impact forces of high-energy water means to erode material. Manufacturers with expensive clean rooms have been concerned about these high pressures, since a relatively small leak at 40,000 psi can be devastating. Some water jets operate at lower pressures by employing an abrasive mixed with the water; however these can only provide cut widths down to 0.5 mm. The cut beams of abrasive water jets have traditionally been difficult to control. As dry abrasive is introduced into the pressurized water stream, a large amount of air is also introduced. This air destroys any hope of generating a consistent and dense coherent beam of water. The resulting spreading beam cannot produce the small cut widths or the 25 micron tolerance required in semiconductor singulation. The present invention overcomes these disadvantages.

Embodiments of the invention are discussed below with reference to FIGS. 1–35. However, those skilled in the art will readily appreciate that the detailed description given herein with respect to these figures is for explanatory purposes as the invention extends beyond these limited embodiments.

Figure 1:
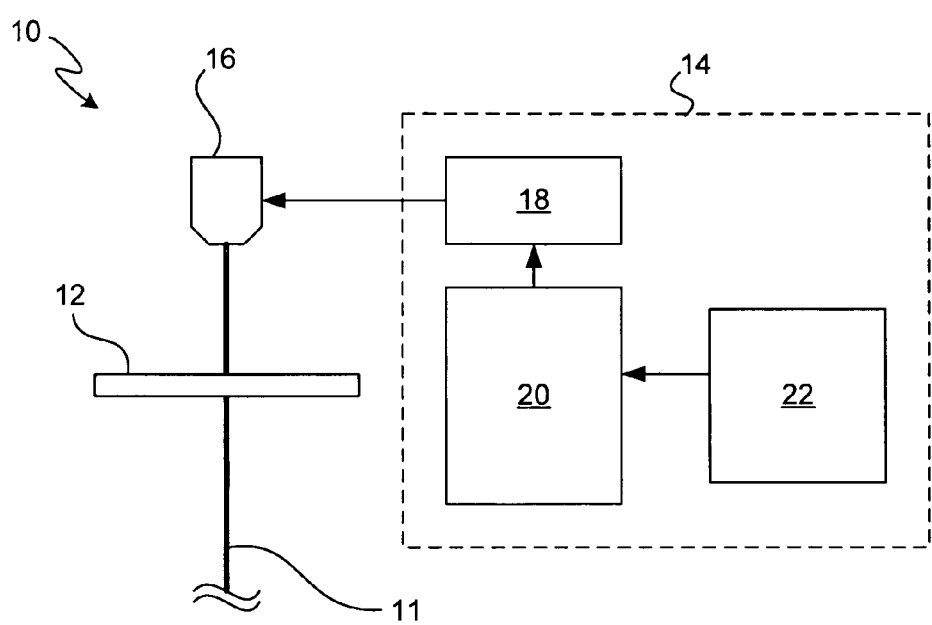
FIG. 1 is a simplified block diagram of a cutting apparatus in accordance with one embodiment of the present invention.

FIG. 1 is a simplified block diagram of a cutting apparatus 10, in accordance with one embodiment of the present invention. The cutting apparatus 10 is configured to produce a cutting beam 11 capable of cutting through a substrate 12 in order to form small discrete parts. For example, the cutting beam may be configured to singulate a substrate into a plurality of individual packaged devices including but not limited to CSPs, BGAs, QFNs and the like. The cutting beam may also be configured to singulate a substrate into photonic devices such as arrayed wave grating photonic devices.

The cutting apparatus 10 generally includes an abrasive delivery system 14 and a nozzle 16 operatively coupled to the abrasive delivery system 14. The abrasive delivery system 14 is configured to supply an abrasive slurry to the nozzle 16 and the nozzle 16 is configured to produce a cutting beam 11 with the abrasive slurry. The abrasive slurry is typically formed by an abrasive and a fluid. The cutting nature of the beam 11 relies on the fluid to carry the abrasive and on the abrasive to remove the material from the substrate 12. In most cases, the abrasive slurry is squeezed through a small opening in the nozzle 16. Squeezing the slurry through the nozzle 16 causes it to exit the nozzle 16 in a very fine and high speed cutting beam 11.

As shown in FIG. 1, the abrasive delivery system 14 generally includes a pump 18, a slurry vessel 20 and a slurry source 22. The pump 18 is configured to pump the abrasive slurry out of the slurry vessel 20 and deliver the abrasive slurry to the nozzle 16. The slurry vessel 20 is configured to contain the abrasive slurry and may serve as a location for mixing the components (e.g., abrasive and fluid) of the abrasive slurry. The slurry source 22, on the other hand, is configured to supply the components of the abrasive slurry. For example, the slurry source may distribute the abrasive, fluid, or other component of the slurry separately and/or mixed. The slurry source may for example include storage containers that contain the individual or mixed components of the abrasive slurry. The components may be pumped into the slurry vessel using any suitable technique.

In one embodiment, the abrasive delivery system 14 is a re-circulatory system. For example, the abrasive slurry is recaptured after cutting through the substrate 12 and recycled for future use. In cases such as these, a filter may be used to prevent cut particles from entering the delivery system, i.e., the cut particles may be larger than the abrasives and thus they have the ability to clog the system. In another embodiment, the abrasive delivery system 14 is not a recirculatory system. In this embodiment, new components are continuously supplied and used components are discarded, i.e., the slurry is continuously refreshed. As should be appreciated, this type of system prevents particle contamination altogether. In one implementation, the abrasive is pumped into the slurry vessel at low pressure before the fluid is pumped into the slurry vessel at high pressure. In order to transfer the abrasive to the slurry vessel the typically dry abrasive may be delivered to the slurry vessel in a wet condition. In some cases, the aforementioned embodiments may be combined to both re-circulate used material and add new material to the system.

The diameter of the cutting beam 11 is small in order to dice small parts such as packaged or photonic devices. The cutting beam 11 typically produces cut widths in the substrate with similar dimensions as the diameter of the cutting beam. The diameter of the cutting beam is generally determined by the diameter of the opening in the nozzle. The diameter of the cutting beam generally corresponds to the diameter of the opening in the nozzle. Although not a requirement, the diameter of the beam is typically on the order of about 0.050 mm to about 3.0 mm, and more particularly between about 0.25 mm and about 0.3 mm. This range is well within the typically saw street dimensions for packaged and photonic devices.

Figure 2A:
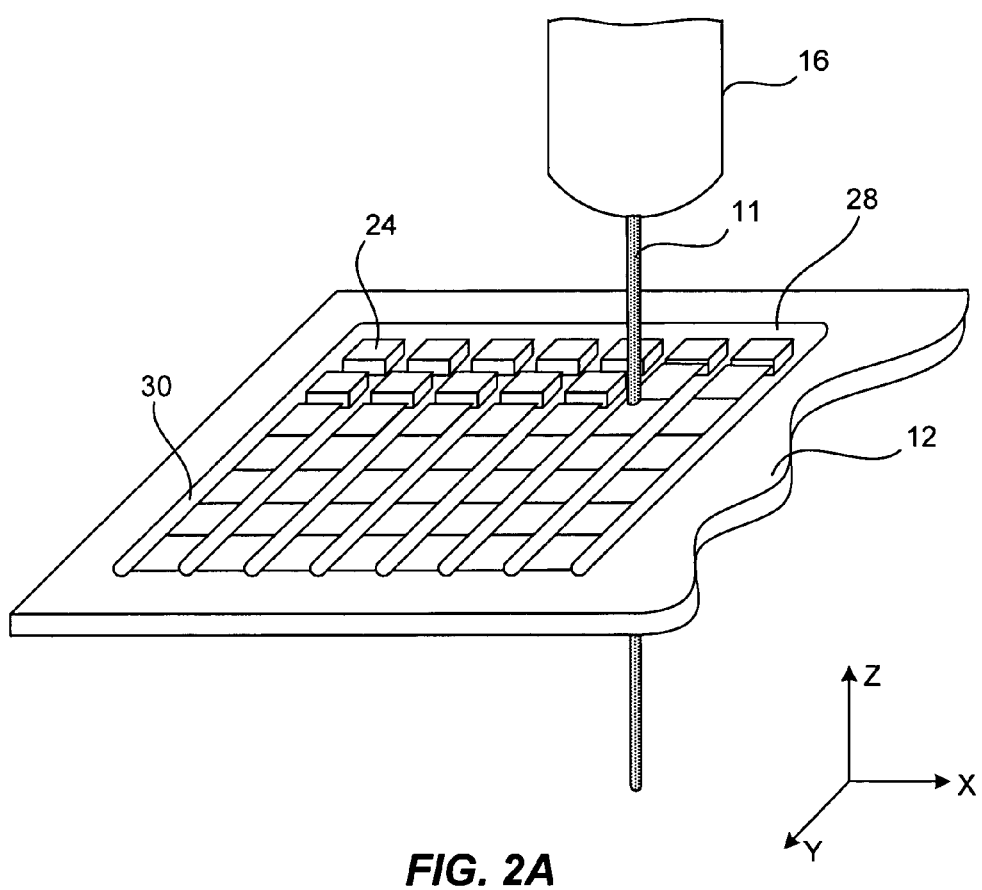
FIG. 2A is a simplified perspective diagram of a fine beam cutting through a substrate to form individual packaged devices, in accordance with one embodiment of the present invention.
Figure 2B:
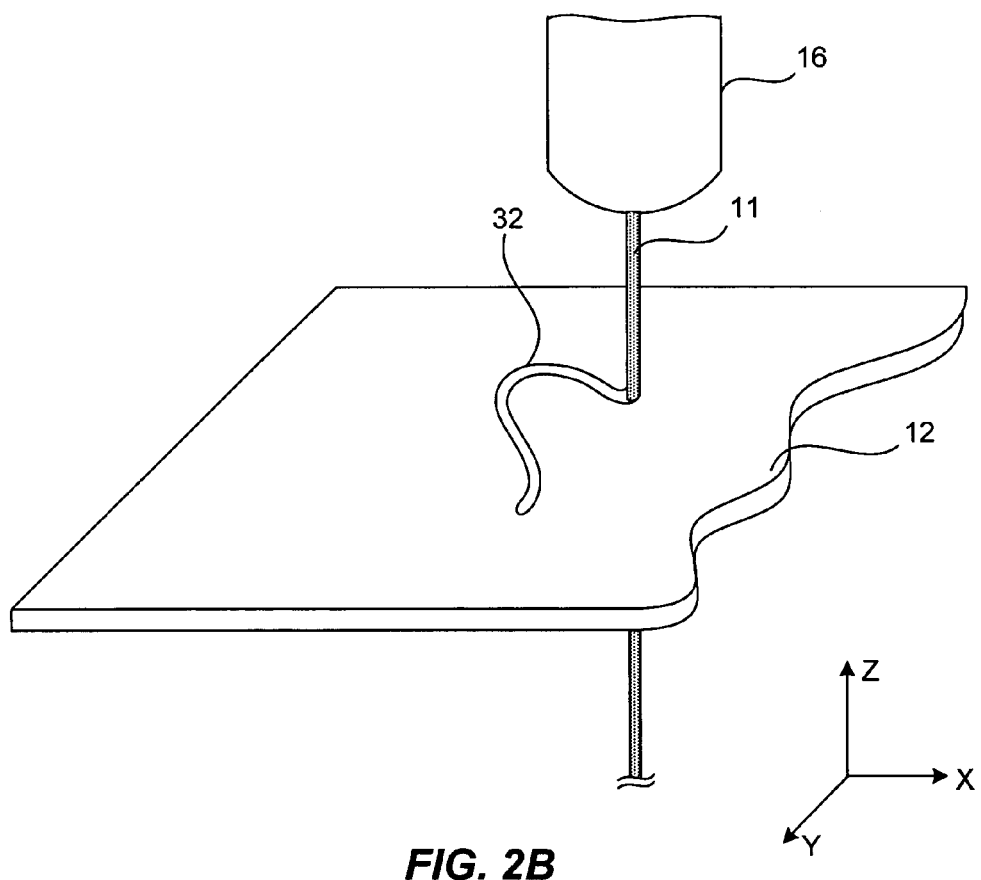
FIG. 2B is a simplified perspective diagram of a fine beam cutting through a substrate to form photonic devices, in accordance with one embodiment of the present invention.

As shown in FIGS. 2A and 2B, the cutting beam 11 may be used to make rectilinear cuts (FIG. 2A) as for example when forming individual packaged devices and/or curvilinear cuts (FIG. 2B) as for example when forming wave grating photonic devices. These types of cuts may be accomplished by moving the substrate 12 and/or the cutting beam 11 relative to one another. For example, the substrate 12 may be moved by a stage and/or the nozzle 16 may be moved by a robot. In FIG. 2A, the z axis oriented beam 11 is moved in the x direction to make parallel rows of x directed rectilinear cuts 28, and in the y direction to make parallel rows of y directed rectilinear cuts 30. Rectilinear cuts such as x and y directed cuts are suitable for singulating individual packaged devices 24 such as CSPs, BGAs, QFNs and the like. One advantage of cutting package devices with this type of cutting method is that the cutting beam interacts with the substrate along the z axis thereby preventing the formation of shear forces that can adversely effect the singulated packages. In FIG. 2B, the z axis oriented beam 11 is moved in both the x and y directions (simultaneously or incrementally) in order to make curvilinear cuts.

FIGS. 3A–3E are illustrations showing lead less integrated circuit packages before and after being singulated from a substrate with a cutting beam, in accordance with one embodiment of the present invention. By way of example, the cutting beam may generally correspond to the cutting beam discussed in the previous Figures. FIGS. 3A and 3B show a substrate 32 before singulation. As shown, the substrate 32 is formed by a plurality of integrated circuit packages 33. Although not a requirement, the packages 33 are generally formed in rows and columns on the substrate 32. Furthermore, the integrated circuit packages 33 may be positioned in one or more closely packed groups 34. FIG. 3C shows a group 34 of leadless integrated circuit packages 33 after being cut from the substrate 32. The group 34 may correspond to any of the four groups 34 shown in FIGS. 3A and 3B. FIGS. 3D and 3E show a single integrated circuit package 35 after being separated from the group 34. Lead less packages are generally well known in the art and for the sake of brevity will not be discussed in any greater detail.

In one particular embodiment, the substrate 32 corresponds to those substrates that contain Quad Flat Pack No Lead (QFN) packages. QFN packages generally refer to leadless packages with peripheral terminal pads and an exposed die pad. QFN packages may be used in a variety of applications including cell phones, personal digital assistants, portable music players, portable video players and the like. QFN substrates typically include a copper carrier A, and a mold compound B through which the cutting beam cuts in order to singulate the individual QFN packages 33 from the substrate 32. It should be noted that QFN packages are not a limitation and that other types of packages may be used.

FIGS. 4A–4D are illustrations showing a plurality of ball grid array (BGA) integrated circuit packages before and after being singulated from a substrate with a cutting beam, in accordance with one embodiment of the present invention. By way of example, the cutting beam may generally correspond to the cutting beam discussed in the previous Figures. BGA integrated circuit packages typically refer to a packaging technology that allows an integrated circuit to be attached to a printed circuit board face-down, with the chip's contacts connecting to the printed circuit board's contacts through individual balls of solder. During fabrication thereof, multiple integrated circuit chips (ball grid arrays and dies) are formed on a single substrate (e.g., wafer or circuit board), and thereafter separated into a plurality of individual or single integrated circuit chips. Although a substrate may be separated at substantially any point during an overall fabrication process, the substrate is typically separated after the ball grid arrays and dies are formed on the substrate.

To elaborate, FIG. 4A shows a substrate 36 formed by a plurality of BGA integrated circuit packages 37 before singulation. FIG. 4B shows a group 38 of BGA integrated circuit packages 37 after singulation. FIGS. 4C and 4D show a single BGA integrated circuit package 37 after being separated from the group 38. BGA integrated circuit packages are generally well known in the art and for the sake of brevity will not be discussed in any greater detail.

Figure 5:
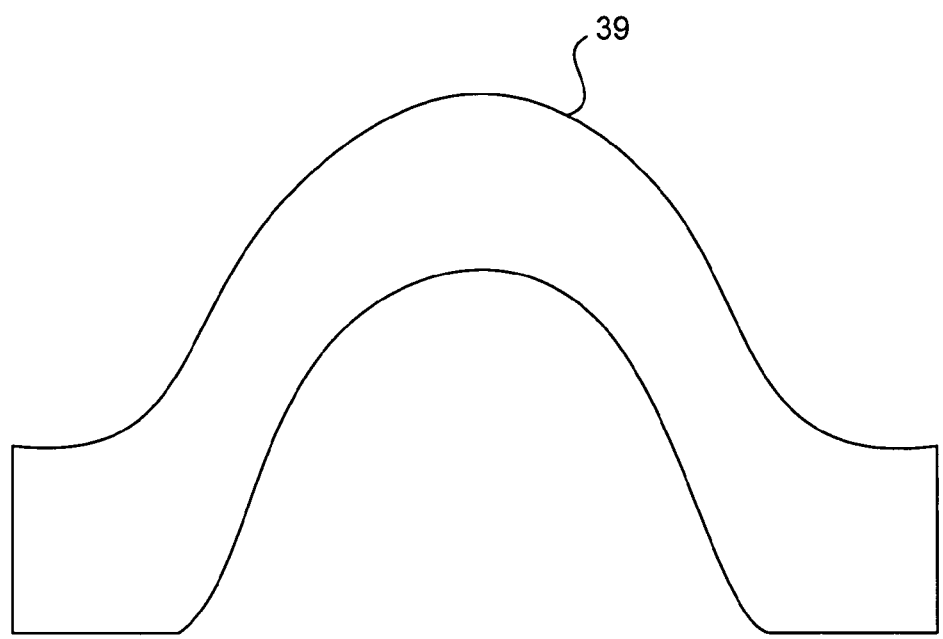
FIG. 5 is an illustration showing a photonic devices after singulation.

FIG. 5 is an illustration showing a photonic device 39 after singulation, in accordance with one embodiment of the present invention.

Figure 6:
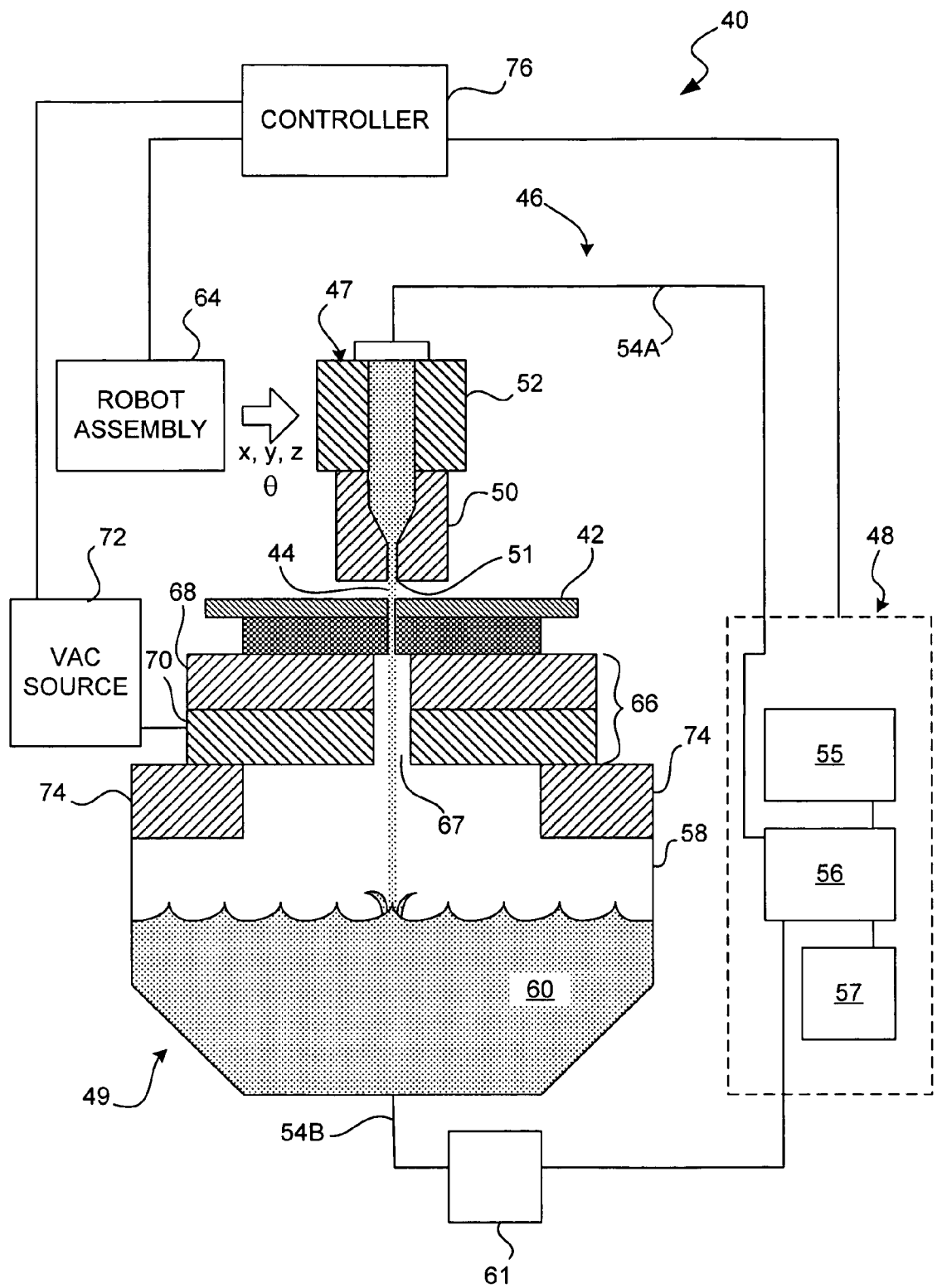
FIG. 6 is a simplified diagram of a singulation engine, in accordance with one embodiment of the present invention.

FIG. 6 is a simplified diagram of a singulation engine 40, in accordance with one embodiment of the present invention. The singulation engine 40 is configured to singulate a substrate 42 into smaller component parts via a cutting beam 44. By way of example, the component parts may be CSPs, BGAs, QFNs, photonic devices and the like. The singulation engine 40 includes a jet stream distribution unit 46 formed by at least a nozzle assembly 47, an abrasive slurry delivery assembly 48 and a tank assembly 49. The abrasive slurry delivery assembly 48 is configured to deliver an abrasive slurry to the nozzle assembly 47. The nozzle assembly 47 is configured to discharge a jet stream in a laminar and collimated manner towards the substrate 42 in order to produce the cutting action of the cutting beam 44. The tank assembly 49 is configured to receive and diffuse the jet stream once it passes through the substrate 42 during the cutting action.

During operation, for example, the abrasive slurry delivery assembly 48 supplies the nozzle assembly 47 with the abrasive slurry and the nozzle assembly 47 directs the abrasive slurry towards the substrate 42. Once discharged from the nozzle assembly 47, the abrasives in the slurry work against the substrate 42 to remove material therefrom. Almost instantaneously, the cutting beam 44 forms a hole through the substrate 42. After forming the hole, the cutting beam 44 continues along its path until it reaches a medium stored in the tank assembly 49.

The nozzle assembly 47, abrasive slurry delivery assembly 48 and tank assembly 49 may be widely varied. In the illustrated embodiment, the nozzle assembly 47 includes one or more nozzles 50 coupled to a nozzle manifold 52. The one or more nozzles 50 are configured to direct the abrasive slurry towards the substrate 42 in the form of one or more cutting beams 44. Each of the nozzles 50 includes an opening 51 through which the abrasive slurry is discharged. The size of the opening 51 generally effects the size of the cutting beam 44, which in turn effects the width of the cut in the substrate 42. The nozzle manifold 52 is configured to distribute the abrasive slurry from the abrasive delivery system 48 to the one or more nozzles 50. As shown, the nozzle manifold 52 is coupled to the abrasive slurry delivery system 48 via one or more tubes 54A. The number of nozzles and thus the number of cutting beams may vary according to the specific needs of each device.

The abrasive delivery assembly 48, on the other hand, includes a high pressure pump 55, an abrasive slurry vessel 56, and an abrasive slurry source 57. The high pressure pump 55 is configured to pump fluid to the abrasive slurry vessel 56 in order to carry and deliver the abrasive slurry to the nozzle assembly 47 at very high pressures. By way of example, the high pressure pump may pressurize the slurry vessel with pressures ranging between about 1,000 PSI to about 50,000 PSI. The slurry vessel 56 is configured to contain the abrasive slurry before being sent to the nozzle assembly 47 and may serve as a location for mixing the components (e.g., abrasive and fluid) of the abrasive slurry. The slurry source 57 is configured to supply the components of the abrasive slurry. The abrasive is generally introduced into the slurry vessel 56 at low pressures as for example between about 10 and about 75 PSI. The slurry source 57 may be a re-circulatory and/or non circulatory system. That is, the slurry source 57 may supply previous used abrasive slurry and/or it may supply new components to the abrasive slurry vessel.

It has been found that the slurry should be completely devoid of air in order to maintain small diameter cutting beams as for example 50 micron cutting beams. In one implementation, the abrasive is first soaked with water at ambient pressure as it is introduced into the singulation system. The wet abrasive is then introduced into the slurry vessel 56 and exposed to high-pressure water via the high pressure pump. Once the abrasive/water mixture is pressurized, the abrasive slurry moves through high-pressure tubing 54A to the nozzle assembly 47.

Referring to the tank assembly 49, the tank assembly 49 typically includes a holding tank 58, which contains a medium 60 for diffusing the jet stream. The medium may for example correspond to a slurry such as the abrasive slurry used to cut the substrate. In some cases, the abrasive slurry is mixed and held in the holding tank 58 before being sent to the abrasive slurry vessel 56. For example, the holding tank 58 may serve as the abrasive slurry source for the abrasive delivery assembly 48. In cases such as these, the holding tank 58 may include one or more inlets/outlets for refilling and removing the components of the abrasive slurry. Furthermore, the holding tank 58 may be coupled to the abrasive slurry delivery assembly 48 and more particularly the slurry vessel via one more tubes 54B. In order to prevent contaminants (caused by the cutting action) from entering the abrasive slurry delivery assembly 48, a filter mechanism 61 may be placed between the holding tank 58 and the abrasive delivery assembly 48.

The abrasive slurry may be widely varied. The abrasive slurry is typically formed by an abrasive and a fluid. The abrasive and fluid may be selected from any suitable material or medium. By way of example, an abrasive such as $Al_2O_3$ or garnet and a fluid such as water may be used. The type of material selected depends on many factors including but not limited to cutting ability and cost. Generally speaking, garnet provides good cutting ability at reasonable cost while $Al_2O_3$ provides better cutting ability at higher cost. The size of the abrasive used generally depends on the size (diameter) of the opening in the nozzle. The size of the abrasive generally ranges between about 1/10 and about 1/2 the diameter of the opening in the nozzle, and more particularly about 1/4 the diameter of the opening in the nozzle. Furthermore, the percentage of abrasive to water (by weight) is generally between about 1% and about 200%, more particularly between about 10% and about 100% and even more particularly about 40%.

The substrate 42 and cutting beam 44 are generally moved relative to one another in order to produce a linear cutting path (e.g., rectilinear and/or curvilinear). For example, the cutting beam 44 and/or the substrate 42 may be moved. The method of moving may be widely varied. In the illustrated embodiment, the singulation engine 40 includes a robot assembly 64 capable of moving the nozzle assembly 47. For example, the robot assembly 64 may include a transfer arm that is attached to the manifold 52 of the nozzle assembly 47. The robot assembly 64 may provide linear movements in the x, y and z directions as well as rotations about the x, y and z axis. In most cases, the robot assembly 64 moves the nozzle assembly 47 within a single plane along a desired cutting path so that all or any selected part of the substrate 42 may be cut by the cutting beam 44 (e.g., x, y and $\theta_z$). When cutting integrated circuit packages, the robot assembly 64 may make one or more passes in the x direction and one or more passes in the y direction in order to cut the substrate 42 into integrated circuit packages (see FIGS. 2A, 3 and 4). The robot assembly 64 may also be arranged to move in a serpentine fashion. The robot assembly 64 may be widely varied. For example, the robot assembly 64 may consist of linear actuators (servos, steppers), SCARA robots and the like. In one particular embodiment, a SCARA robot assembly is used. By way of example, SCARA robot assemblies manufactured by Epson Robots of Carson, Calif. may be used.

The singulation engine 40 also includes a chuck 66 configured to support and hold the substrate 42 and the parts cut therefrom before, during and after singulation. As shown, the chuck 66 includes one or more openings 67 disposed therethrough. The openings 67 allow the cutting beam 44 to flow past the substrate 42, through the chuck 66, and to the slurry stored in the holding tank 58. The opening configuration generally provides a path that corresponds to the cutting path produced by the robot assembly 64. For example, it may be formed as a linear opening in the x and/or y directions. The openings may include one large continuous opening or a plurality of discontinuous openings. A continuous opening typically has the advantage that the cutting beam can follow its cutting path without being stopped. The width of the opening 67 is typically larger than the diameter of the cutting beam 44.

Any number of chucks may be used. For example, a single chuck for holding a single substrate, or a plurality of chucks for holding a plurality of substrates may be used. In one embodiment, a first chuck includes openings for a cutting path in a first direction (e.g., x) and a second chuck includes openings for a cutting path in a second direction (e.g., y) that is orthogonal to the first direction. The integrated circuit packages may be singulated from the substrate by performing a first cutting sequence in the first direction on the first chuck and thereafter transferring the substrate to the second chuck and performing a second cutting sequence in the second direction on the second chuck. The position of the first and second chucks relative to one another varies according to the specific needs of the singulation engine. In one embodiment, the chucks are positioned in line with one another. In another embodiment, the chucks are placed side by side.

The chuck 66 itself may be widely varied. For example, the chuck 66 may be an electrostatic chuck, a mechanical chuck, a vacuum chuck or the like. In the illustrated embodiment, the chuck 66 is configured to provide a vacuum in order to hold the substrate 42 and packages before, after and during singulation. In this particular embodiment, the chuck 66 includes a vacuum platform 68 and a vacuum manifold 70 disposed underneath the vacuum platform 68. The vacuum platform 68 is generally configured to receive the substrate 42 and the packages. For example, the vacuum platform 68 may be configured to receive the molded side of the substrate 42 (and package) so as to place the substrate 42 (and packages) in an upwards position for singulation. The vacuum platform 68 generally includes a plurality of openings (not shown), each of which generally corresponds to one of the singulated packages. That is, the vacuum platform 68 includes an opening that applies a vacuum to each package to be singulated. The vacuum manifold 70, on the other hand, is generally configured to supply a vacuum to each of the openings of the vacuum platform 68. In most cases, the vacuum manifold 218 includes channels therein that fluidly couple the openings of the vacuum platform 68 to a vacuum source 72. The vacuum manifold 70 is typically mounted to a base 74 that serves to support the chuck 66 in its position relative to the other components of the singulation engine 40.

The singulation engine 40 may also include a controller 76 for controlling the various components of the singulation engine 40. For example, the controller 76 may include capabilities for, but not limited to, controlling the movement of nozzle 50 via the robot assembly 64, controlling the flow of the slurry 60 via the pump 56, controlling the vacuum that holds the substrate 42 via the vacuum source 72, and the like. The controller 76 may be arranged to act as an operator console and master controller of the system. That is, all system interfaces with an operator and the user's facilities may be made through the controller. Commands may be issued to and status may be monitored from all components so as to facilitate completion of operator assigned tasks. By way of example, the controller may include a keyboard for accepting operator inputs, a monitor for providing visual displays, a database for storing reference information, and the like.

In one embodiment, the controller 76 is configured to initiate a cutting sequence. During the cutting sequence, the controller may cause the cutting beam to turn on and off while the nozzle and thus the cutting beam moves via the robot assembly. A continuous cutting sequence may be implemented where the cutting beam is continuously produced while the robot assembly moves the nozzle along a path. During a continuous cutting sequence, for example, the cutting beam may be turned on when moving in a first direction (e.g., x) as well as a second direction (e.g., y). In addition, an incremental cutting sequence may be implemented where the cutting beam is turned on and off incrementally while the robot assembly moves the nozzle along a path. During an incremental cutting sequence, for example, the cutting beam may be turned on when moving in a first direction (e.g., x) and turned off when moving in a second direction (e.g., y).

A method of producing integrated circuit packages (product by process) will now be discussed. By way of example, the integrated circuit package may be any one of those previously described. The method generally begins by forming a plurality of integrated circuit packages on a substrate. In the case of QFN packages, for example, the packages are generally formed in groups on a metal strip or carrier (e.g., copper). The metal strip is processed to include an exposed die attach pad and a plurality of peripheral terminal pads for each individual QFN package. A die is generally attached to each of the die attach pads using a conventional die attach material. The die is also coupled to the plurality of peripheral terminal pads via a plurality of wires. A mold compound is generally used to encase or surround portions of the die, wires, exposed peripheral terminal pads and the exposed die attach pad. The die itself is typically sandwiched between the mold compound and the metal strip. The mold compound helps to keep the wires and terminal pads electrically isolated from each other as well as to help protect the die.

Once the packages are formed on the substrate, the substrate is cut with a cutting beam in order to separate the individual integrated circuit packages from the substrate. This may be accomplished with the one or more jet streams that are made incident on the surface of the substrate and that are configured to cut through the substrate as for example, the metal strip and mold compound of the QFN substrate.

The jet streams are generally configured to move in a manner that cuts the integrated circuit packages as for example into rectangles or squares (see for example, FIGS. 22A–J or FIGS. 23A–B).

The substrate may be cut using a variety of techniques. One such technique will now be discussed with reference to FIG. 6. The substrates are typically received and loaded into the singulation engine, as for example, at a loading dock of the singulation engine. Once received, the substrates 42 are placed on the chuck 66 by a transfer assembly (not shown). During placement, the substrates 42 are aligned to a reference surface (e.g., alignment pins) and secured or held to the top surface of the chuck 66 using a suction force produced by the vacuum source 72. Thereafter, the nozzle assembly 47 is moved into a starting position relative to the substrate 42 held on the chuck 66. Once in position, the abrasive slurry delivery system 48 delivers the abrasive slurry to the nozzle assembly 47 and the abrasive slurry is subsequently squeezed out the nozzles 50. The abrasive slurry is forced into a jet stream that strikes and cuts through the substrate 42 while the substrate 42 is held by the chuck 66. The nozzle assembly and thus the jet stream is then moved along a cutting path via the robot assembly 64 in order to separate the integrated circuit packages from the substrate. During the cutting sequence, the abrasive slurry in the jet stream is collected in the holding tank 58 after passing through the substrate 42 and the opening 67 in the chuck 66.

Figure 7A:
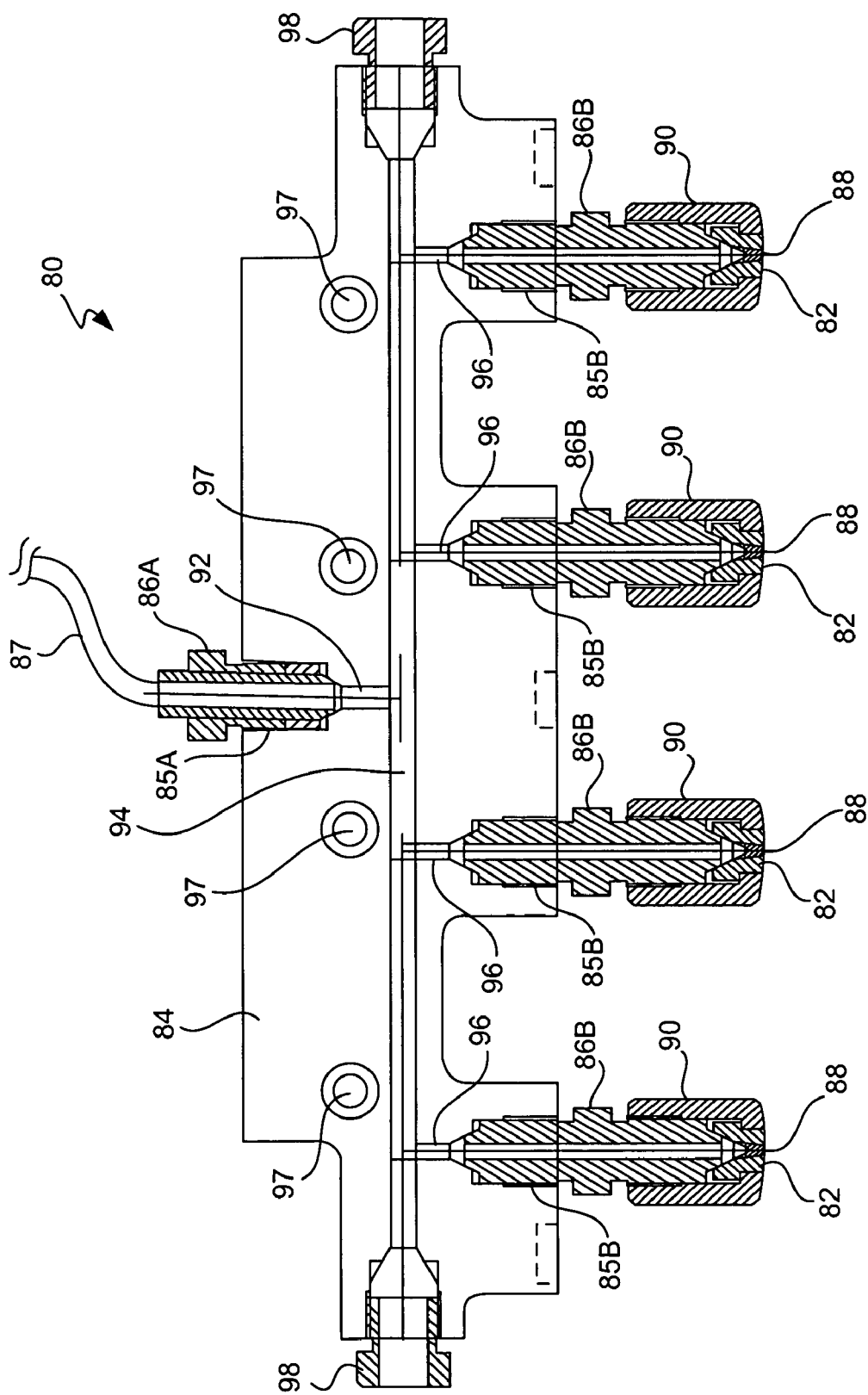
FIG. 7A is a front view, in cross section, of a gang manifold assembly, in accordance with one embodiment of the present invention.
Figure 7B:
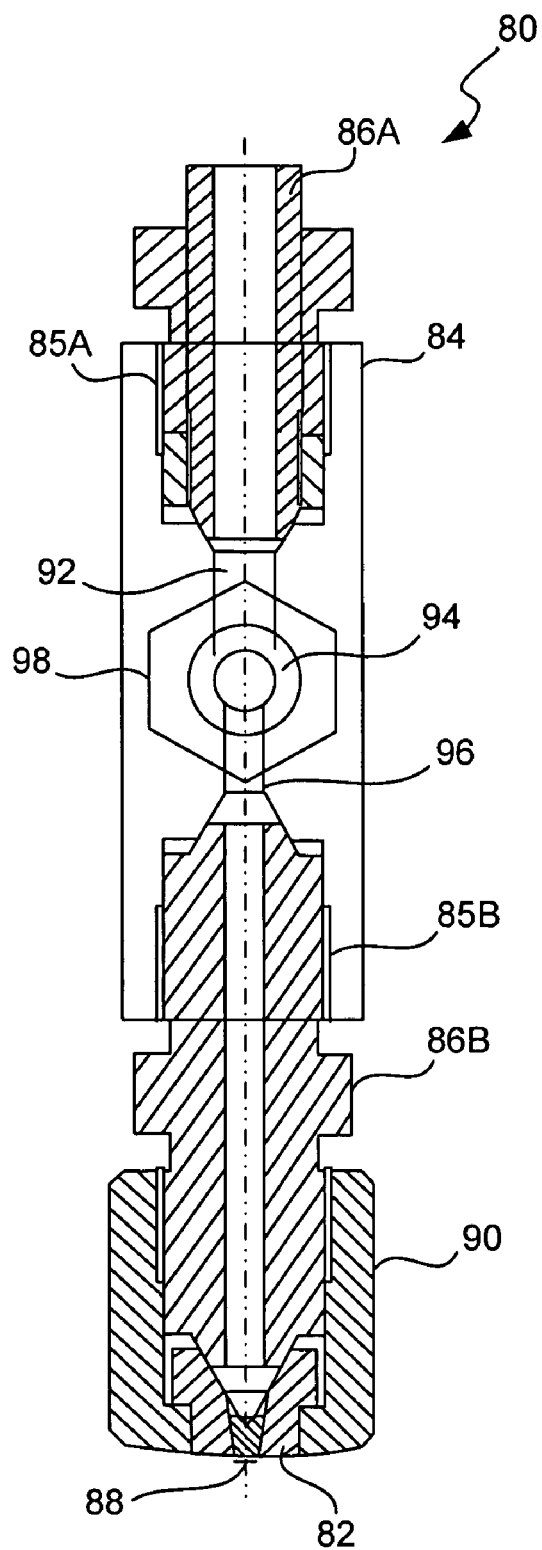
FIG. 7B is a side view, in cross section, of a gang manifold assembly, in accordance with one embodiment of the present invention.

FIGS. 7A and 7B are diagrams of a nozzle assembly 80, in accordance with one embodiment of the present invention. FIG. 7A is a front view, in cross section, of the nozzle assembly 80 and FIG. 7B is a side view, in cross section, of the nozzle assembly 80. By way of example, the nozzle assembly 80 may generally correspond to the manifold assembly 47 shown in FIG. 6. The nozzle assembly 80 generally includes one or more nozzles 82 fluidly coupled to a nozzle manifold 84. In this particular configuration, the nozzle assembly 80 includes multiple nozzles 82 so that multiple jet streams can be generated. As should be appreciated, multiple jet streams can reduce the amount of time needed to singulate a substrate, i.e., more nozzles typically reduce the cycle time of the system. For example, each jet stream produced by each of the nozzles 82 may be configured to cut a different group of packaged devices located on a substrate at the same time, for example, the four groups of integrated circuit packages located on the substrate shown in FIGS. 3A and 3B.

As shown, the manifold 84 includes one or more first coupling receptacles 85A configured to receive one or more first couplings 86A. The first couplings 86A are configured to receive a slurry distribution tube 87 from a slurry delivery assembly (e.g., assembly 48 in FIG. 6). The manifold 84 also includes one or more second coupling receptacles 86B configured to receive one or more second couplings 86B. Each of the second couplings 86B are configured to receive an individual nozzle 82. A collar 90 may be used to hold the nozzle 82 relative to the end of the second couplings 86B.

The manifold 84 additionally includes a plurality of channels 92, 94, 96 therein for fluidly connecting the first and second receptacles 85A and 85B and thus the slurry delivery assembly to the nozzles 82. The channels may be widely varied. The channels generally include one or more slurry receiving channels 92, a main channel 94 and one or more slurry distribution channels 96. The slurry receiving channels 92 connect the first coupling receptacles 85A to the main channel 94. The slurry distribution channels 96 connect the second coupling receptacles 85B to the main channel 94. The manifold 84 may also include one or more through holes 97 for attaching the manifold assembly 80 to a robot assembly.

During operation, the first couplings 86A, which are mounted in the first coupling receptacles 85A, receive slurry from the slurry tube 87 and deliver the slurry to the slurry receiving channels 92. The slurry receiving channels 92 receive slurry from the first couplings 86A and deliver the slurry to the main channel 94. The main channel 94 receives the slurry from each of the slurry receiving channels 92 and delivers the slurry to each of the slurry distribution channels 96. The slurry distribution channels 96 receive the slurry from the main channel 94 and delivers the slurry to the second couplings 86B. The second couplings receive the slurry from the slurry distribution channels 96 and delivers the slurry to each of the nozzles 82. Thereafter, the slurry is forced through the aperture 88 in the nozzle 82.

The couplings 86A, tube 87 slurry receiving channels 92 and main channel 94 are generally large diameter so as to move large volumes of pressurized slurry at very low speeds, preventing wear to the tubing, manifold and joints. By way of example, the diameter may be about 5 mm. The slurry distribution channels 96 and couplings 86B on the other hand typically have a smaller diameter. By way of example, the diameter may be about 3 mm. The nozzles 82 themselves include a small diameter aperture 88. "Squeezing" the slurry through the small aperture 88 causes it to exit the nozzle 82 at very high speeds and in a fine diameter. The size of the nozzle aperture 88 is generally selected based on the desired cutting width. The length of the aperture 88 is generally configured to match the abrasive size and the desired beam diameter so as to cause the slurry to proceed through the nozzle 82 in an orderly and predictable manner, i.e., becomes collimated. As should be appreciated, the nozzle aperture does not widen during use because the exiting beam is kept laminar and straight (and the lack of air in the pressurized stream). By way of example, the diameter of the nozzle aperture may be about 0.050 mm to about 3.0 mm, and more particularly between about 0.25 mm and about 0.3 mm. In addition, the length of the nozzle aperture may be between about 2D and about 20D, and more particularly between about 10D and about 15D, where D=the diameter of the nozzle aperture.

In one embodiment, the main channel 94 is formed by drilling a hole entirely through the manifold 84 from one side to the other and then capping the hole with a set of plugs 98, and the slurry receiving and slurry distribution channels 92, 96 are formed by drilling holes partially through the manifold 84 from opposite sides of the manifold 84 respectively to the main channel 94. The slurry receiving and slurry distribution channels 92, 96 are generally perpendicular to the main channel 94. The manifold, couplings and nozzles are generally formed from a material that is resistant to the effects of the slurry flowing therethrough. These components are generally formed from high hardness materials such as stainless steel.

Figure 8:
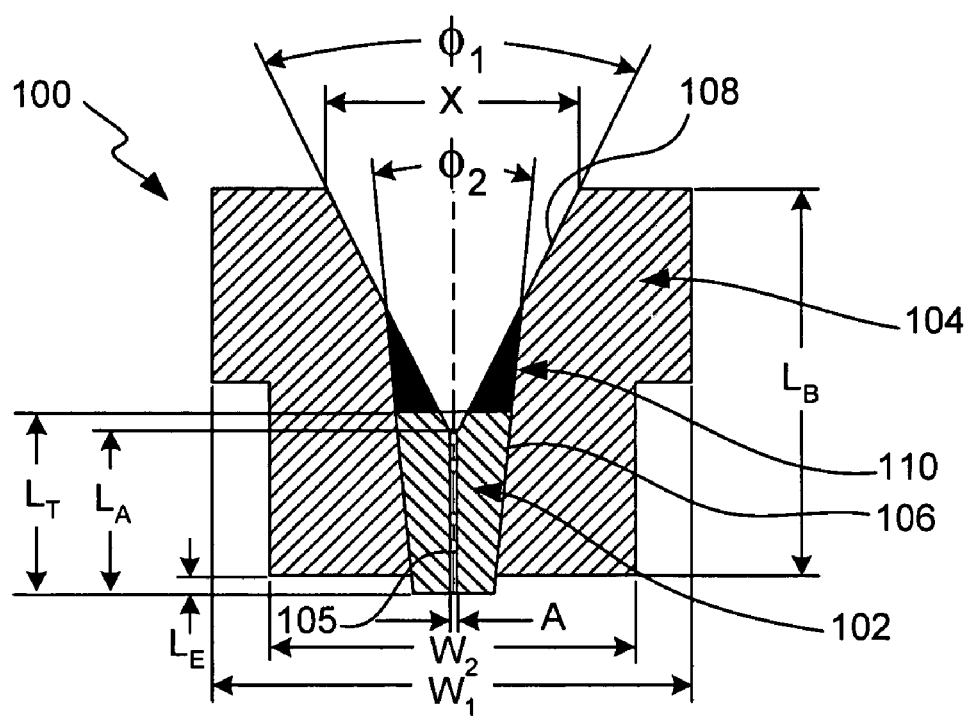
FIG. 8 is a side view, in cross section, of a nozzle, in accordance with one embodiment of the present invention.

FIG. 8 is a side view, in cross section, of a nozzle 100. By way of example, the nozzle 100 may generally correspond to the nozzle 82 shown in FIGS. 7A and 7B. The nozzle 100 generally includes a nozzle tip 102 attached to a nozzle body 104. The nozzle tip 102 includes an aperture 105. The nozzle tip is preferably formed by a high hardness material in order to minimize wear at the nozzle exit. In one embodiment, the nozzle tip 102 is formed from stainless steel and the aperture 105 is formed from a diamond material. The aperture may also be formed from a carbide material. The diameter and length of the aperture 105 typically varies according to the specific needs of the device. As mentioned above, the diameter may be between about 0.05 mm and about 3.0 mm and the length may be between about 2D and about 20D, where D=the diameter of the nozzle aperture.

The nozzle body 104 includes a tip receptacle 106 for receiving the nozzle tip 102 and a seat receptacle 108 for receiving the end of a coupling as for example coupling 86B of FIG. 7. The tip receptacle 106 includes a slope that matches the nozzle tip 102 thus allowing the nozzle tip to seat therein. As shown, the nozzle tip may extend past the bottom surface of the nozzle body 104 when seated in the receptacle 106 of the nozzle body 104. The seat receptacle 108 includes a slope that matches the end of the coupling thus allowing the end of the coupling to seat therein. The nozzle 100 also includes a retaining mechanism 110 located above the nozzle tip 102. The retaining mechanism may be widely varied. In one embodiment, the nozzle body 104 is formed from stainless steel and the retaining mechanism 110 is formed from sintered metal. As shown, the inner surfaces of the seat receptacle, retaining mechanism and nozzle tip inlet cooperate to form a conical entry point.

The dimensions of the nozzle 100 will now be described in accordance with one embodiment. The slope of the seat receptacle is about 30 degrees from center or 60 degrees in total. The slope of the tip receptacle is about 11 degrees from center or 22 degrees in total. The nozzle body is about 9.5 mm in length and has about a 12 mm diameter at its widest section and about 9 mm diameter at its thinnest section. The seat receptacle opening is about 7.8 mm and the diameter of the aperture 105 is about 0.300 mm±0.003 mm. The nozzle tip is about 4 mm in length and the aperture is about 3 mm in length. Furthermore, the diamond nozzle extension distance (the distance between surfaces of the body and the tip) is may be about 0.1-0.5 mm.

Figure 9:
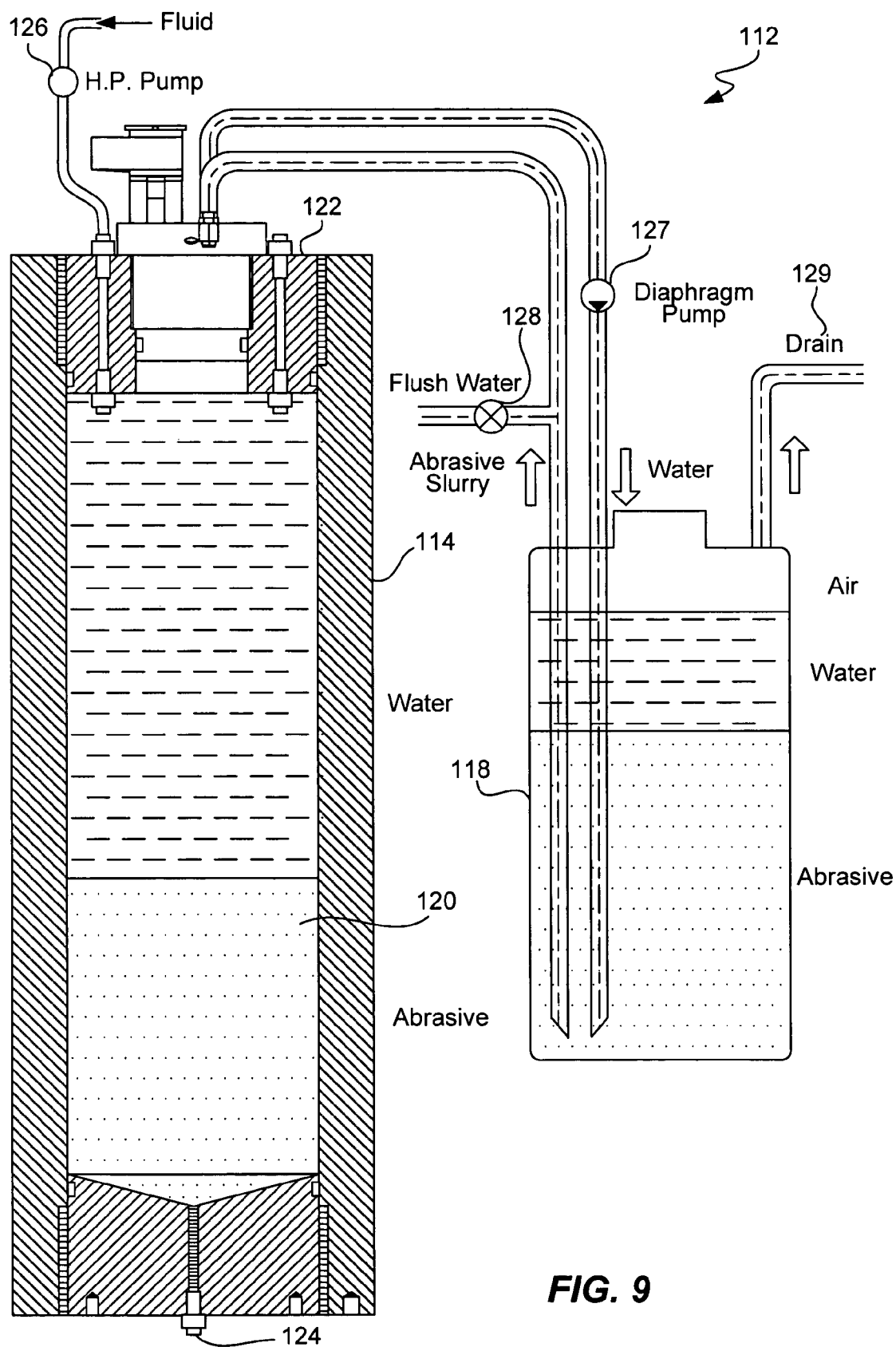
FIG. 9 is a side view, in cross section, of an abrasive slurry delivery assembly, in accordance with one embodiment of the present invention.

FIG. 9 is a side elevation view, in cross section, of an abrasive slurry delivery assembly 112, in accordance with one embodiment of the present invention. By way of example, the abrasive slurry delivery assembly 112 may generally correspond to the abrasive slurry delivery assembly shown in FIG. 6. The abrasive slurry delivery assembly 112 generally includes a slurry containment vessel 114, a fluid source 116 and an abrasive source in the form of an abrasive cartridge 118. The slurry containment vessel 114 is configured to contain an abrasive slurry 120 for use by a singulation engine. The abrasive slurry 120 generally contains a fluid such as water and an abrasive such as garnet. The slurry vessel 114 receives the fluid from the fluid source 116 and the abrasive from the abrasive cartridge 118 through a recharge valve 122 located at the top of the slurry containment vessel 114. In order to supply the abrasive slurry 120 to a nozzle assembly of a singulation engine, the slurry containment vessel 114 is pressurized and the abrasive slurry 120 is released through a port 124 located in the bottom of the slurry containment vessel 114 (or a tubing connected the top of vessel 114).

The slurry containment vessel 114 is pressurized by a high pressure pump 126. The manner in which the high pressure pump 126 builds pressure may be widely varied. In the illustrated embodiment, the high pressure pump 126 pumps a fluid from the fluid source 116 into the slurry containment vessel 114 until the slurry containment vessel 114 is adequately pressurized. By way of example, the slurry containment vessel may be pressurized between about 1,000 PSI and about 50,000 PSI.

The abrasive cartridge 118 is configured to supply new abrasive material to the assembly 112. When emptied, the abrasive cartridge 118 is removed from the assembly 112 and a new abrasive cartridge 118 filled with new abrasive material is inserted into the assembly 112. This particular method prevents contaminants from entering the singulation engine. The abrasive material filled in the cartridge 118 may be wet or dry. In the illustrated embodiment, however, the cartridge is prefilled with only the dry abrasive material. This is done to reduce the weight of the cartridge 118 so that it can be easily handled by an operator. Once the cartridge 118 is connected to the assembly 112, a fluid may be introduced into the cartridge 118 in order to "wet" the dry abrasive thereby helping to reduce air in the system. As should be appreciated, the lack of air in the pressurized stream helps prevent the nozzle aperture from widening. The fluid may also help move the wet abrasive (slurry) to the slurry containment vessel.

As shown in FIG. 9, a diaphragm pump 128 is used to both feed a fluid into the abrasive cartridge 118 in order to "wet" the abrasive material and to force the "wet" abrasive material to the slurry containment vessel 114. The diaphragm pump generally operates at low pressure, as for example between about 1 PSI and about 75 PSI. The diaphragm pump 127 may receive the fluid directly from a fluid source or it may receive the fluid indirectly from the slurry containment vessel 114 as shown. In operation, the diaphragm pump 127 pumps the fluid into the cartridge 118 thereby allowing the fluid to mix with the abrasive and forcing the wet abrasive from the cartridge 118 into the vessel 114 through the recharge valve 122. In order to flush and drain the components of the assembly 112, the assembly 112 may include a flush water valve 128 for introducing a fluid into the assembly 112, and a drain 129 to remove air or fluid from the system.

An operational sequence of the abrasive slurry delivery assembly 112 will know be discussed in accordance with one embodiment. The sequence generally begins by opening the flush water valve 128 in order to introduce water into the cartridge 118. Once the cartridge 118 is filled with water, the flush water valve 128 is closed. Thereafter, the recharge valve 122 of the slurry containment vessel 114 is opened. Once opened, the diaphragm pump 128 is activated thereby causing the abrasive to be sucked from cartridge 118 to the slurry containment vessel 114. Once the containment vessel 114 is full of abrasive, the flush water valve 128 is opened in order to clean the hose and recharge valve 122. After the system is cleaned, the diaphragm pump 128 is deactivated, i.e., shuts down, and the recharge valve 122 and flush valve 128 are closed. The abrasive slurry delivery assembly 112 is now ready to pump the abrasive to the nozzle assembly. In particular, the high pressure pump 126 is activated thereby pressurizing the slurry containment vessel and forcing the abrasive slurry 120 out of the slurry containment vessel 114 and into the nozzle assembly.

Figure 10:
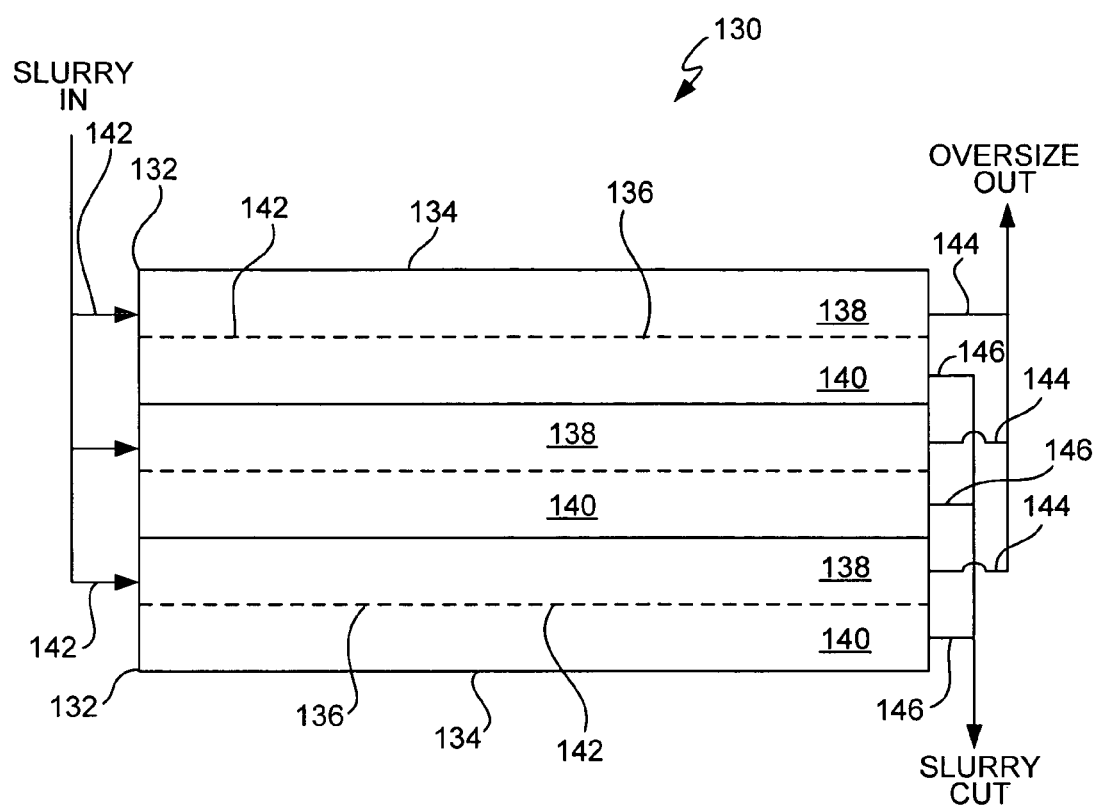
FIG. 10 is a simplified side view of a wet slurry filter arrangement, in accordance with one embodiment of the present invention.

FIG. 10 is a simplified side view of a wet slurry filter arrangement 130, in accordance with one embodiment of the present invention. By way of example, the filter arrangement 130 may be used in a re-circulatory delivery assembly between the holding tank and the vessel (see FIG. 6). The filter arrangement 130 includes a plurality of filter elements 132, which are layered one on top of the other. Each filter element 132 includes a container 134 and a filter 136. The filter 136 is configured to separate the container 134 into first and second chambers 138 and 140. The filter 136 is preferably designed to allow good abrasive material to flow from the first chamber 138 into the second chamber 140 while preventing oversized abrasive material or contaminant material from flowing therethrough (e.g., oversized material). This is generally accomplished with mesh screen having a plurality of openings 142 dimensioned similarly to the size of the good abrasive material, i.e., particles in the slurry that are smaller than size of the opening pass through the openings 142 while particles that are larger than the size of the openings 142 are blocked from passing through the openings. In essence, the oversized material is retained in the first chamber 138 and the good material is retained in the second chamber 140. By way of example, the size of the openings may be between about 20 mesh and about 500 mesh, and more particularly between about 100 mesh and about 150 mesh.

In order to utilize the wet slurry filter arrangement 130, each filter element 132 includes a used slurry inlet 142 for receiving used slurry. For example, a slurry that has been previously used to cut through a substrate. As should be appreciated, used slurry may contain particles from the cut substrate. The used slurry inlet 142 is located in the first chamber 138 thereby allowing the used slurry to be introduced into the first chamber 138. Each filter element 132 also includes an oversized slurry outlet 144 and a good slurry outlet 146. The bad slurry outlet 144 is located in the first chamber 138 and the good slurry outlet 146 is located in the second chamber 140. The outlets 144 and 146 are generally positioned opposite the inlet 142, i.e., the inlets and outlets are on opposing ends of the filter element. During operation, the used slurry is introduced into the first chamber 138. As it passes from one end of the first chamber 138 to the other end of the first chamber 138, the good slurry drops through the filter 136 into the second chamber 140. Once in the second chamber 140, the good slurry exits out of the good slurry outlet 146. The good slurry from each of the good slurry outlets 146 are combined and reintroduced back into the system. The slurry left in the first chamber 138 exits out of the bad slurry outlet 144. The bad slurry from each of the filtering elements 132 are combined and removed from the system.

Because the particles are small, the size of each of the filter arrangements can be small. By way of example, each of the filter arrangements may have a length (from opposing sides) between about 300 to about 600 mm, a width between about 100 to about 400 mm and a height between about 20 to about 200 mm. As should be appreciated, multiple filtering elements can be layered on top of each other to increase the speed that the slurry is filtered. By way of example, the wet slurry filter arrangement 130 may include 2 to about 20 filter elements.

Figure 11:
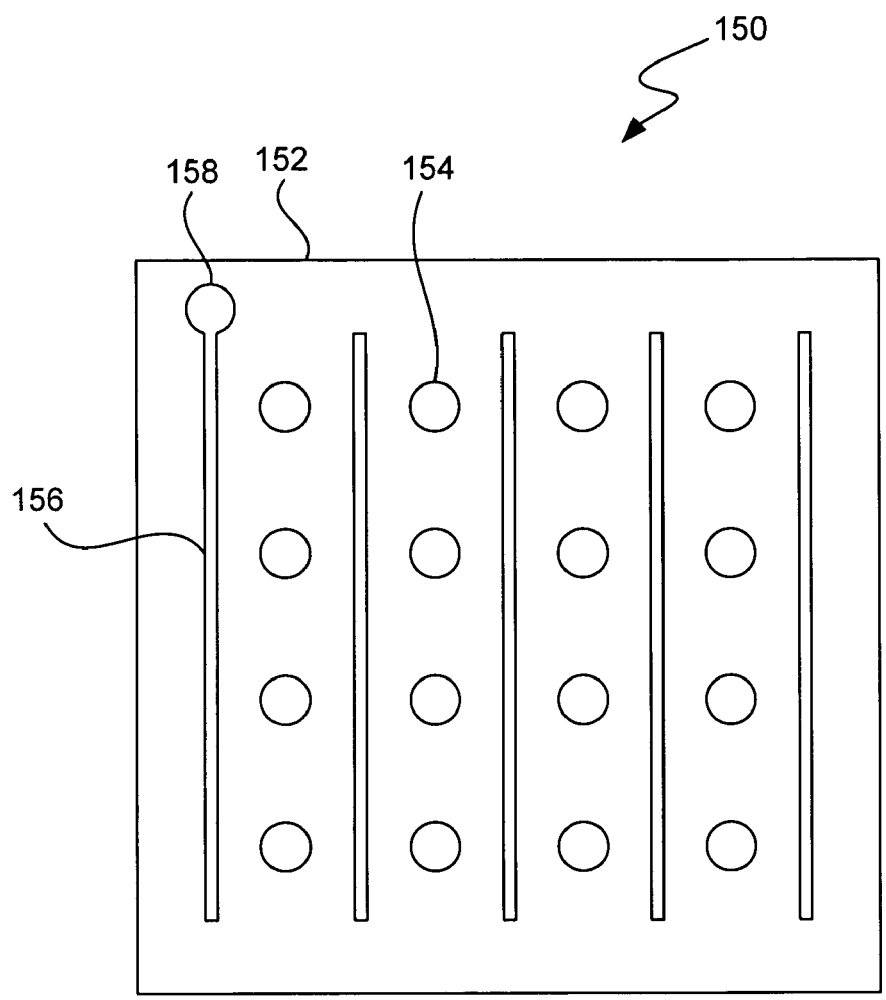
FIG. 11 is a top view of a chuck assembly, in accordance with one embodiment of the present invention.

FIG. 11 is top view of a chuck assembly 150, in accordance with one embodiment of the present invention. The chuck assembly 150 is generally configured to hold an unsingulated substrate and the singulated integrated circuit packages cut therefrom before, during and after a singulation procedure carried out with a cutting beam. The chuck assembly 150 generally includes a chuck 152 having a plurality of openings 154 and a plurality of slots 156. The openings 154 provide a vacuum therethrough so as to hold the substrate thereon. The slots 156 provide a passageway through which a jet stream may pass when cutting the substrate. By way of example, the chuck 152 may generally correspond to the chuck shown in FIG. 6.

The configuration of the openings 154 and slots 156 may be widely varied. In general, the chuck 152 includes one or more groups of openings 154 that are arrayed in rows and columns. The slots 156 are spatially separated from the openings 154 and are typically positioned in either rows or columns alongside the openings 154. In the illustrated embodiment, the slots 156 are positioned in columns. In most cases, there is a slot 156 outside the first and last column or rows of openings 154 and between each row and column of openings 154. The slots 156 may include starter holes 158. The starter holes 158 provide a place where a cutting path can begin. The configuration and number of starter holes 158 generally depends on the configuration of packages formed on the substrate (e.g., number of groups, package spacing, etc.), the number of nozzles used to cut the substrate (e.g., single, multiple) and the cutting sequence used to cut the substrate (e.g., continuous, incremental, etc.).

The chuck assembly 150 may include any number of chucks 152. When using a single chuck, a first set of linear cuts may be performed when the substrate is in a first position relative to the chuck and a second set of linear cuts may be performed when the substrate is in a second position relative to the chuck. For example, the substrate may be rotated between sets of cuts in order to make orthogonal cuts on the substrate. Although the cutting path is in a single direction, multidirectional cuts on the substrate may be performed thereby leaving a plurality of square or rectangle packages. When using multiple chucks, a first set of linear cuts may be performed in a first direction on a first chuck and a second set of linear cuts may be performed in a second direction on a second chuck. In this implementation, the position of the slots generally depends on the direction of the cuts being performed on the chuck. For example, if the chuck is configured for x axis cutting then the slots are situated in the x direction (columns), and if the chuck is configured for y axis cutting then the slots are situated in the y direction (rows).

Figure 12C:
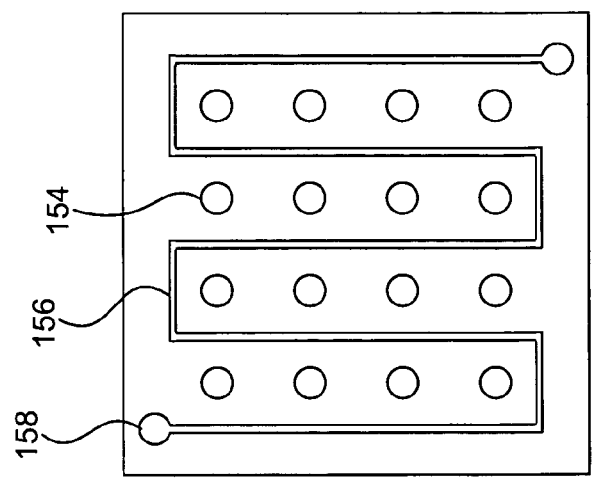
FIG. 12C is a top view of a chuck assembly, in accordance with an alternate embodiment of the present invention.
Figure 12B:
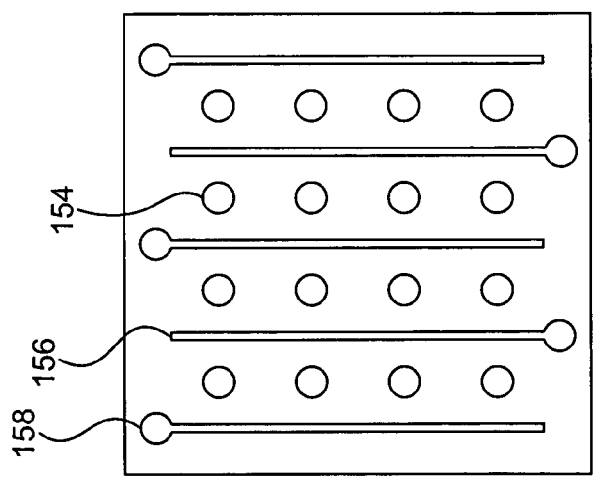
FIG. 12B is a top view of a chuck assembly, in accordance with an alternate embodiment of the present invention.
Figure 12A:
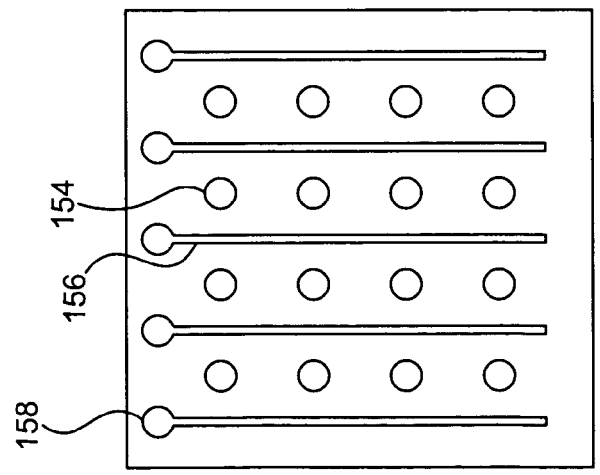
FIG. 12A is a top view of a chuck assembly, in accordance with an alternate embodiment of the present invention.

Although only one chuck configuration is shown in FIG. 11, it should be noted that this is not a limitation and that other configurations may be used. For example, FIGS. 12A–12C each show different configurations of a chuck. In FIG. 12A, each slot 156 includes a starter hole 158 and all of the starter holes 158 are on the same side of the slots 156. In FIG. 12B, each slot 156 includes a starter hole 158, however, the starting holes 158 alternate back and forth between opposing sides of the slots 156. In FIG. 12C, the slot is formed by one continuous slot rather than a plurality of spatially separated slots (e.g., serpentine configuration).

Figure 13:
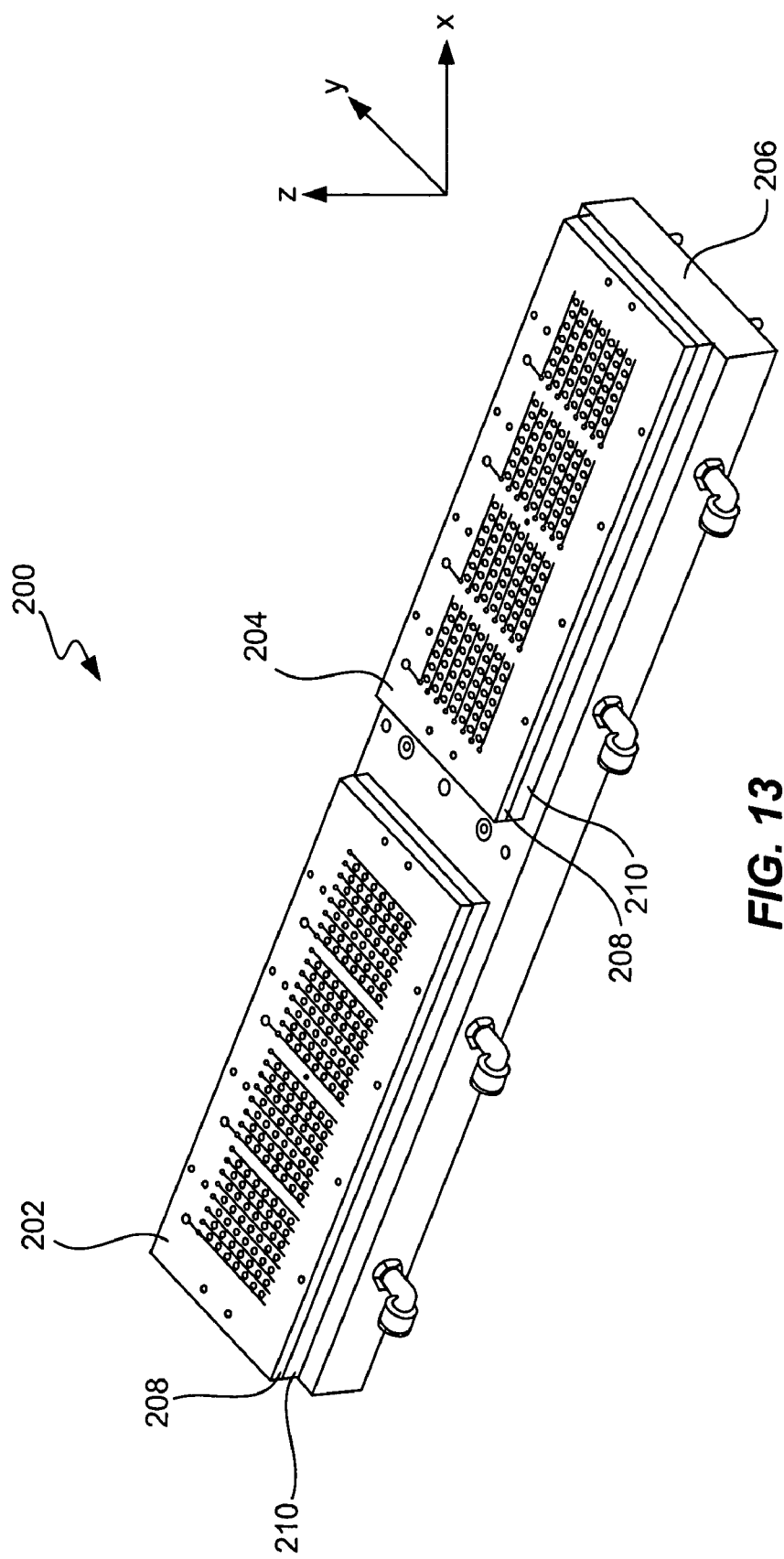
FIG. 13 is a perspective view of a chuck assembly, in accordance with one embodiment of the present invention.

FIG. 13 is a perspective view of a chuck assembly 200, in accordance with one embodiment of the present invention. By way of example, the chuck assembly 200 may correspond to the chuck shown in FIG. 6. The chuck assembly 200 is generally configured to hold an unsingulated substrate and the singulated integrated circuit packages cut therefrom before during and after a singulation procedure carried out with a cutting beam. The chuck assembly 200 generally includes a first chuck 202 and a second chuck 204. The first chuck 202 is configured to hold a substrate (and the integrated circuit packages formed therefrom) during y axis cutting, and the second chuck 204 is configured to hold the substrate (and the integrated circuit packages formed therefrom) during x axis cutting. For a given substrate, the substrate is typically cut in a first direction, as for example the y direction, and thereafter it is cut in a second direction, as for example the x direction. As should be appreciated, this cross cutting technique is configured to cut rectangle or square integrated circuit packages from the substrate.

A typical sequence may include, placing a substrate on the first chuck 202, making multiple cuts in the y direction on the first chuck 202, thereafter transferring the substrate to the second chuck 204, and then making multiple cuts in the x direction on the second chuck 204. The cuts may be made by one or more cutting beams that are moved in the x and y directions via a robot assembly. Furthermore, the transferring may be accomplished with some sort of pick and place machine that uses pick devices to pick and place the substrate and a robot assembly to move the substrate.

Each of the chucks 202 and 204 is supported on a base 206, and includes a vacuum platform 208 and a vacuum manifold 210. As shown, the vacuum platform 208 is disposed on the vacuum manifold 210 and the vacuum manifold 210 is disposed on the base 206. These components are configured to work together to hold the substrate and the integrated circuit packages cut therefrom with a vacuum. These components are also configured to work together to allow a cutting beam to be directed therethrough in the z direction. These components may be attached using any suitable means.

Figure 14:
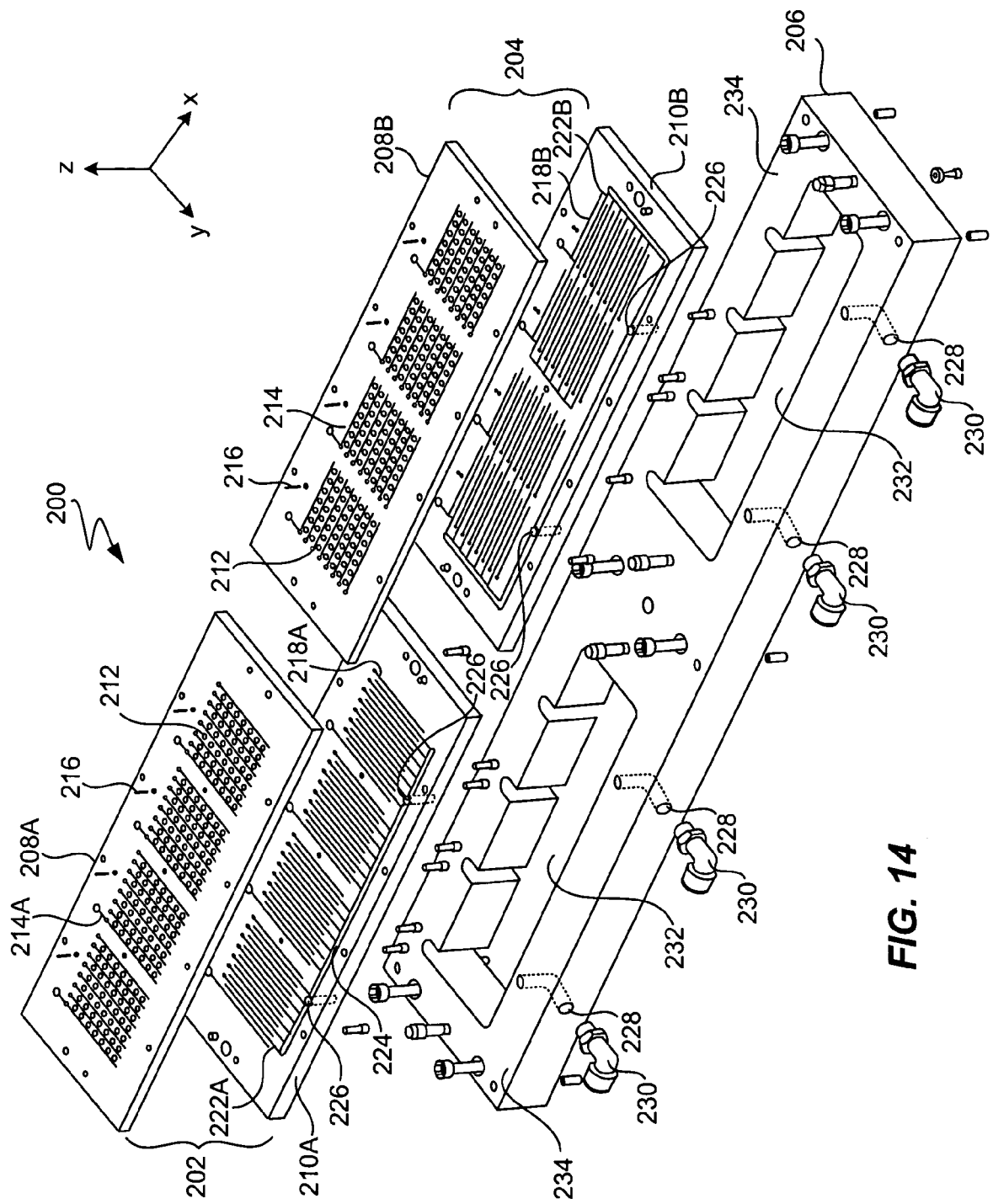
FIG. 14 is an exploded view of the chuck assembly shown in FIG. 13, in accordance with one embodiment of the present invention.

Referring to FIG. 14, the chuck assembly 200 will be described in greater detail. The vacuum platform 208 is configured to receive the substrate thereon. The vacuum platform 208 includes a plurality of openings 212 that provide a vacuum therethrough so as to hold the substrate thereon. The openings 212 may be widely varied. The opening configuration and size generally depends on the size of the substrate and the size and number of integrated circuit packages cut therefrom. In most cases, there is an opening for each integrated circuit package. Furthermore, the openings are typically grouped in rows and columns. The rows and columns may be part of one or more groups. In the illustrated embodiment, the rows and columns are separated into four groups. By way of example, these four groups may correspond to the four groups shown on the substrate in FIG. 3B.

The vacuum platform 208 also includes a plurality of slots 214 that provide a space through which a cutting beam may pass when cutting along the x and y axis. The slots 214 are generally positioned in the space between the openings 212. The position of the slots 214 generally coincide with the saw streets of the substrate, i.e., the space between the integrated circuit packages that is dedicated for cutting. The path of the slots 214 may be oriented in a single direction (e.g., x or y) or they may be bidirectional (e.g., x and y). In the illustrated embodiment, the slots on each of the chucks are oriented in a single direction. Although similar in most respects, each of the chucks 208 is configured to serve different cutting directions, and therefore the slots 214 are positioned in different directions on the vacuum platforms 208 of the two chucks 202 and 204. As shown, the slots 214A are positioned linearly in the y direction in the first chuck 202, and the slots 214B are positioned linearly in the x direction in the second chuck 202.

Each of the vacuum platforms 208 also include one or more alignment pins 216 for aligning the substrate on the vacuum platforms 208. The alignment pins 216 are generally configured to extend into alignment holes in the substrate.

Similarly to the vacuum pedestals 208, the vacuum manifolds 210 include a plurality of slots 218 that provide a space through which a jet stream may pass when cutting along the x and y axis. The position of the slots 218 in the vacuum manifold 210 generally coincide with the position of the slots 214 in the vacuum platform 208, i.e., they have a similar size and direction, and they are aligned when the vacuum platform 208 is attached to the vacuum manifold 210.

The vacuum manifolds 210 also include a plurality of vacuum channels 222 configured to provide a vacuum passageway to the openings 212 of the vacuum pedestals 208. The channels 222 may be widely varied. The channel configuration and size generally depends on the size and configuration of the vacuum pedestal openings 212 as well as the direction of the slots 214/218. In the illustrated embodiment, there is a channel 222 for each row or column of openings 212. The channels 222 typically run linearly between the slots 214/218. As such, the channels 222A in the vacuum manifold 210A of the first chuck 202 run in the y direction, and the channels 222B in the in the vacuum manifold 210B of the second chuck 204 run in the x direction. The channels 222 are typically coupled to a main channel 224 that intersects one or more openings 226 that extend through the vacuum manifolds 210. The openings 226 are configured to mate with a coinciding set of openings 228 in the base 206 of the chuck assembly 200. These openings run through the base 206 and couple to vacuum fittings 230, which couple to a vacuum source via vacuum tubing (not shown).

The base 206 is configured to support the chucks 202 and 204 in their desired position relative to each other and relative to a singulation engine such as for example the singulation engine shown in FIG. 6. The base 206 includes a pair of voids 232, each of which is disposed underneath one of the chucks 202 and 204. The voids 232 provide a space through which a jet stream may pass when cutting along the x and y axis, i.e., through the slots 214/218. The portion of the base 206 that surrounds the voids 232 serves as a point for connecting the chucks 202 and 204 to the base 206. The periphery of the voids 232 is smaller than the periphery of the chucks 202 and 204 and thus the base 206 provides a shoulder 234 for which the chucks 202 and 204 may rest or be attached.

The vacuum platform 208 or portions thereof may be formed from various materials, including but not limited to, deformable and/or rigid materials. By way of example, the vacuum platform may be formed from materials such as ceramic, metal, plastic, rubber and/or the like. It may be preferable that the vacuum platform 208 be formed from materials that are capable of withstanding the rigors of a jet stream cutting sequence. Alternatively or additionally, it may be preferable that the vacuum platform material be able to withstand, for a commercially satisfactory number of cycles, the de-ionized water rinsing process that may be employed before, during and after cutting. Alternatively or additionally, it may be preferable that the vacuum platform material possess anti-static properties to prevent damage to the integrated circuits being fabricated. Alternatively or additionally, it may be preferable that the vacuum platform material possess a high friction coefficient relative to the undersurface of the substrate to prevent translational and/or rotational movement of the substrate and/or the individual packages during and after cutting. Alternatively or additionally, it may be preferable that the vacuum platform material provide a surface with sealing capabilities. For example, when a vacuum is applied to the package through the vacuum opening, the surface contacting the package deforms to the edge of the package thereby sealing the interface between the surface of the vacuum platform and the surface of the package.

In one embodiment, the vacuum platform is formed from a rubber like material such as "VITON" a synthetic material available from McDowell & Company of Downey, Calif. or Pacific State Felt & Mfg. Co. Inc. of Hayward Calif. The resilient VITON material, in addition to being conformable and/or compressible, also offers substantial advantages with respect to machinability, high friction, anti-static property, relative inertness to the rinsing chemicals, and general durability when employed in the vacuum platform application. Although the term "rubberized" is used, it should be noted that the vacuum platform is not limited to rubber materials and that the term "rubberized" is used to reference some of the above mentioned properties (e.g., sealing). In another embodiment, the vacuum platform is formed from stainless steel such as Corrax stainless steel. The steel may have a hardness between about 48–50 RC. In yet another embodiment, the vacuum platform may be formed from a combination of materials. For example, the vacuum platform may include a top layer formed from VITON and a lower layer formed from stainless steel.

The vacuum manifold may be formed from similar materials as the vacuum platform, as for example ceramics, metal, plastics, rubber and the like. In one embodiment, the vacuum manifold is formed from stainless steel. By way of example, the stainless steel may be Corrax stainless steel. The steel may have a hardness between about 48–50 RC.

The vacuum platform and manifolds may be formed using any suitable technique including but not limited to machining, molding and the like. For example, when using stainless steel, the openings and the slots may be formed by EDM. When using a rubber like material, the slots may be formed by the cutting beam of the singulation engine during an initial cutting sequence. That is, the cutting beam may be used to cut through the material and form the requisite slots therein. The vacuum pedestal may be attached to the vacuum manifold using any suitable attachment means including but not limited to conventional fasteners such as bolts, adhesives, welding, clamps, and the like. When using a rubberized vacuum pedestal, the vacuum pedestal may be attached to the vacuum manifold via an adhesive such as glue or epoxy. The vacuum pedestal/manifold combination can be fastened to the base via one or bolts.

Referring to FIGS. 15 and 16, the chucks 202 and 204 will be described in greater detail. In both these Figures, a substrate S is being held to the chuck 202 or 204 during a cutting sequence. The substrate is typically aligned with the chuck 202 or 204 via alignment pins 216. As shown in FIG. 15, the vacuum platform 208 includes a vacuum opening 212 for each package P and thus the entire substrate S as well as each individual package P being cut therefrom is held on the vacuum platform 208 before, during and after singulation via a suction force (e.g., vacuum). To elaborate, the vacuum platform 208 is positioned over the vacuum manifold 210 and each row (or column) of openings 212 is located over a vacuum channel 222 in the vacuum manifold 210. Each vacuum channel 222 connects to the main channel 224 of the vacuum manifold 210 and the main channel 224 connects to the opening 226 of the vacuum manifold 210. Moreover, the vacuum manifold 210 is positioned over the base 206 and the opening 226 of the vacuum manifold mates with the opening 228 of the base 206. The opening 228 runs through the base 206 and couples to a vacuum source via vacuum tubing and vacuum fittings (not shown). When the vacuum source is turned on, a suction force is pulled through the previously mentioned vacuum passageways (as shown by the arrows) in order to secure the substrate S and individual package P being cut therefrom to the surface of the vacuum platform 208.

As shown in FIG. 16, the vacuum platform 208 includes a slot 214 that is aligned with a corresponding slot 218 of the vacuum manifold 210. The slots 214/218 cooperate to form an opening 219 in the chuck 202 or 204. The opening 219 is positioned over the void 232 in the base 206. The length of the opening 219 is typically the same size or smaller than the length of the void 232. During the cutting sequence, the jet stream JS cuts through the substrate and passes through opening 219 of the chuck 202 or 204 and the void 232 of the base 206. After passing through the void 132, the jet stream JS may be diffused in a holding tank as discussed previously. In addition, the jet stream JS moves linearly to the right through the opening 219 in order to form a linear cut C in the substrate S. By way of example, the jet stream JS may be moved in the x or y direction depending on the chuck being used.

Although not shown in either FIG. 15 or 16, the top layer of the vacuum platform 208 may include a deformable material so as to provide a seal between the top surface of the vacuum platform 208 and the bottom surface of the substrate S and individual package P being cut therefrom when the suction force is supplied. The top layer may be a continuous portion of the vacuum platform 208 or it may be a separate component adhered thereto. A seal may also be provided between each of the various layers of the chucks 202 and 204 in order to seal the vacuum passageways.

FIGS. 17A–F are diagrams of a vacuum platform 250, in accordance with one embodiment of the present invention. The vacuum platform 250 is configured to allow linear cuts in the y direction. As such, the vacuum platform 250 may generally correspond to the vacuum platform 208A shown in FIGS. 13 and 14. To elaborate, FIG. 17A is a perspective view of the vacuum platform 250, FIG. 17B is a top view of the vacuum platform 250, FIG. 17C is a front view, in cross section (taken along line C–C'), of the vacuum platform 250, FIG. 17D is a side view, in cross section (taken along line D–D'), of the vacuum platform 250, FIG. 17E is a side view, in cross section (taken along line E–E'), of the vacuum platform 250 and FIG. 17F is a close up front view, in cross section, of a portion of the rubber like vacuum platform 250.

As shown, the vacuum platform 250 includes a plurality of openings 252 and a plurality of slots 254. Each of the openings 252 is formed by two parts, a recessed or countersunk portion 256 and a through hole 258. The recessed portion 156 has a greater diameter than the through hole 258, but is smaller than the periphery of the package. Although not a requirement, the openings 252 are positioned in four groups 260. The groups 260 include openings 252 that are arrayed in columns 262 and rows 264. The number of rows 264 and columns 262 in each group 260 may be widely varied. In the illustrated embodiment, there are 7 rows and 7 columns.

The slots 254 are positioned in the y direction between each column 262. The slots 254 are also positioned outside the first and last column of each group 260. The slots 254 generally extend further than the first and last opening in the columns 262. The first slot in each group (the one that is outside the first column of openings) extends even further than the rest of the slots so as to connect to a starter hole 266. The starter hole 266 provides a starting point for when the jet stream is turned on. For example, a cutting sequence generally begins by placing the centerline of the nozzle over the starter hole 266 before making any linear cuts. The diameter of the starter hole 266 is generally bigger than the width of the slot 254. The slot 254 is generally slightly larger than the width of the jet stream.

FIGS. 18A–E are diagrams of a vacuum platform 270, in accordance with one embodiment of the present invention. The vacuum platform 270 is configured to allow linear cuts in the x direction. As such, the vacuum platform 270 may generally correspond to the vacuum platform 208B of FIGS. 13 and 14. To elaborate, FIG. 18A is a perspective view of the vacuum platform 270, FIG. 18B is a top view of the vacuum platform 270, FIG. 18C is a front view, in cross section (taken along line C–C'), of the vacuum platform 270, FIG. 18D is a side view, in cross section (taken along line D–D'), of the vacuum platform 270, and FIG. 18E is a portion, in cross section, of the vacuum platform 270.

As shown, the vacuum platform 270 includes a plurality of openings 272 and a plurality of slots 274. Each of the openings 272 is formed by two parts, a recessed or countersunk portion 276 and a through hole 278. The recessed portion 276 has a greater diameter than the through hole 278, but is smaller than the periphery of the package so that the package may be retained by a suction force. Although not a requirement, the openings 272 are positioned in four groups 270. The groups 270 include openings 272 that are arrayed in columns 272 and rows 274. The number of rows 274 and columns 262 in each group 270 may be widely varied. In the illustrated embodiment, there are 7 rows and 7 columns.

The slots 274 are positioned in the x direction between each row 284. The slots 274 are also positioned outside the first and last rows of each group 280. The slots 274 generally extend further than the first and last opening 272 in the row 284. The first slot in each group (the one that is outside the first row of openings) is coupled to a starter hole 286 via a starter slot 288 that is perpendicular to the first slot. The starter hole 286 provides a starting point for when the jet stream is turned on. For example, a cutting sequence generally begins by placing the centerline of the nozzle over the starter hole 286 before making any linear cuts. The diameter of the starter hole 286 is generally bigger than the width of the slot 274. The slot 274 is generally a slightly larger than the width of the jet stream.

FIGS. 19A–E are diagrams of a rubber like vacuum platform 240, in accordance with one embodiment of the present invention. By way of example, the rubber like vacuum platform 240 may generally correspond to any of the vacuum platforms 208A or 208B shown in FIGS. 13 and 14. The rubber like vacuum platform 240 is shown before the slots have been formed therein. As mention previously, the slots may be formed with a jet stream of the singulation engine. For example, the rubber like vacuum platform 240 may be attached to a vacuum manifold, and thereafter cut via the jet stream while in the singulation engine. In one embodiment, the rubber like vacuum platform is formed from VITON.

To elaborate, FIG. 19A is a perspective view of the rubber like vacuum platform 240, FIG. 19B is a top view of the rubber like vacuum platform 240, FIG. 19C is a front view, in cross section (taken along line C–C'), of the rubber like vacuum platform 240, FIG. 19D is a side view, in cross section (taken along line D–D'), of the rubber like vacuum platform 240, and FIG. 19E is a close up front view, in cross section, of a portion of the rubber like vacuum platform 240. As shown in all the Figures, the rubber like vacuum platform 240 includes a plurality of openings 242. Each of the openings 242 is formed by two parts, a recessed or countersunk portion 244 and a through hole 246. The recessed portion 244 has a greater diameter than the through hole 146, but is smaller than the periphery of the package.

FIGS. 20A–F are diagrams of a vacuum manifold 290, in accordance with one embodiment of the present invention. The vacuum manifold 290 is configured to allow linear cuts in the y direction. As such, the vacuum manifold 290 may generally correspond to the vacuum manifold 210A shown in FIGS. 13 and 14. To elaborate, FIG. 20A is a perspective view of the vacuum manifold 290, FIG. 20B is a top view of the vacuum manifold 290, FIG. 20C is a front view, in cross section (taken along line C–C'), of the vacuum manifold 290, FIG. 20D is a side view, in cross section (taken along line D–D'), of the vacuum manifold 290, FIG. 20E is a side view, in cross section (taken along line E–E'), of the vacuum manifold 290 and FIG. 20F is a portion, in cross section, of the vacuum manifold 290.

As shown, the vacuum manifold 290 includes a plurality of channels 292 and a plurality of slots 294. Both the channels 292 and the slots 294 are positioned in the y direction. Although not a requirement, the channels 292 are positioned in four groups 302. The number of channels 292 in each group 302 may be widely varied. The number of channels 292 generally corresponds to the number of columns of openings found in the vacuum platform, which connects to the vacuum manifold 290. That is, the channels 292 are configured to coincide with the openings of the vacuum platform so as to provide a suction force therethrough. Each of the channels 292 fluidly couples to a corresponding column of openings in the vacuum platform. In the illustrated embodiment, there are 7 columns. In order to provide a vacuum to the channels 292, each of the channels 292 fluidly couples to a main channel 304, which in turn couples to a pair of openings 306. The channels 300 and 304 are recessed within the top surface of the vacuum manifold 290 while the openings 306 extend through the vacuum manifold 290.

The slots 294 are positioned between each channel 292. The slots 294 are also positioned outside the first and last channel 292 of each group 302. The slots 294 generally extend further at the one end compared to the channels 292. The first slot in each group (the one that is outside the first channel) extends even further than the rest of the slots so as to connect to a starter hole 308. The starter hole 308 provides a starting point for when the jet stream is turned on. For example, a cutting sequence generally begins by placing the centerline of the nozzle over the starter hole 308 before making any linear cuts. The diameter of the starter hole 308 is generally bigger than the width of the slot 294. The slot 294 is generally slightly larger than the width of the jet stream. As should be appreciated, the position, and size of the slots 294 in the vacuum manifold 290 generally coincides with the position and size of the slots in the mating vacuum platform, i.e., they are aligned such that they form a unified slot.

FIGS. 21A–G are diagrams of a vacuum manifold 310, in accordance with one embodiment of the present invention. The vacuum manifold 310 is configured to allow linear cuts in the x direction. As such, the vacuum manifold 310 may generally correspond to the vacuum manifold 210B shown in FIGS. 13 and 14. To elaborate, FIG. 21A is a perspective view of the vacuum manifold 310, FIG. 21B is a top view of the vacuum manifold 310, FIG. 21C is a front view, in cross section (taken along line C–C'), of the vacuum manifold 310, FIG. 21D is a front view, in cross section (taken along line D–D'), of the vacuum manifold 310, FIG. 21E is a side view, in cross section (taken along line E–E'), of the vacuum manifold 310, FIG. 21F is a side view, in cross section (taken along line F–F'), of the vacuum manifold 310, and FIG. 21G is a portion, in cross section, of the vacuum manifold 310.

As shown, the vacuum manifold 310 includes a plurality of channels 312 and a plurality of slots 314. Both the channels 312 and the slots 314 are positioned in the y direction. Although not a requirement, the channels 312 are positioned in two groups 316. The number of channels 312 in each group 316 may be widely varied. The number of channels 312 generally corresponds to the number of rows of openings found in the vacuum platform, which connects to the vacuum manifold 310. That is, the channels 312 are configured to coincide with the openings of the vacuum platform so as to provide a suction force therethrough. Each of the channels 312 fluidly couples to a corresponding column of openings in the vacuum platform. In the illustrated embodiment, there are 7 columns. In order to provide a vacuum to the channels 312, each of the channels 312 fluidly couples to a main channel 318, which in turn couples to a pair of openings 320. The channels 312 and 318 are recessed within the top surface of the vacuum manifold 310 while the openings 320 extend through the vacuum manifold 310.

The slots 314 are positioned between each channel 312. The slots 314 are also positioned outside the first and last channel 312 of each group 316. The first slot in each group (the one that is outside the first channel) is coupled to a starter hole 322 via a starter slot 324 that is perpendicular to the first slot. The starter hole 322 provides a starting point for when the jet stream is turned on. For example, a cutting sequence generally begins by placing the centerline of the nozzle over the starter hole 322 before making any linear cuts. The diameter of the starter hole 322 is generally bigger than the width of the slot 314. The slot 214 is generally slightly larger than the width of the jet stream. As should be appreciated, the position, and size of the slots 314 in the vacuum manifold 310 generally coincides with the position and size of the slots in the mating vacuum platform, i.e., they are aligned such that they form a unified slot.

Figure 22A:
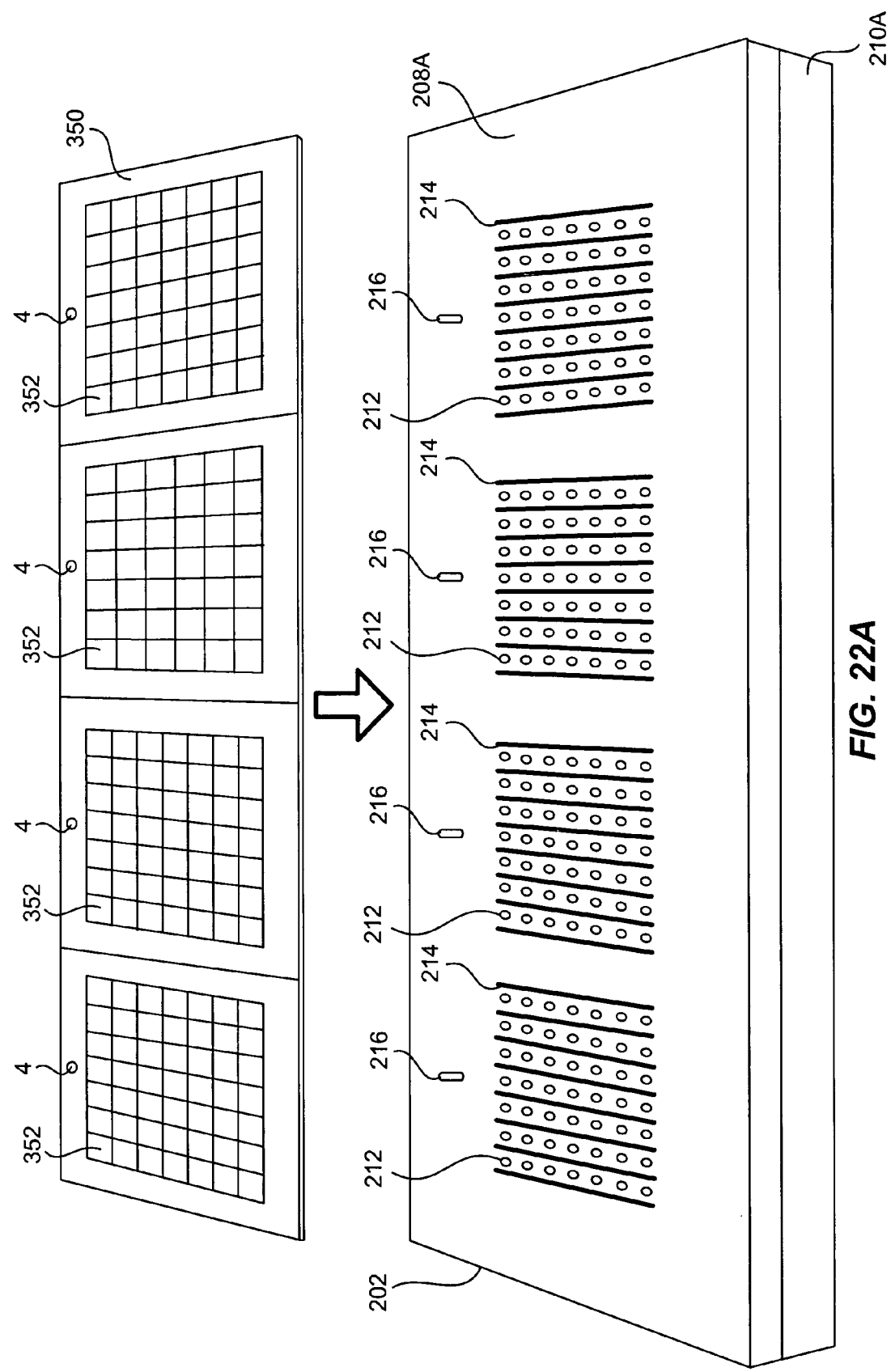

FIGS. 22A–J illustrate a cutting sequence using the gang manifold assembly 80 shown in FIGS. 7A and 7B and the chuck assembly 200 shown in FIGS. 13 and 14. The sequence generally begins by placing a substrate 350 on the chuck 202 as shown in FIG. 22A. This is generally accomplished manually or using some sort of pick and place machine (not shown). During placement, the substrate 350 is positioned on the surface of the vacuum platform 208A and the substrate 350 is aligned relative to the chuck 202 via alignment pins 216. After placement, the vacuum is turned on, and the substrate 350 is held in place by a suction force. The suction force is generated through the openings 212 of the vacuum platform 208A, and the channels (not shown) of the vacuum manifold 210A. As shown in FIG. 22A, the substrate 350 includes a plurality of integrated circuit packages 352 formed thereon. By way of example, the integrated circuit packages 352 may be QFN packages.

Figure 22B:
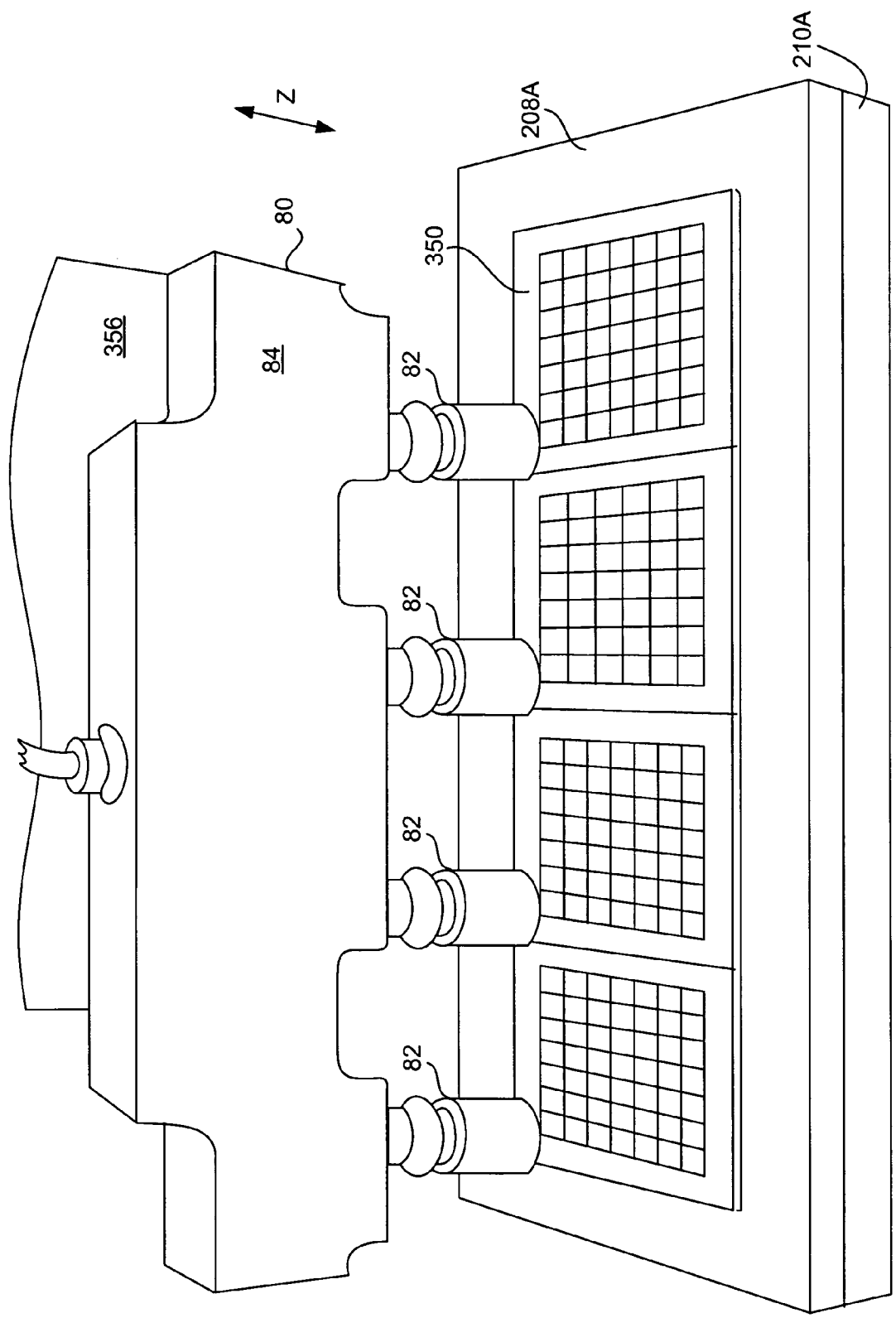

Once the substrate 352 is fixed by the suction force, the gang manifold assembly 80 moves into its starting position over the chuck 202 as shown in FIG. 22B. This is generally accomplished by an x, y, z robot that moves the gang manifold 80 from an initial position to the cutting position. By way of example, the manifold 84 of the gang manifold assembly 80 may be attached to a transfer arm 356 of a robot system. As shown, the gang manifold 80, and more particularly the nozzles 82 are positioned in close proximity to the surface of the substrate 350. That is, the robot moves the gang manifold 80 in the z direction until the nozzles 82 reach a specified cutting height, which is generally very close to the substrate. In most cases, the starting position in the x and y directions is defined by starter hole (not shown) on the chuck 202.

Figure 22C:
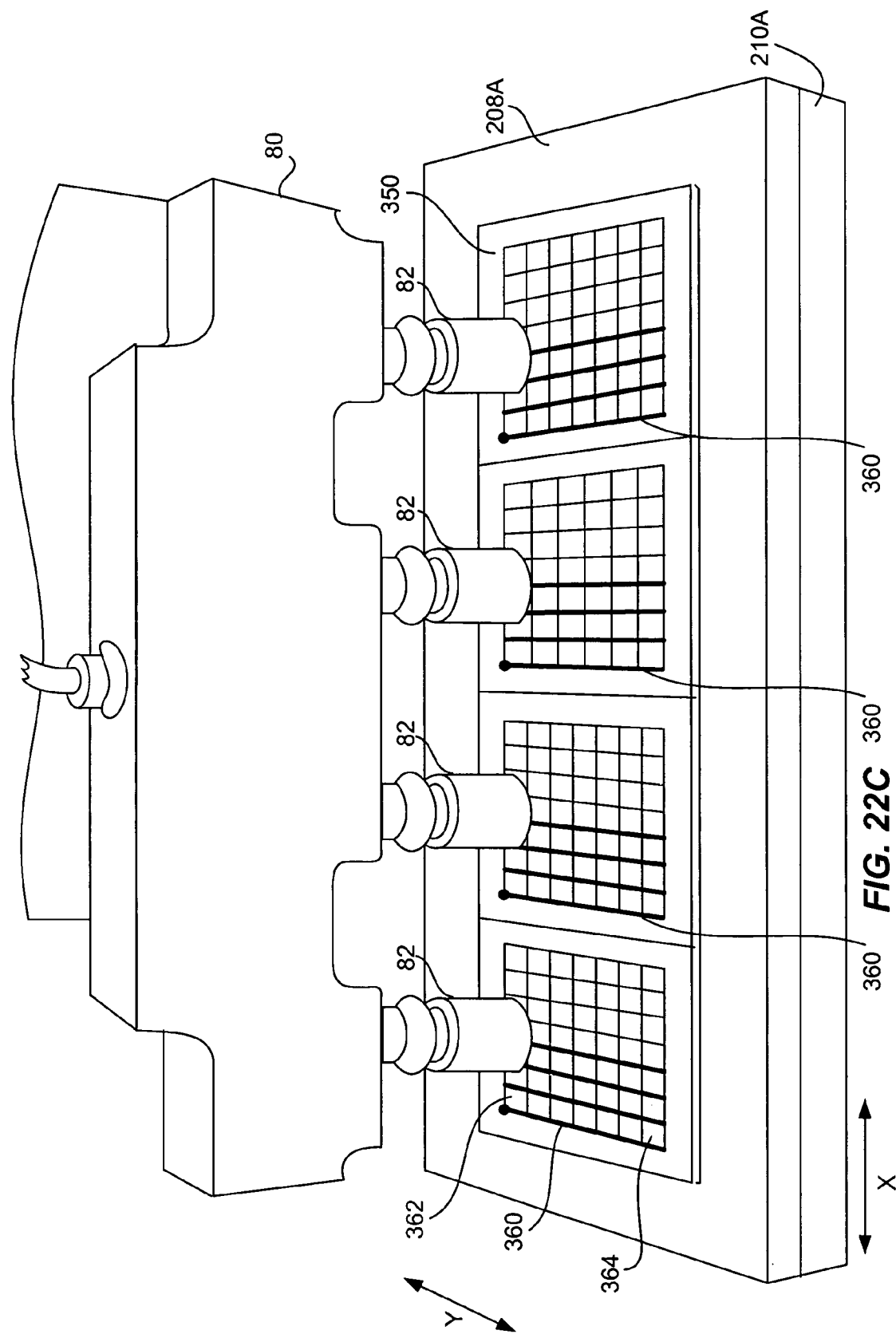
Figure 22D:
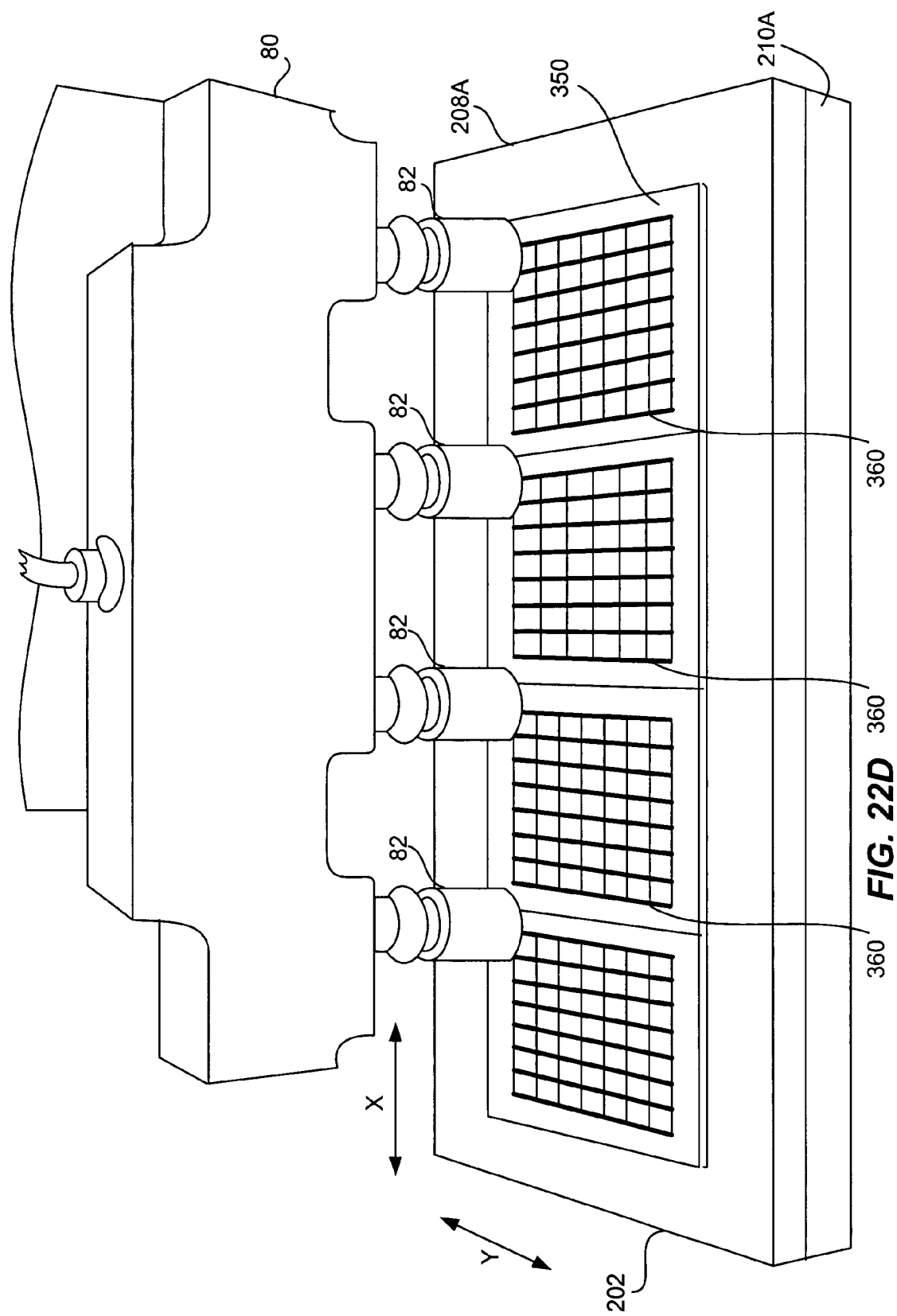

While maintaining the suction force, the gang manifold assembly 80 begins to make linear cuts 360 on the substrate 350 in the y direction as shown in FIGS. 22C and 22D. This is generally accomplished by turning on the jet stream (not shown) and moving the gang manifold in the y direction via the robot system. The movement of the gang manifold assembly 80 may be widely varied. In general, the nozzles 82 are moved together along a linear path so that multiple linear cuts 360 are made. Although only one linear cut 360 can be made with a single nozzle 82 at any one time, the surface of the substrate 350 is sequentially exposed to the jet stream in order to make multiple cuts. The nozzles may make one pass in the y direction and then step over in the x direction in order to make another pass in the y direction. The linear cuts 360 generally extend from the edge of the first package 362 to the edge of the last package 364 in the group. In one embodiment, a serpentine path, which moves back and forth in the direction of the y-axis while being incremented in the x-direction at the end of each traverse, may be used. In this particular embodiment, the movements in the x direction are performed at high speeds so that the jet stream is prevented from cutting through the substrate. This embodiment will be described in greater detail below.

Figure 22E:
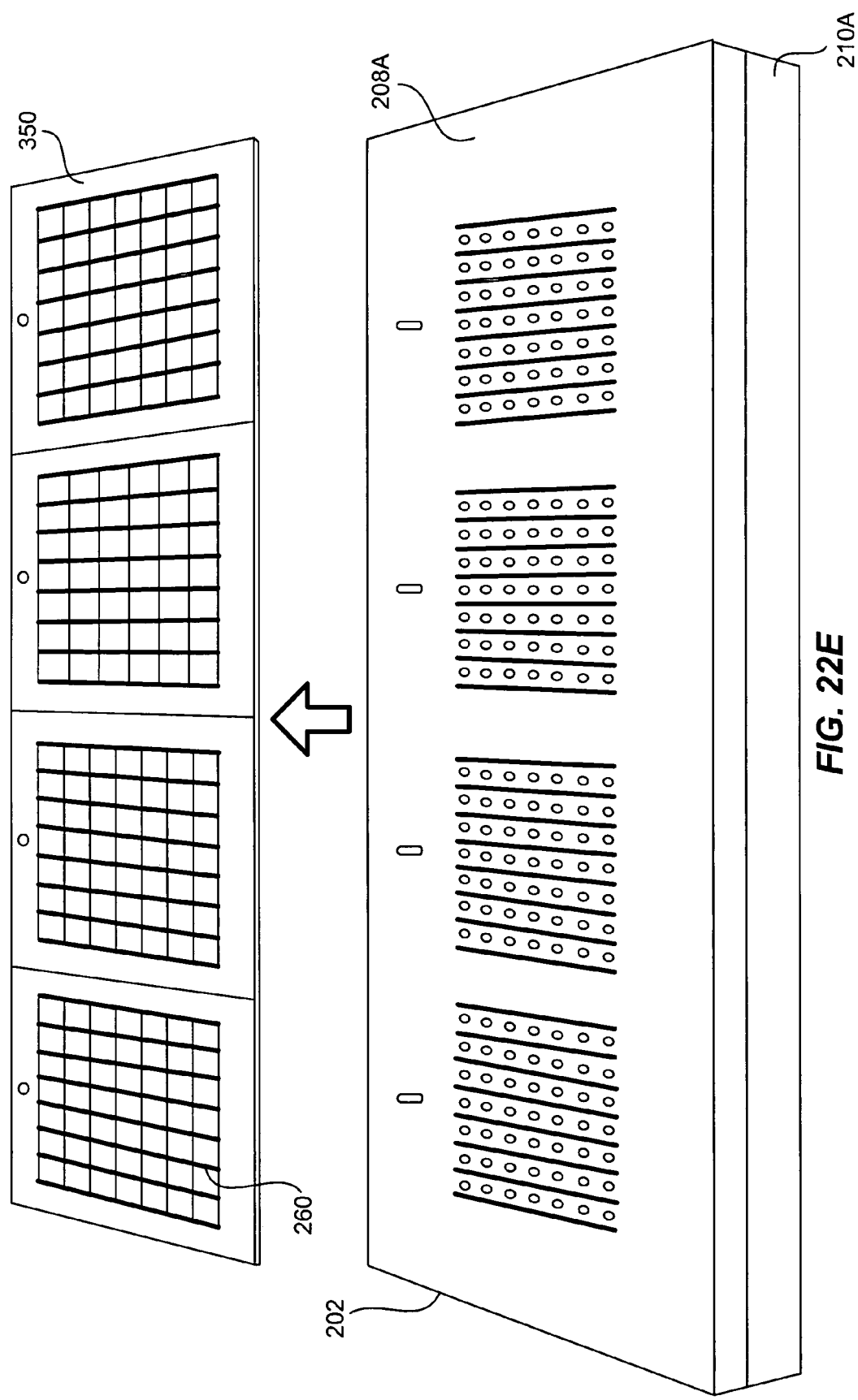
Figure 22G:
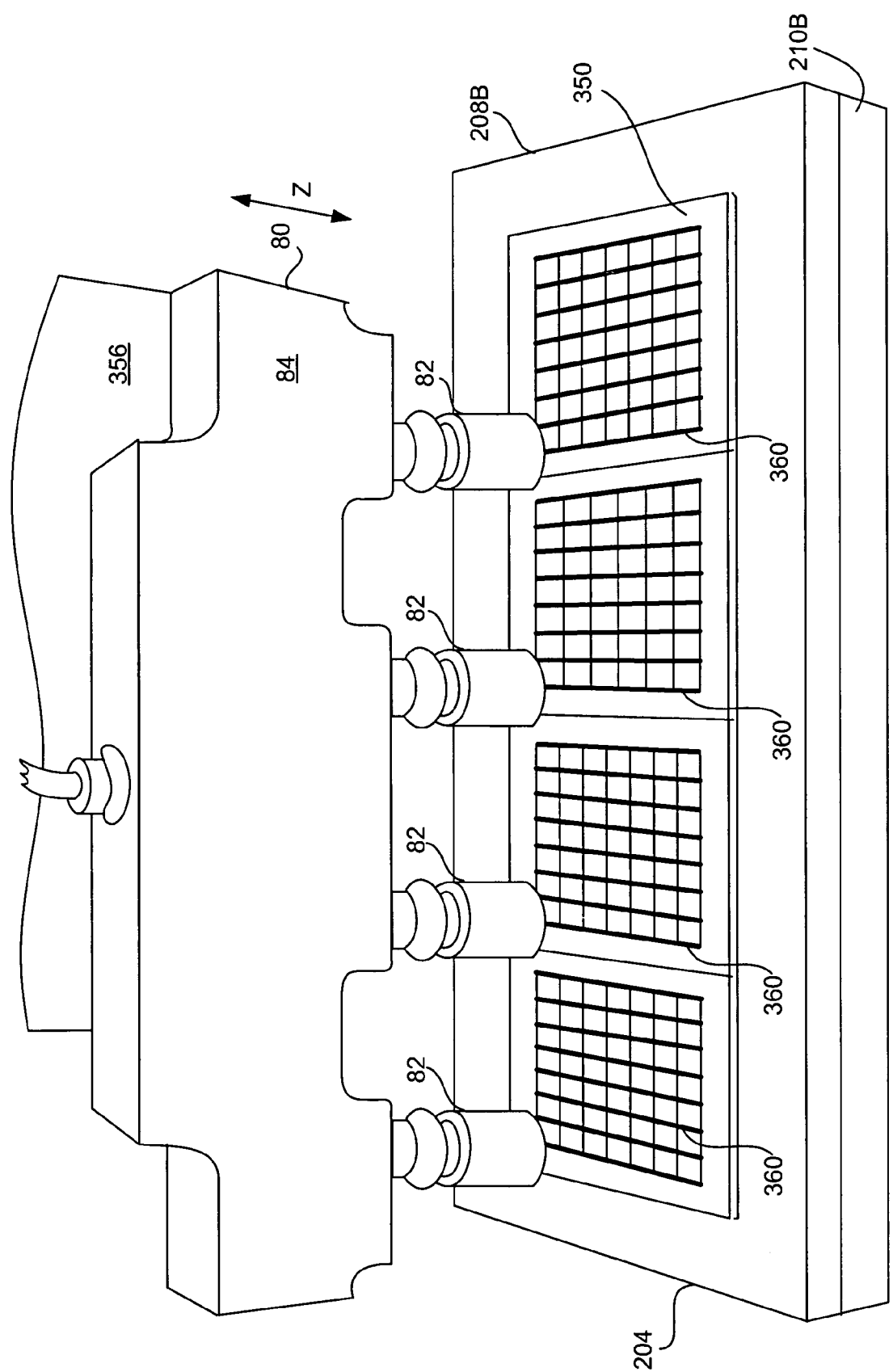

After making the final linear cut, the gang manifold assembly 80 moves away from the chuck 202 and the vacuum is turned off thereby releasing the suction force that had been holding the substrate 350. Thereafter, the cut substrate 350 is removed from the chuck 202 and placed on the second chuck 204 as shown in FIGS. 22E and 22F. This is generally accomplished manually or using some sort of pick and place machine (not shown). During placement, the substrate 350 is positioned on the surface of the vacuum platform 208B and the substrate 350 is aligned relative to the chuck 204 via alignment pins 216. After placement, the vacuum is turned on, and the substrate 350 is held in place by a suction force. The suction force is generated through the openings 212 of the vacuum platform 208B, and the channels (not shown) of the vacuum manifold 210B.

Once the substrate 350 is fixed by the suction force, the gang manifold assembly 80 moves into its starting position over the chuck 204 as shown in FIG. 22B. This is generally accomplished by an x, y, z robot that moves the gang manifold 80 from either the initial position or the first cutting position to a second cutting position. Similarly to the above, the gang manifold 80, and more particularly the nozzles 82 are positioned in close proximity to the surface of the substrate 350. That is, the robot moves the gang manifold 80 in the z direction until the nozzles 82 reach a specified cutting height. In most cases, the starting position in the x and y directions is defined by starter hole (not shown) on the chuck 104.

Figure 22H:
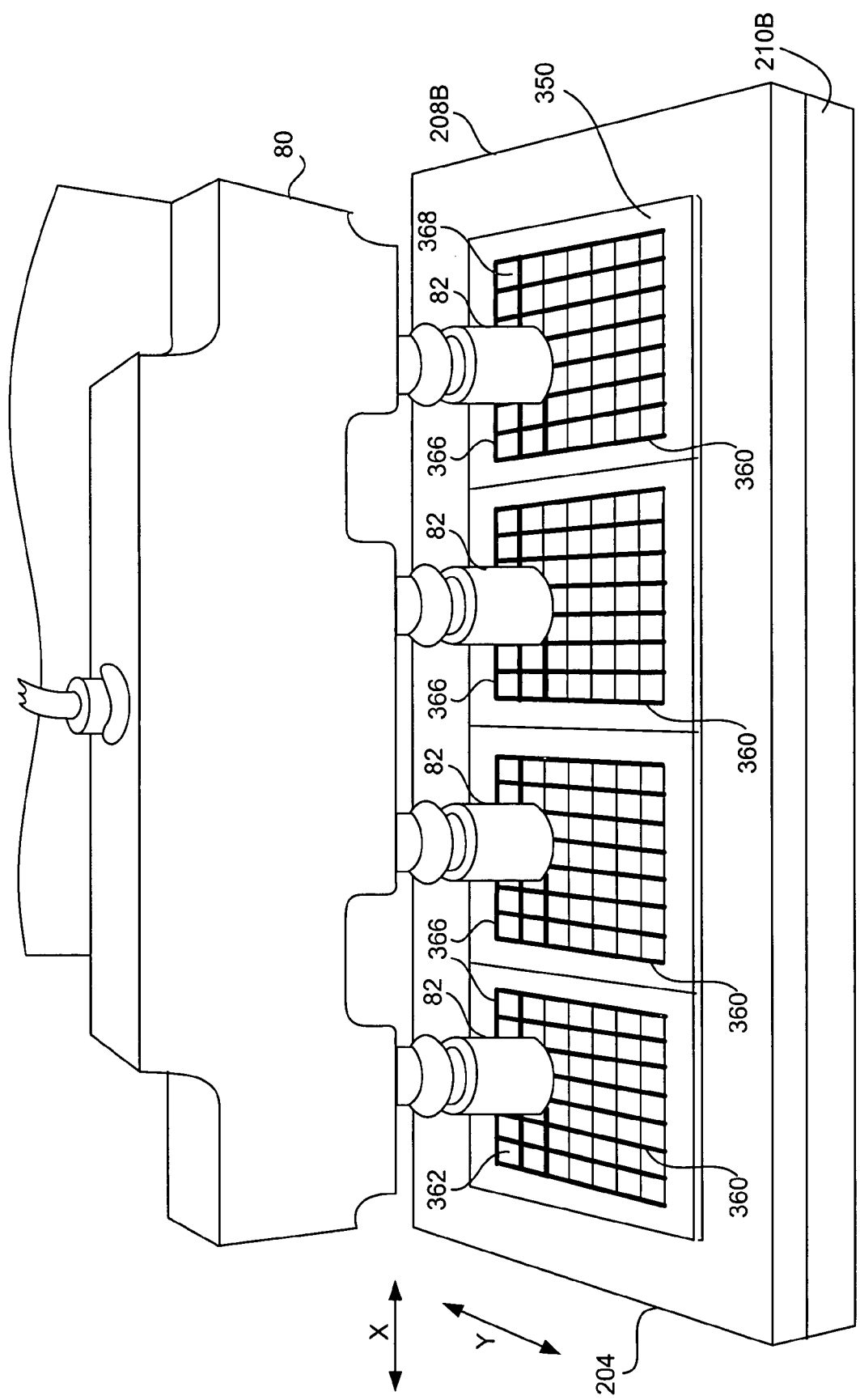
Figure 22I:
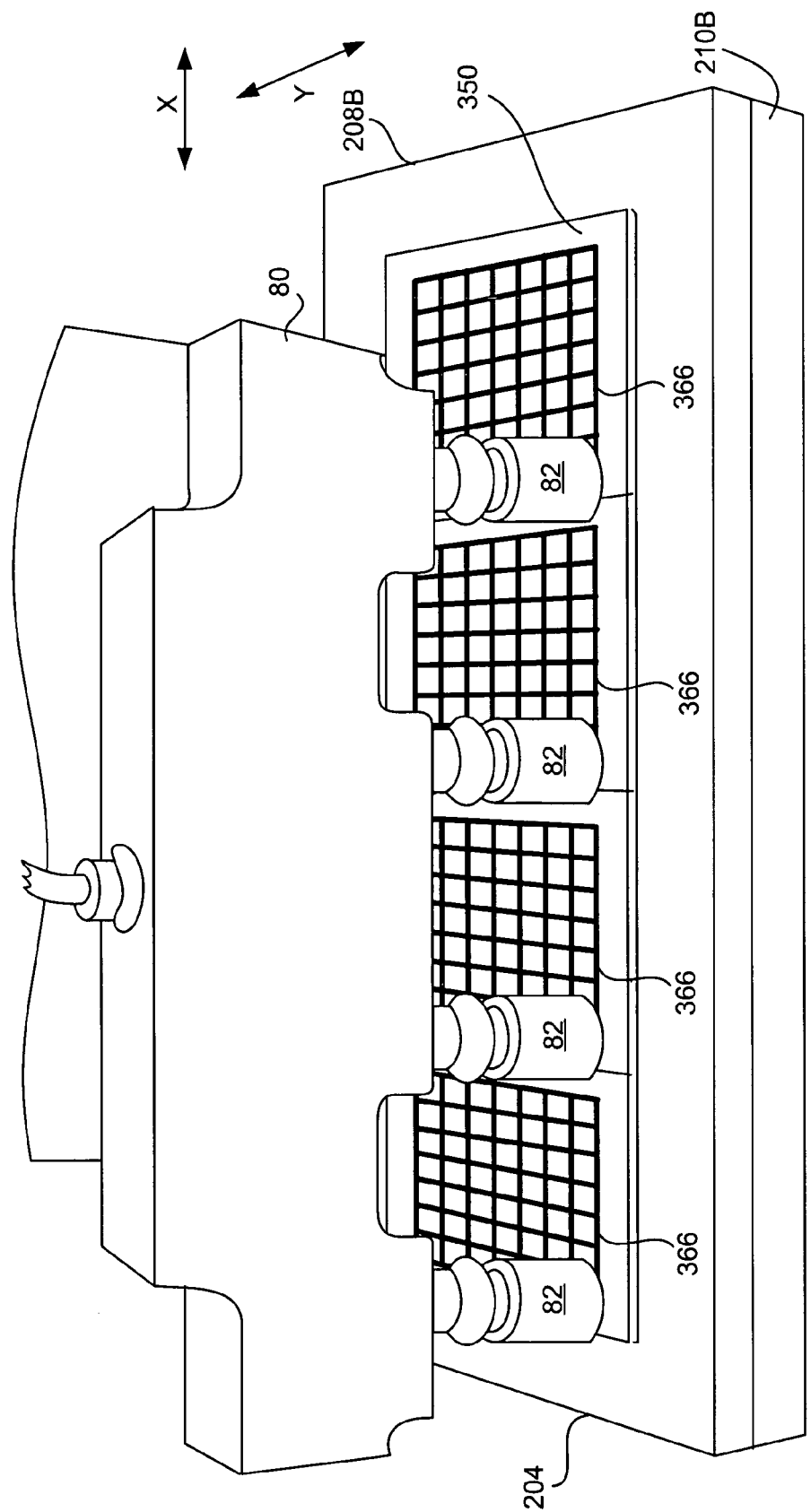
Figure 22J:
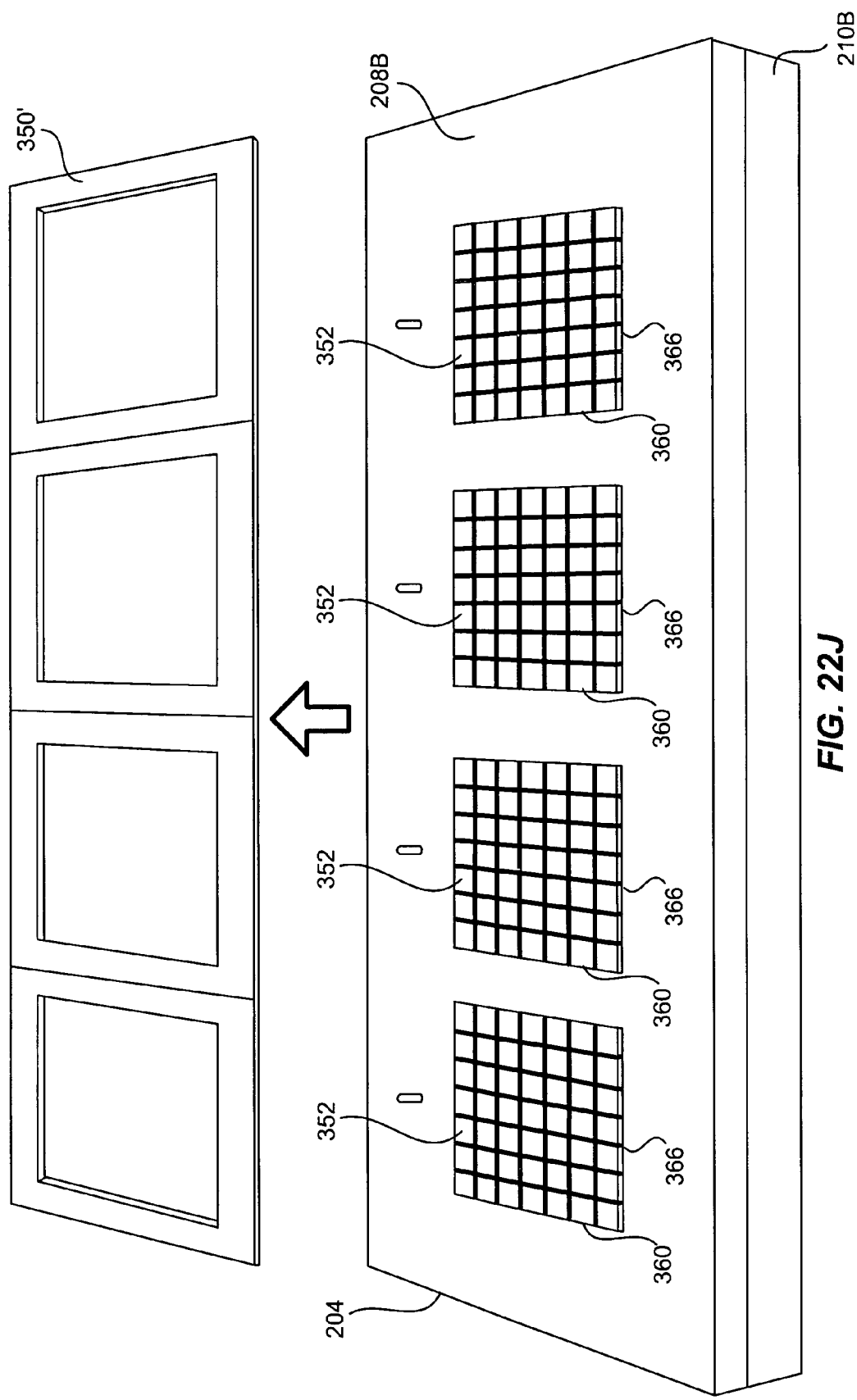

While maintaining the suction force, the gang manifold assembly 80 begins to make linear cuts 366 on the substrate 350 in the x direction as shown in FIGS. 22H and 22I. This is generally accomplished by turning on the jet stream (not shown) and moving the gang manifold assembly 80 in the x direction via the robot system. The movement of the gang manifold assembly 80 may be widely varied. In general, the nozzles 82 are moved together along a linear path so that multiple linear cuts 366 are made. Although only one linear cut 366 can be made with a single nozzle 82 at any one time, the surface of the substrate 350 is sequentially exposed to the jet stream in order to make multiple cuts 366. For example, the nozzles 82 may make one pass in the x direction and then step over in the y direction in order to make another pass in the x direction. The linear cuts 366 generally extend from the edge of the first package 362 to the edge of the last package 368 in the group. In one embodiment, a serpentine path, which moves back and forth in the direction of the x-axis while being incremented in the y-direction at the end of each traverse, may be used. This embodiment will be described in greater detail below.

After making the final linear cut, the gang manifold assembly 80 moves away from the chuck 204 and the remnant 350' of the substrate 350 is removed from the chuck 204. This is generally accomplished manually or using some sort of pick and place machine (not shown). After removing the remnant 350' the singulated packages 352 remain on the chuck 204. From here, the singulated packages can be further processed if desired. For example, they may be moved off of the chuck by a pick and place machine or by sliding them via a transfer arm. Before doing so, however, the vacuum is turned off thereby releasing the suction force that had been holding the singulated packages 352. A post package processing system that be used is described in greater detail in patent application Ser. No. 10/227,163, titled "Integrated Circuit Processing System, filed on Aug. 22, 2002, which is herein incorporated by reference. A pick and place machine that can be used is described in greater detail in patent application Ser. No. 10/226,630, titled "High Speed Pickhead", filed on Aug. 22, 2002, which is herein incorporated by reference.

Figure 23A:
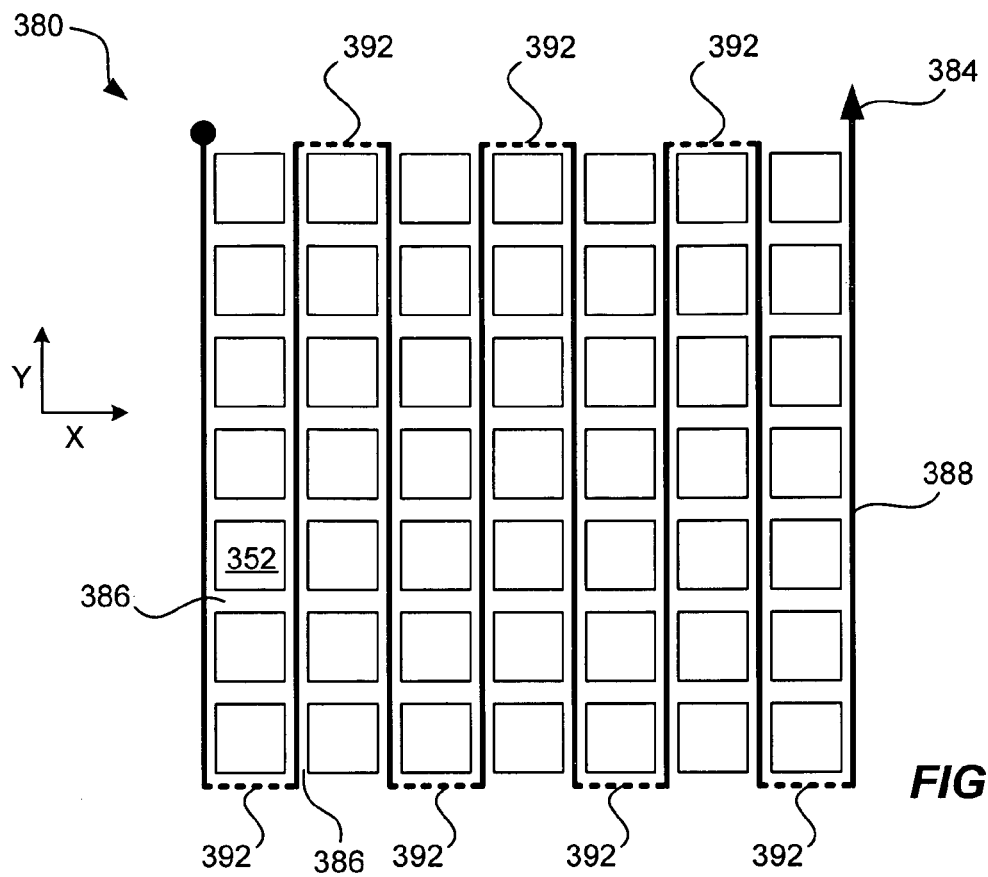
FIGS. 23A and 23B are top view diagrams showing serpentine paths, in accordance with one embodiment of the present invention.
Figure 23B:
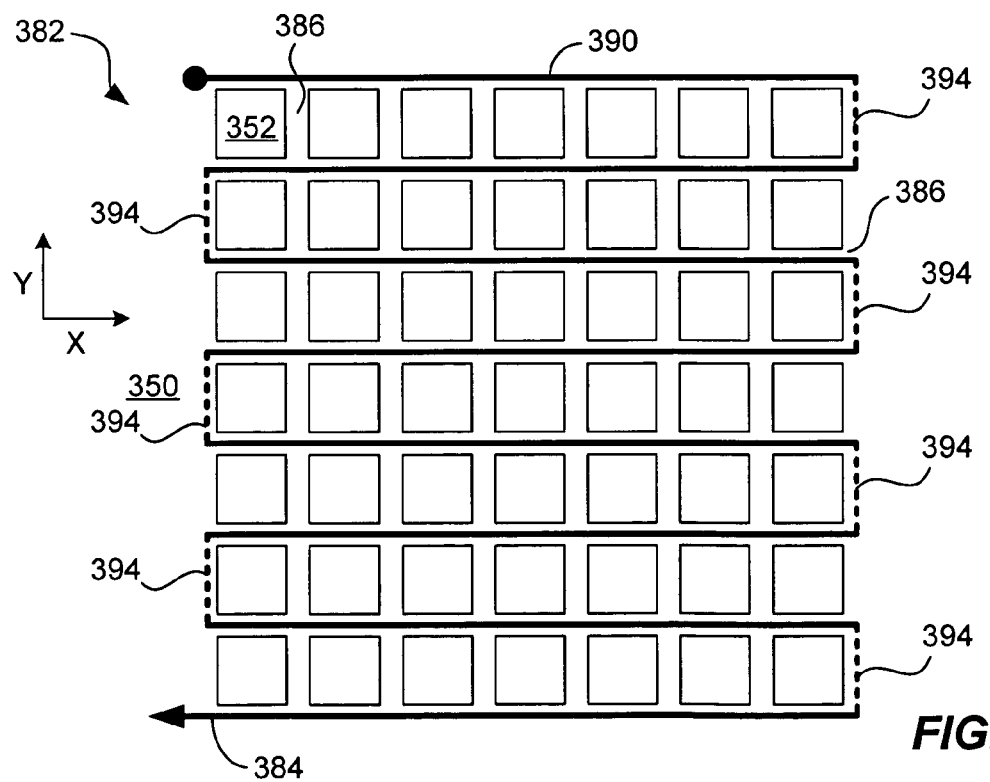

FIGS. 23A and 23B are top view diagrams showing serpentine paths 380 and 382, in accordance with one embodiment of the present invention. The serpentine paths 380 and 382 may be used by the manifold assembly 80 to cut the packages from the substrate 350. FIG. 23A is directed at y direction cuts, and FIG. 23B is directed at x direction cuts. In FIG. 23A, the manifold assembly 80 is caused to move back and forth in the direction of the y-axis while being incremented in the x-direction at the end of each traverse. In so doing, the jet stream 384 is caused to move across a predetermined area of the substrate 350 (along the serpentine path 380) thereby forming y—linear cuts 388 and x—linear cuts 390. The predetermined area may correspond to a group of packages 352.

In FIG. 23B, the manifold assembly 80 is caused to move back and forth in the direction of the x-axis while being incremented in the y-direction at the end of each traverse. In so doing, the jet stream 384 is caused to move across a predetermined area of the substrate 350 (along the serpentine path 382). The predetermined area may correspond to a group of packages 352. Paths 380 and 382 are generally positioned in the saw street 386 of the substrate 350, i.e., the area between each of the packages 352 that is dedicated to dicing the substrate 350.

Figure 24:
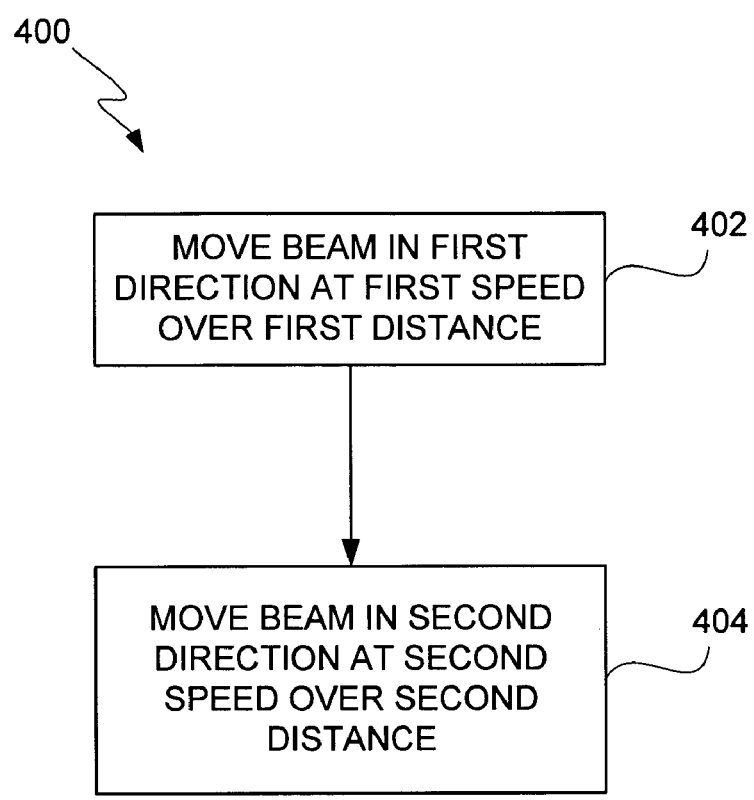
FIG. 24 is a flow diagram of a cutting method, in accordance with one embodiment of the present invention.

In one particular embodiment, the linear cuts 388 and 390 are performed at a first speed while the increments 392 and 394 orthogonal thereto are performed at a second speed. The second speed is configured to be faster than the first speed in order to prevent cuts through the substrate and to decrease the cycle time associated with singulating the packages 352. The ratio between the second speed and the first speed may be between about 40:1 to about 5:1, and more particularly about 20:1. By way of example, the linear cuts 388 and 390 may be cut at about 5 to about 10 mm/s and the increments 392 and 394 may be cut at about 200 mm/s FIG. 24 is a flow diagram of a cutting method 400, in accordance with one embodiment of the present invention. By way of example, the cutting method may be associated with the diagram shown in FIGS. 23A and 23B. The cutting method 400 is typically performed with a z axis beam such as for example a z axis jet stream as discussed throughout this document. The z axis beam is typically moved within a plane that is perpendicular to the z axis beam in order to implement a cutting sequence. Furthermore, the z axis beam is moved continuously without turning it off.

The cutting method 400 generally begins at block 402 where the beam is moved in a first direction at a first speed over a first distance. By way of example, the first direction may be along the x or y axis. The first speed is generally configured to allow the beam to cut through a substrate so as to form a linear cut. The first distance generally corresponds to the length needed to form the linear cut along the side of one or more packages. In most cases, the linear cut is configured to span more than one package, as for example, a row or column of packages.

Following block 402, the process flow proceeds to block 404 where the beam is moved in a second direction at a second speed over a second distance. In most cases, the second direction is orthogonal to the first direction. By way of example, if the first direction is along the y axis then the second direction is along the x axis (or vice versa). The second speed is configured to be faster than the first speed. By way of example, it may be faster on an order of 5 to 40 times, and more particular about 20 times. The faster speed is used to prevent cutting as well as to decrease the cycle time of the cutting sequence. The second distance may be widely varied, however the second distance is typically smaller than the first distance in most cases.

Figure 25:
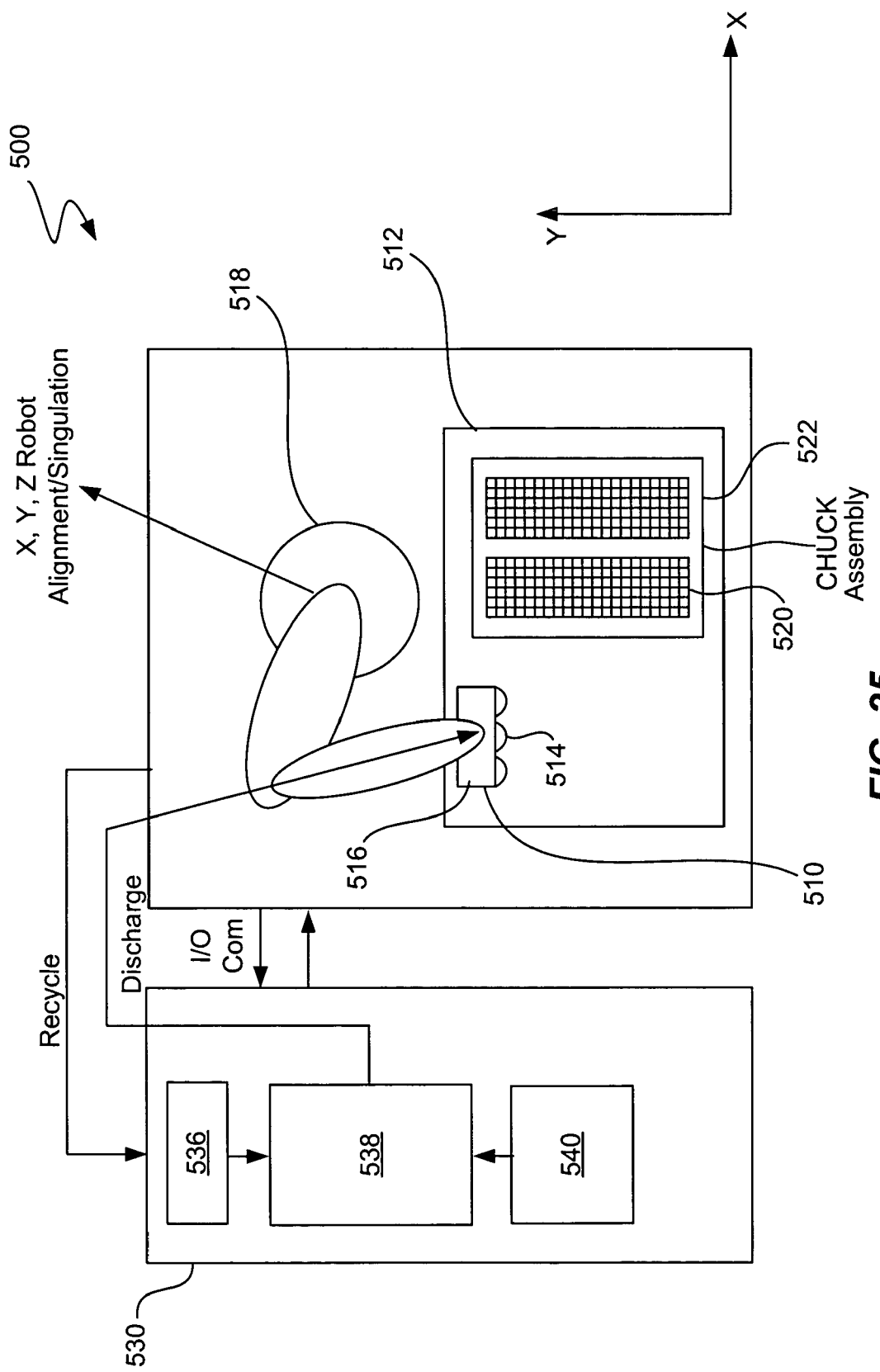
FIG. 25 is a simplified diagram of a singulation engine, in accordance with one embodiment of the present invention.

FIG. 25 is a diagram of a singulation engine 500, in accordance with one embodiment of the present invention. As shown, the singulation engine 500 includes a gang manifold assembly 510 and a chuck assembly 512. The gang manifold assembly 510 is shown in its initial or idle position. When a cut is to be made, the gang manifold 510 moves to a cutting position, which is generally over the chuck assembly 512. As shown, the gang manifold 510 includes a plurality of nozzles 514 that are coupled to a manifold 516.

The manifold 516 is attached to a robot system 518 configured to move the gang manifold assembly 510 between the initial and cutting positions and to move the gang manifold assembly 510 during a cutting sequence. Although the robot system may vary, the robot system in FIG. 25 corresponds to a SCARA robot system.

The chuck assembly 512, on the other hand, includes a first chuck 520 and a second chuck 522. The first chuck 520 is configured to hold a substrate during y axis cutting and the second chuck 522 is configured to hold the substrate during x axis cutting. In this particular embodiment, the first and second chucks are positioned side by side. The singulation engine 500 also includes a holding tank (not shown) generally positioned below the two chucks 520 and 522. The holding tank is configured to store the slurry and receive the jet stream.

The singulation engine 500 also includes an abrasive slurry delivery system 530 that is operatively coupled to the holding tank via a recycle line 532 and to the nozzle manifold 510 via a discharge line 534. The recycle line 532 is used to supply the slurry delivery system with used slurry and the discharge line is used to delivery good slurry to the nozzle assembly. The used slurry may pass through a filtering system 536 as for example the system shown in FIG. 10. Once filtered, the filtered slurry can be introduced into a slurry containment vessel 538. When the slurry containment vessel is filled with good slurry, a pump 540 may be used to force the good slurry out of the containment vessel 538 and into nozzle assembly 510 via the discharge line 534.

When the good slurry is forced out of the nozzles, a cutting sequence commences. As should be appreciated, the robot system moves the nozzle assembly to the cutting position from the initial position before the good slurry is forced into a cutting beam. During a cutting sequence, the nozzle assembly can be continuously repositioned via the various arms of the robot system in order to follow the requisite cutting path. For example, the robot system may move the nozzle assembly in the y direction when cutting over the first chuck 520 and in the x direction when cutting over the second chuck 522. If the spacing between nozzles is large compared to the spacing between integrated circuit packages on the substrate then multiple passes in both directions may be required in order to fully singulate the substrate. The passes may overlap on another.

Figure 26A:
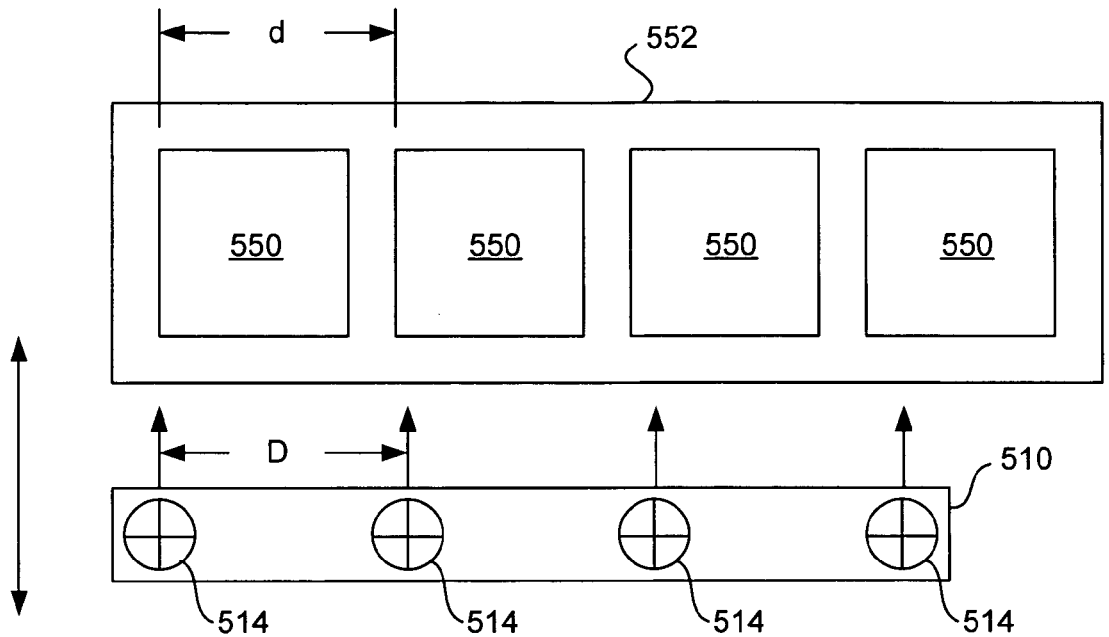
FIG. 26 is a diagram showing a gang manifold initiation sequence, in accordance with one embodiment.
Figure 26B:
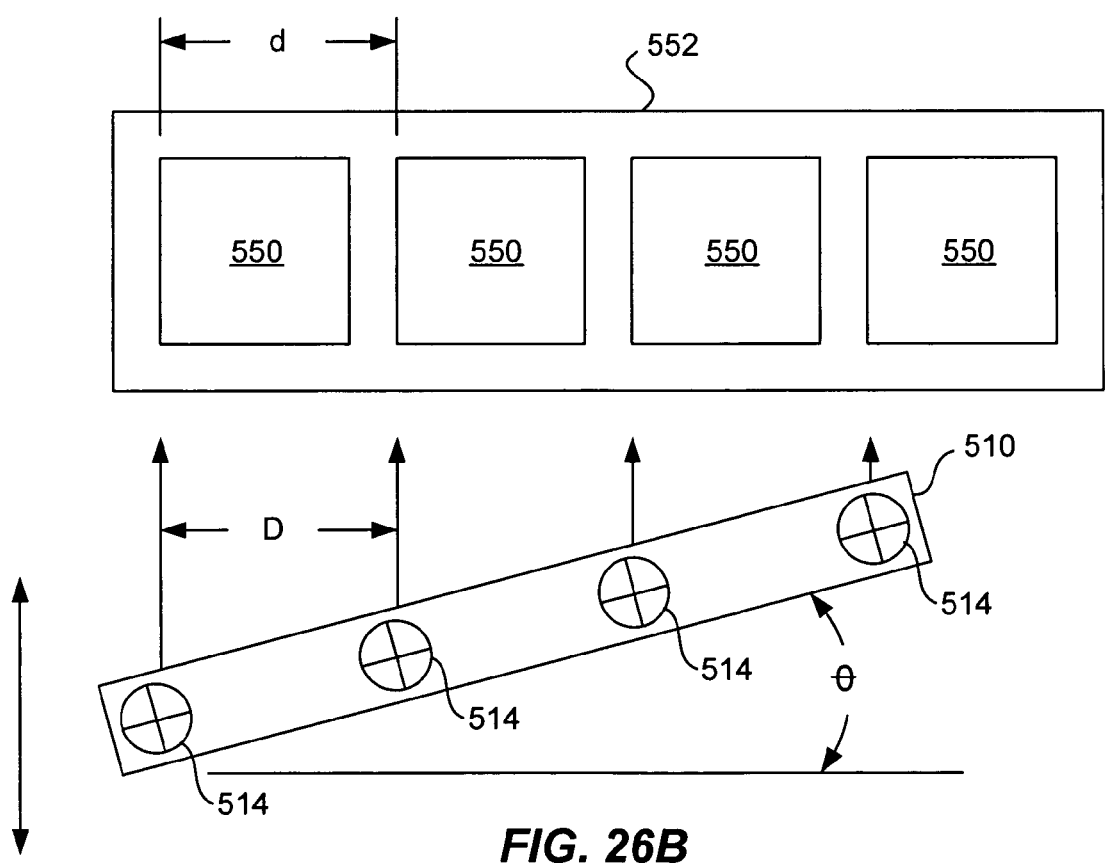

In one embodiment, the angle of the nozzle assembly may be adjusted by the robot system before performing a linear cutting sequence in order to reduce the spacing between cutting beams produced by the nozzles. Referring to FIGS. 26A and 26B, the nozzle adjustment will be described in greater detail. As shown in FIG. 26A, the spacing D between the cutting beams does not coincide with the spacing d between devices or groups of devices 550 on a substrate 552. The spacing D is typically controlled by the position of the nozzles relative to one another. In order for the spacings d and D to match, the nozzles can move relative to one another or the entire nozzle assembly can be rotated. Rotating the nozzle assembly is believed to provide the easiest solution. As shown in FIG. 26B, the spacing D between the cutting beams can be reduced to match the spacing d between device 550 (d=D) by rotating the entire nozzle assembly θ while keeping the positions of the nozzles relative to one another fixed.

It should be noted that the configuration shown in FIG. 25 is not a limitation. For example, the first and second chucks may be positioned in line rather than side by side. Furthermore, more than one gang manifold assembly may be used. For example, a first gang manifold assembly may be used in conjunction with y axis cuts and a second manifold assembly may be used in conjunction with x axis cuts. This particular configuration may require additional robot systems and discharge lines.

Figure 27:
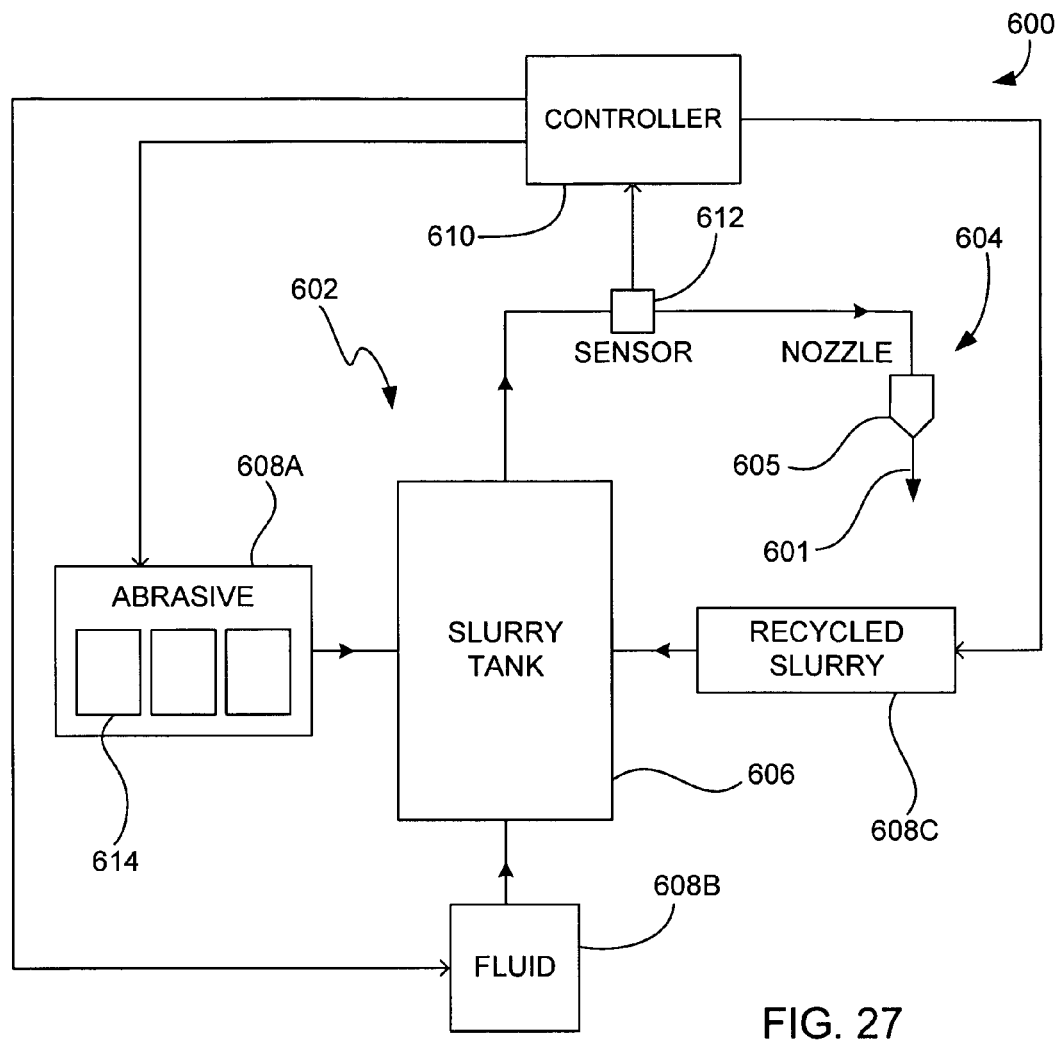
FIG. 27 is a block diagram of a singulation engine, in accordance with one embodiment of the present invention.

FIG. 27 is a block diagram of a singulation engine 600, in accordance with one embodiment of the present invention. The singulation engine 600 is configured to produce one or more cutting beams 601, each of which is capable of cutting through a substrate in order to form small discrete parts. The singulation engine 600 includes an abrasive delivery system 602 and a nozzle system 604 operatively coupled to the abrasive delivery system 602. The abrasive delivery system 602 is configured to supply an abrasive slurry to the nozzle system 604, which includes one or more nozzles 605 configured to produce the cutting beams 601. By way of example, the abrasive delivery system 602 and nozzle system 604 may generally correspond to those shown in the previous figures.

As shown, the abrasive slurry delivery system 602 includes a slurry vessel 606, and one or more sources 608. The slurry vessel 606, which serves as a central structure for receiving inputs from the sources 608, is configured to contain the abrasive slurry before its outputted to the nozzle system 604. The slurry vessel 606 is the location where the abrasive slurry is mixed before being delivered to the nozzle system 604. As should be appreciated, each of the sources 608 is configured to supply a different component to the slurry vessel in order to make up the final concentration of the abrasive slurry before its outputted.

In the illustrated embodiment, the system 602 includes an abrasive source 608A, a fluid source 608B, and a recycled slurry source 608C. The abrasive source 608A is configured to introduce new abrasive material into the slurry vessel 606. The fluid source 608B is configured to introduce a fluid such as water into the slurry vessel 606. The fluid is mixed with the abrasive to form the abrasive slurry. The recycled slurry source 608C is configured to reintroduce previously used slurry back into the slurry vessel 606. The recycled slurry may for example be reclaimed slurry that has been filtered.

All three sources 608 can be controlled to affect the abrasive to fluid concentration of the abrasive slurry. For example, the amount of abrasive, fluid and slurry introduced into the slurry vessel may be increased or decreased to change the concentration of the outputted abrasive slurry. The slurry concentration is typically controlled by a controller 610. The controller 610 may be the controller of the entire singulation engine 600 or it may be a dedicated controller of the abrasive slurry system 602. In either case, the controller 610 is configured to execute instructions and carry out operations associated with the abrasive slurry system 602. For example, using instructions retrieved from memory, the controller 610 may control the reception and manipulation of input and output data between the various components of the abrasive slurry system 602. As shown, the controller 610 is operatively coupled to each of the sources 608 so that their output can be adjusted. That is, the controller 610 sends a control signal to the sources 608 so as to affect the amount of abrasive, fluid and recycled slurry in the slurry vessel 606.

In order to properly control the slurry concentration, the abrasive slurry system 602 generally includes one or more concentration sensing devices 612. The concentration sensing devices 612 are configured to perform measurements so that the concentration (particle count) of the abrasive, fluid and/or slurry can be ascertained. The concentrations sensing devices 612 are also configured to report this information to the controller 610. When reported, the controller 610 interprets the measurement data in accordance with its programming. By way of example, the controller 610 may calculate the concentration based on the measurement data, and thereafter determine if a change at one of the inputs is needed in order to produce the desired concentration output.

The concentration sensing devices 612 may be placed at various points in the abrasive slurry system 602 to provide concentration feedback to the controller 610. The concentration sensing devices 612 may for example be placed at any of the inputs or outputs of the slurry vessel 606. When placed at the inputs, the controller 610 monitors the concentration of the abrasive source 608A, fluid source 608B and/or slurry source 608C. When placed at the outputs, the controller 610 monitors the concentration of the outputted slurry, i.e., the slurry that is sent to the nozzles 605 in order to perform a cutting operation.

In one implementation, the controller 610 compares the measured concentration to a desired concentration, and if different, refers to a table or algorithm that informs the controller 610 as to what changes need to be made at each of the sources 608 in order to produce the desired concentration. If a change is needed, the controller 610 sends a control signal indicating the change to the appropriate source(s) 608. The sources 608 are configured to receive the control signal from the controller 610, and to adjust the output thereof in order to affect the abrasive slurry concentration. By way of example, in order to increase the abrasive to fluid ratio in the slurry, a first control signal may cause the abrasive source 608A to output more abrasive and/or a second control signal may cause the fluid source 608B to reduce the output of fluid. Along a similar vein, in order to decrease the abrasive to fluid ratio of the slurry, a first control signal may cause the abrasive source 608A to output less abrasive and/or a second control signal may cause the fluid source 608B to increase the output of fluid. In most cases, the sources 608 are controlled as part of a continuous feedback loop in order to maintain the desired abrasive slurry concentration during a particular cutting operation. By way of example, the abrasive may make up between 5% to about 40% of the total slurry. In one particular example, slurry contains about 10 parts abrasive and 90 parts fluid.

In one embodiment, the abrasive source 608A is configured with multiple abrasive containers 614 configured to hold the abrasive material. Any number of containers 614 may be used. By utilizing multiple containers 614, downtime associated with loading new abrasive material can be reduced. For example, when one container is emptied, the control system can switch to a full container. Once switched, the emptied container can be refilled. This process can be performed continuously thereby eliminating downtime due to loading new material. In cases where the containers 614 are emptied at the same time, the control system can switch to the recycled slurry source 608C until the new material is added into the system 602. The containers 614 may be fixed or they may be removable from the delivery system 602. If removable, the emptied container can be removed, and a full container can be inserted in its place.

Figure 28:
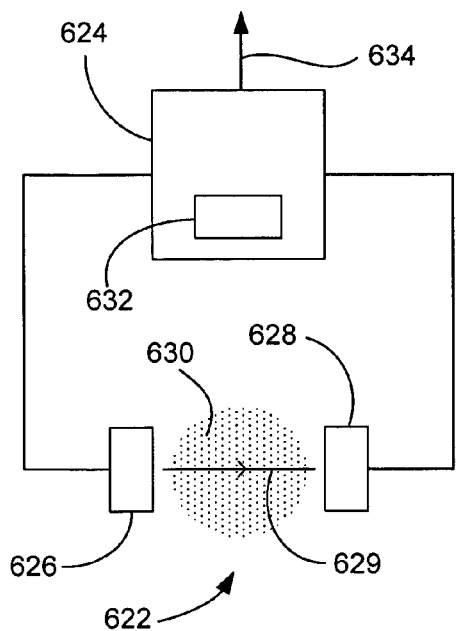
FIG. 28 is a diagram of a concentration sensing device, in accordance with one embodiment of the present invention.

FIG. 28 is a diagram of a concentration sensing device 620, in accordance with one embodiment of the present invention. The concentration sensing device 620 may generally correspond to the sensing device shown in FIG. 27. The concentration sensing device 620 generally includes a sensor 622 and a sensing circuit 624. The sensor 622 produces signals associated with the concentration and the sensing circuit 624 acquires the signals from the sensors 622 and supplies the acquired signals to a host controller. The sensor 622 may be based on a wide variety of technologies including but not limited to optical or ultrasonic technologies. Optical sensors may for example include turbidity sensors. With regards to the sensing circuit 624, the sensing circuit 624 may send the raw data to the host controller and/or the sensing circuit 624 may be configured to process the raw data before sending it to the host controller. For example, the sensing circuit 624 may read the pulses from the sensors 622 and turn them into data that the host controller can understand.

To elaborate, the sensor 622 generally includes one or more emitters 626 and one or more detectors 628. The emitters 626 are configured to apply a signal 629 transverse to the moving slurry 630 (or component of the slurry) and the detectors 628 are configured to detect changes in the signal 629 that are attributable to the slurry concentration. In optical sensors, the emitters 626 are light emitting devices that direct light or radiation at the slurry 630, and the detectors 628 are light detectors that detect changes in the light or radiation after intersecting the moving slurry 630. The light emitting devices may generally correspond to light emitting diodes and the light detectors may generally correspond to photocells, photodiodes, and the like. In ultrasonic sensors, the emitter 626 is a wave generator that directs sonic waves at the slurry 630, and the detectors 628 are sonic wave detectors that detect changes in the sonic waves after they intersect the slurry 630.

Like the sensor 622, the sensing circuit 624 may be widely varied. The sensing circuit 624 is generally configured to acquire the measurement signals from the detectors 628 and report the measurement data to a host controller. The sensing circuit 624 may include an analog to digital converter (ADC) 632 configured to digitize the incoming analog signals. That is, the ADC converts the analog signals produced at the detectors 628 into an outgoing digital signal 634 that can be easily received by the host controller. The input to the ADC 632 generally corresponds to a voltage having a theoretically infinite number of values. The voltage varies according to the intensity of the measurements (e.g., light intensity, wave intensity). The output to the ADC, on the other hand, has a defined number of states. The states generally have predictable exact voltages and currents, which can be easily read by the host controller.

Figure 29:
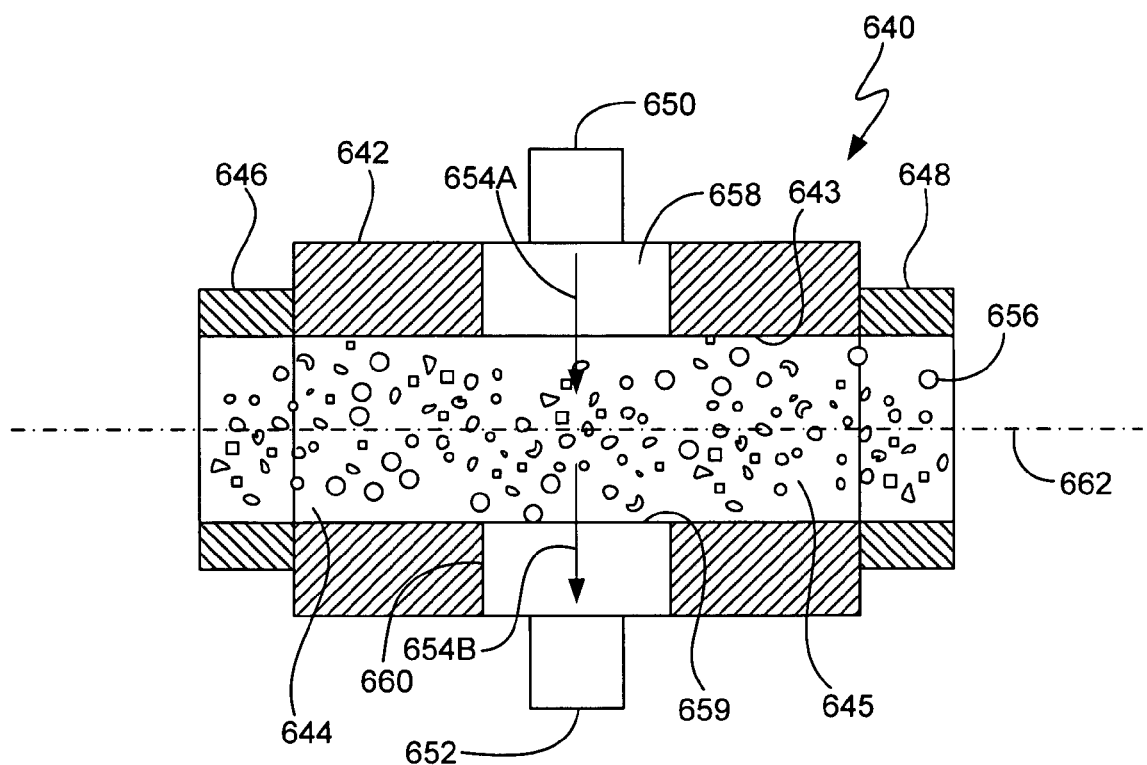
FIG. 29 is a side elevation view, in cross section, of an optical concentration sensor, in accordance with one embodiment of the present invention.
Figure 30:
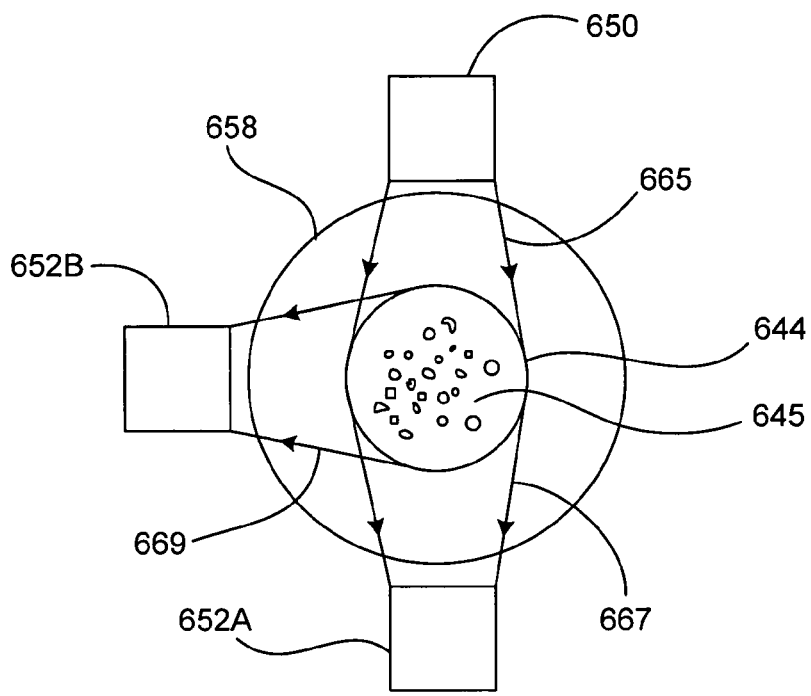
FIG. 30 is a front elevation view, in cross section, of an optical concentration sensor, in accordance with one embodiment of the present invention.

FIGS. 29 and 30 are diagrams of an optical concentration sensor 640, in accordance with one embodiment of the present invention. The optical concentration sensor 640 may generally correspond to the sensor shown in FIG. 28. The optical concentration sensor 640 includes a housing 642 that defines a slurry passage 644 therein. The slurry passage 644 is configured to distribute a moving abrasive slurry 645 between an inlet coupling 646 and an outlet coupling 648. The inlet coupling 646 may for example be fluidly coupled to a slurry vessel through a first hose and the outlet coupling 648 may be fluidly coupled to a nozzle assembly through a second hose. The inlet and outlet coupling may be coupled to the hoses via c clamps, hose clamps, quick disconnect couplings, and the like. The housing 642 and more particularly the inner surface 643 of the housing 642 is formed from a material that is resistant to a moving abrasive slurry 645. By way of example, the inner surface 643 may be formed from ceramics, carbide, stainless steel (e.g., 316 stainless steel) and/or the like.

The optical concentration sensor 640 also includes a light source 650 and one or more light detectors 652. The light source 650 is configured to direct light 654A into the passage 644, and the light detectors 652 are configured to detect light 654B traveling out of the passage 644. When the slurry 645 is present inside the passage 644, the light 654A is directed into the slurry 645 and the light detectors 652 detect the light 654B that emanates out of the slurry 645. The light 654B emanating out of the slurry 645 can be transmitted and/or scattered light. Transmitted light is that light, which passes through the slurry 645 without intersecting any particles 656 contained therein. Scattered light is that light which intersects particles 656 and therefore scatters in all directions. The intensity of the transmitted light and scattered light 654B is directly related to the concentration of the slurry 645. For example, when the ratio of abrasive to fluid is high, more light will be scattered and less light will be transmitted because of the greater number of particles in the slurry, and when the ratio of abrasive to fluid is low, more light will be transmitted and less light will be scattered because of the reduced amount of particles in the slurry. In one embodiment, only the transmitted light is detected. In a another embodiment, only the scattered light is detected. In yet another embodiment, both the transmitted light and the scattered light are detected. By detecting both, a more accurate concentration reading may be obtained.

In order to allow the light 654 to be directed into and out of the passage without comprising the slurry 645, the housing generally includes a window 658 formed from a light passing material(s). The window 658 may for example be formed from translucent or semi translucent materials. The window 658 generally covers an opening 660 in the housing 642 and in some cases is positioned inside the opening 660 in the housing 642 (as shown). The window 658 may be one continuous piece (as shown) or it may be several pieces that are only positioned in front of the light source 650 and detectors 652. When separate pieces, the spaces found between the windows may be a portion of the housing or some other filling structure. Furthermore, the inner surface of the window 659 may protrude, be recessed or flush with the inner surface 643 inside the passage 644. In most cases, the inner surface 659 of the window 658 is made flush with the inner surface 643 of the housing 642 so as to provide a continuous surface thereby allowing a more uniform flow of slurry 645 through the sensor 640. Moreover, the inner surface 659 of the window 658 is formed from a material that can substantially withstand a slurry environment and does not substantially contribute to contamination. As should be appreciated, even though the slurry 645 typically flows laminarly through the sensor 640, the abrasive particles 656 at the periphery of the passage 644 may scratch the window 658 as they travel through the sensor 640. By way of example, the window 658 may be formed from quartz, or glass that is coated with a scratch resistant layer.

The configuration of the sensor 640 may be widely varied. Although this is not a requirement, the housing 642 as well as the passage 644 is configured to be substantially cylindrical in shape with substantially straight walls. The light source 650 and detectors 652 and window 658 may be placed anywhere along a longitudinal axis 662 of the housing 642. In most cases, the light source 650 and detectors 652 are positioned in the same plane and are disposed at various positions about the periphery of the window 658. As shown in FIG. 30, the light source 650 and detectors 652 are disposed radially about a longitudinal axis 662 of the housing 642 with each of these components being axially oriented such that their working centerlines point toward the longitudinal axis 662 (e.g., perpendicular). The light source 650 and detectors 652 can be separated by various angles. By way of example, they may be separated by 90 degree increments about the periphery of the housing 642. It should be understood however that the angles may vary according to the specific design of sensor 640. In addition, the light source 650 and detectors 652 are typically disposed outside of the housing walls. It should be noted however that these components may also be disposed within the housing walls as for example when the window 658 only partially fills the opening 660 in the housing 642. Alternatively, these components may be embedded inside the window 658.

In the illustrated embodiment, and referring to FIG. 30, the optical concentration sensor includes a single light source 650 and a plurality of light detectors 652. The single light source 650 shines light 665 at the slurry 645 through the window 658. Light that passes straight through the slurry 645, i.e., transmitted light 667, is collected by a first detector 652A and the light that reflects off the particles, i.e., scattered light 669, is collected by a second detector 652B. The first light detector 652A is placed directly across from the light source 650, and the second light detector 652B is angled such that the centerline traverses the centerline of the light source 650. By way of example, the first detector 652A may be placed at 180 degrees and the second detector 652B may be placed at 90 and/or 270 degrees relative to the light source 650. The light source 650 may for example be an infrared light emitting diode (LED), and the light detectors 652 may be photocells or photodiodes. The detectors 652 generally produce voltages that vary in accordance with the light intensity. The first light detector produces voltages in accordance with the light intensity of the transmitted light, and the second light detector produces voltages that vary in accordance with the intensity of the scattered light. The voltages for both detectors 652 are monitored and subsequently translated into concentration at a host controller or alternatively at a sensing circuit.

Figure 31:
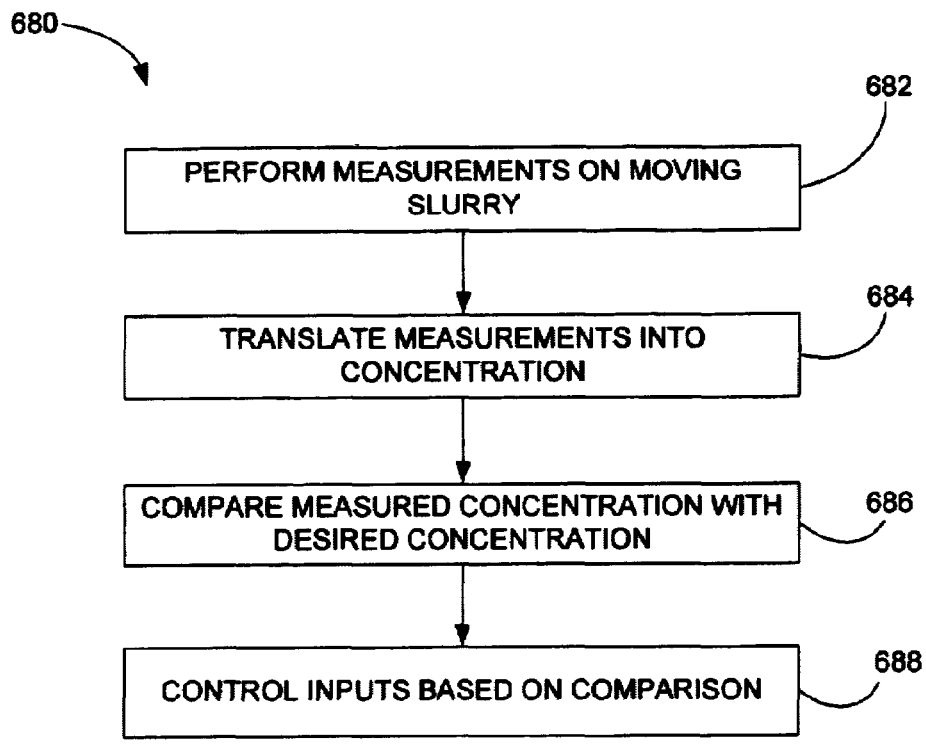
FIG. 31 is a slurry control method, in accordance with one embodiment of the present invention.

FIG. 31 is a slurry control method 680, in accordance with one embodiment of the present invention. The method 680 may generally be performed using the system shown in FIG. 27. The method begins at block 682 where measurements are performed on the moving slurry. The measurements may for example be light intensity measurements produced by one or more light detectors. Following block 682, the process flow proceeds to block 684 where the measurements are translated into concentration. This may be accomplished with an algorithm or table that relates measurements with concentration. Following block 684, the process flow proceeds to block 686 where the measured concentration is compared with the desired concentration. The desired concentration may be a concentration that was previously determined to produce the desired cut. By way of example, the desired concentration may be found experimentally. Following block 686 the process flow proceeds to block 688 where the inputs are controlled based on the comparison. The inputs may for example be abrasive, fluids or already mixed slurry. By way of example, if the measured concentration is lower than the desired concentration, then more abrasive and/or less fluid may be delivered, and if the measured concentration is higher than the desired concentration, then less abrasive and/or more fluid may be delivered.

Figure 32:
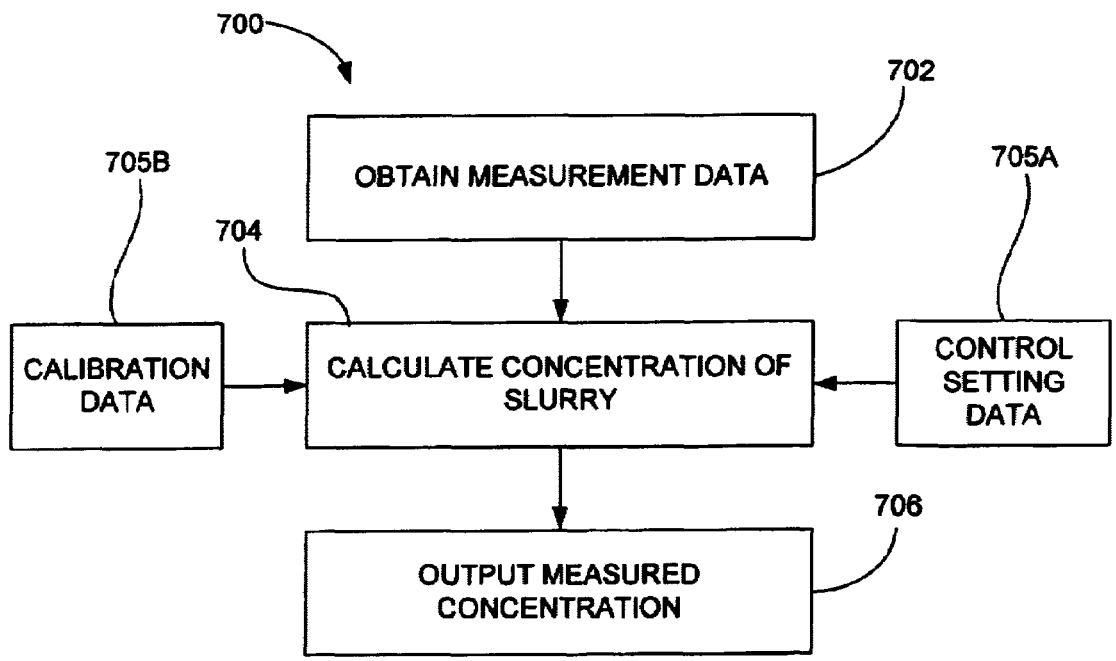
FIG. 32 is a concentration determination method, in accordance with one embodiment of the present invention.

FIG. 32 is a concentration determination method 700, in accordance with one embodiment of the present invention. The method may for example correspond to block 684 in FIG. 31. The method begins at block 702 where measurement data is obtained. The measurement data may for example be light intensity measurements generated from an optical sensing device. The measurement data varies according to the amount of particles in the slurry and thus the measurement data carries information concerning the concentration of the slurry. Following block 702, the process flow proceeds to block 704 where the actual concentration of the slurry is calculated. The calculation generally includes receiving measurement data 702, control setting data 705A and calibration data 705B.

The control setting data 705A may be preprogrammed data or measured data. The control setting data 705A typically includes abrasive size and type, flow rate of the slurry, concentration and the like. The calibration data 705B, on the other hand, generally includes a relationship relating measurement data and control setting data with concentration data. The calibration data may be determined using experimentation or simulation. The calibration data may take many forms including but not limited to tables, graphs, curves, equations, and the like. Using the calibrated relationship, the measurement data, which may include values from multiple detectors, and control setting data, which provides data about the current slurry, can be used to calculate the concentration for the moving slurry. For example, the current measurement and control setting data may be compared to a list of baseline measurement and control setting data that has been calibrated to concentration. When a match is found the calibrated concentration corresponds to the measured concentration. Following block 704, the process flow proceeds to block 706 where the measured concentration is outputted. The measured concentration may for example indicate the abrasive to fluid ratio of the slurry.

Figure 33:
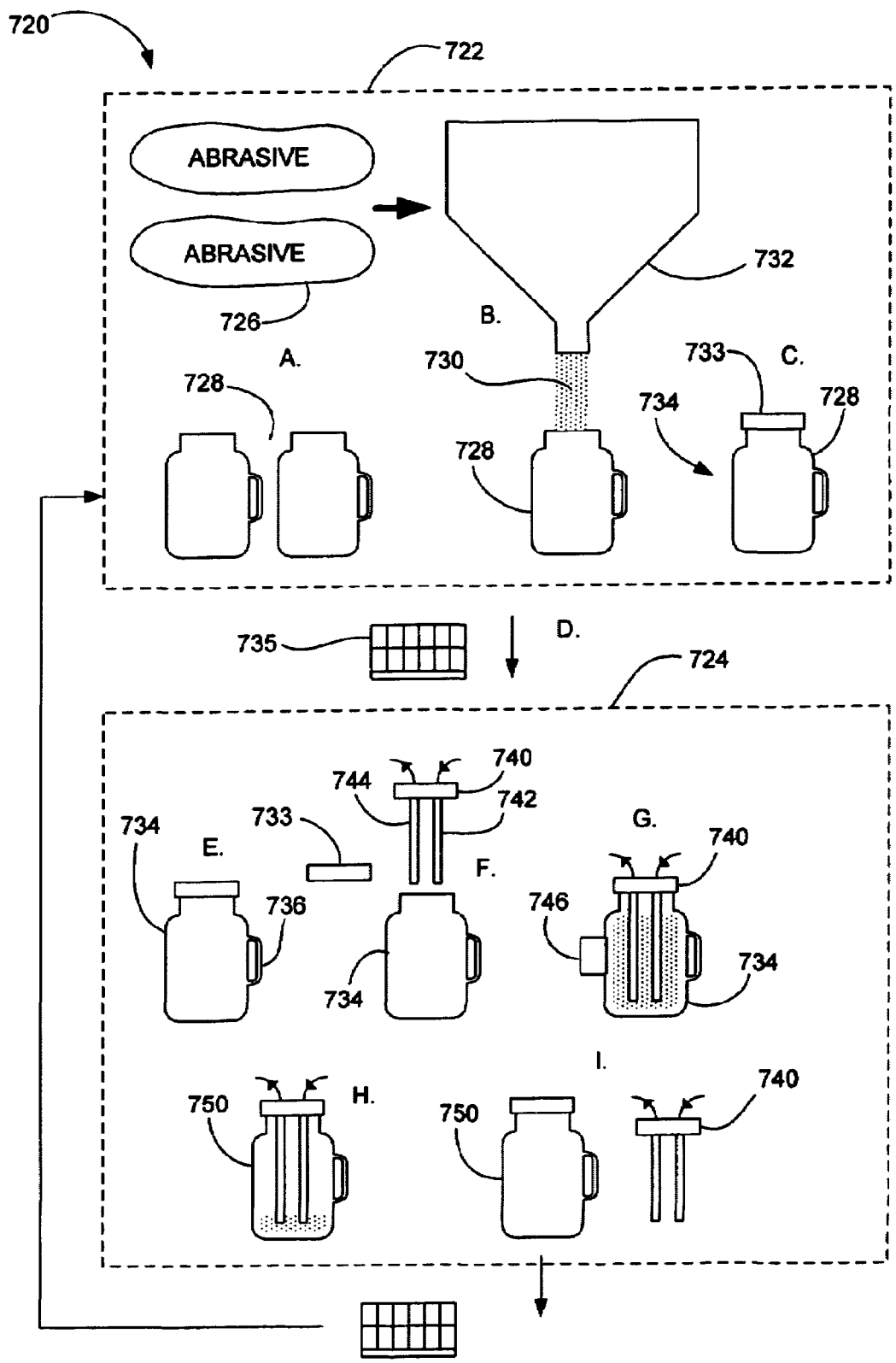
FIG. 33 is a simplified illustration of an abrasive distribution sequence, in accordance with one embodiment of the present invention.

FIG. 33 is a simplified illustration of an abrasive distribution sequence 720, in accordance with one embodiment of the present invention. The abrasive distribution sequence 720 is designed to separate the typically dirty filling process from clean rooms where singulation processes typically take place. Abrasive is typically delivered to clean rooms in sacks and the sacks are loaded into a holding tank before being delivered to a slurry vessel. This is an inherently dirty process since the bags are cut open and the abrasive is poured into the holding tank. During either of these steps, abrasive may spill or leak into undesirable areas thus contaminating the clean room. Furthermore, the sacks are typically heavy and awkward to handle.

The abrasive distribution sequence 720 generally begins at step A where the raw materials are received at the filling room 722 that is separate from the clean room 724. The filling room 722 is a dedicated area where abrasive is prepackaged. The filling room 722 may be onsite or offsite relative to the clean room 724. The raw materials typically include bags of abrasive 726 and empty abrasive containers 728. The containers 728 are formed from a somewhat rigid material unlike the sacks (e.g., paper) and thus they are easier to handle. The containers may for example be formed from metals, plastics and the like. Once received, the abrasive 730 can be loaded into a hopper 732 or similar filling system and thereafter the containers 728 can be filled with abrasive 730 as shown in step B. Once filled, each of the containers 728 is sealed with a cap 733 and cleaned as shown in step C. In most cases, the filled containers 734 are packaged in a group 735 and sent together to the clean room 724 as shown in step D.

Following step D, an operator selects one of the filled containers 734 for loading into a singulation engine as shown in step E. The filled containers 734 are typically sized and dimensioned for easy handling. The filled containers may for example weigh about 50 lbs and they may include a handle 736. Following step E, the sequence 720 proceeds to step F where the container 734 is loaded into an abrasive slurry delivery system. The abrasive slurry delivery system may for example correspond to any of those shown previously. Because of the modular design, the abrasive slurry delivery system includes a receptacle 740 for receiving the filled container 734. The receptacle 740 and filled container 734 cooperate to form the abrasive source. The cap 733 is removed and the top of the container 734 is inserted and lockably sealed to the receptacle 740. This may be accomplished with threads, clamps, quick release couplings, etc. The receptacle 740 generally includes a fluid inlet 742 and a wet abrasive outlet 744. Once sealed, the fluid inlet 742 introduces a fluid such as water into the container 734 as shown in step G. As should be appreciated, the abrasive 730 is easier to transfer when wet. The fluid mixes and agitates the abrasive 730 and a pressure system forces the wet abrasive into the wet abrasive outlet 744 where the wet abrasive is delivered to a slurry vessel. In some cases, the abrasive slurry delivery system may include a vibrator 746 for keeping particles from adhering to the sides of the container 734.

During slurry delivery, the wet abrasive is continuously drawn out of the container 734 until it is empty (or near empty) as shown in step H. Sensors may be used to monitor the amount of abrasive in the container 734. The sensors may be similar to those described previously. The sensors may also be in the form of a load cell that continuously measures the weight of the container 734. Through these measurements, the amount of abrasive in the container 734 can be ascertained. Once emptied, the process flow proceeds to step I where the emptied container 750 is removed from the receptacle 740 and a new filled container 734 is inserted onto the receptacle 740 (step F). The emptied container 750 is capped and removed from the clean room 724. Once removed from the clean room 724, the empty container 750 can be trashed, recycled or reused. If reused, the container 750 is cleaned and returned to the filling room 722 where the process starts over.

Figure 34A:
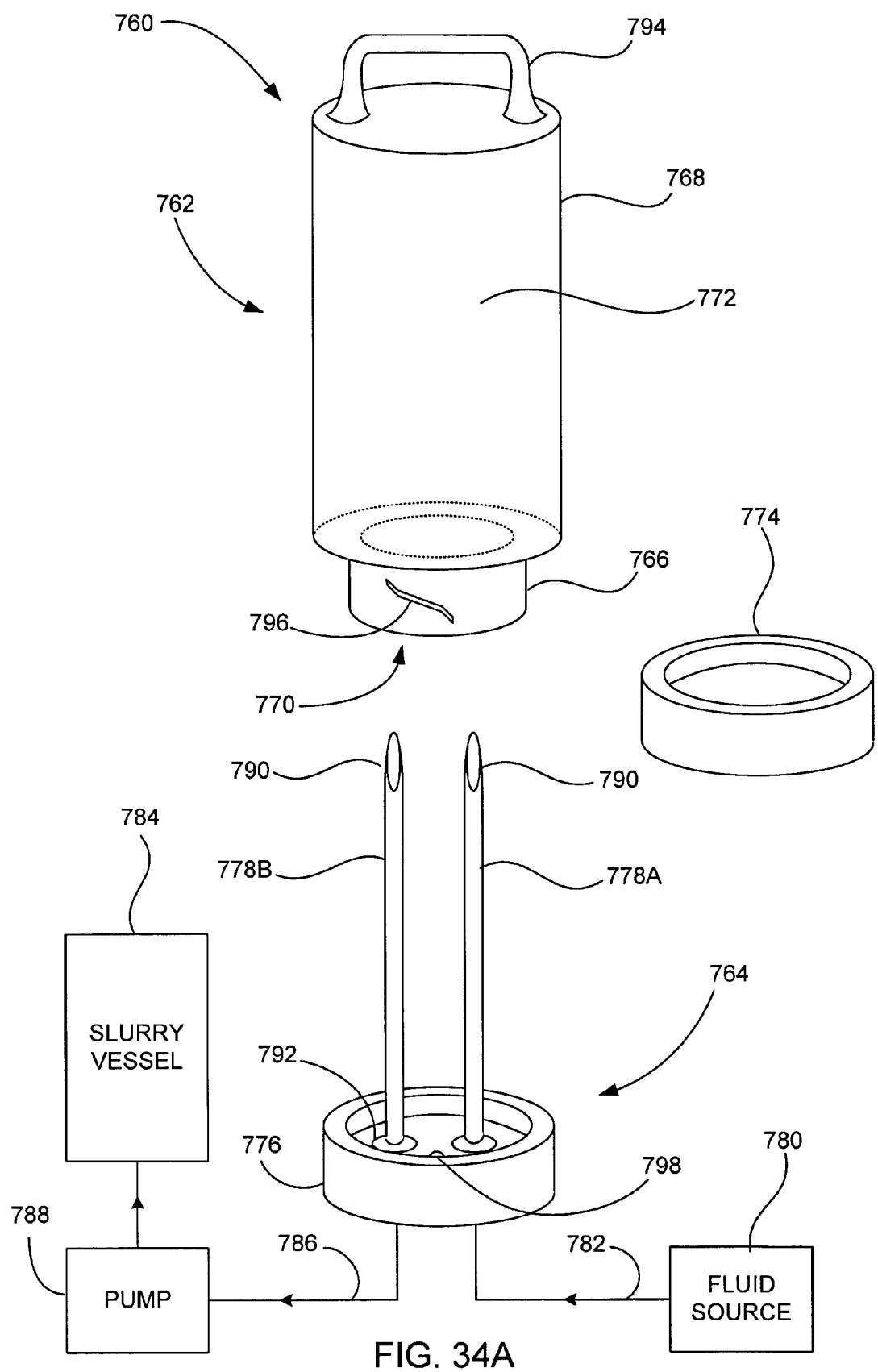
FIG. 34 is diagram of an abrasive source, in accordance with one embodiment of the present invention.

FIG. 34 is diagram of an abrasive source 760, in accordance with one embodiment of the present invention. The source 760 includes at least an abrasive canister 762 and an abrasive delivery receptacle 764. The canister 762, which comes preloaded with abrasive material, is a modular unit that can be installed and removed to and from an abrasive slurry delivery system with simplicity and ease. The receptacle 764, on the other hand, resides within the delivery system and provides a means for operatively coupling the canister 762 to the delivery system. By way of example, the abrasive canister 762 and receptacle 764 may generally correspond to the container and receptacle shown in FIG. 33.

To elaborate, the canister 762 includes a neck 766 and a body 768. The body 768 provides a structure for holding and carrying the abrasive material. The body 768 is preferably configured to contain enough abrasive for one or more hours of operation while still allowing it to be easily manipulated by an operator in its full state. The body 768 may contain between about 25 to 100 pounds, more particularly between about 50 and about 75 pounds, and even more particularly about 50 pounds. The neck 766, on the other hand, provides a structure for filling and removing the abrasive material. The neck 766, which includes an opening 770 leading to a chamber 772 defined by the body 768, is configured to receive a cap 774 thereon for closing off and sealing the chamber 772. The cap 774 may be threaded or snapped on the neck 766. The neck 766 is also configured to engage the receptacle 764 so that the abrasive material can be introduced into the delivery system.

The receptacle 764 includes a base 776 and a pair of tubes 778. The base 776 may be free floating or it may be structurally attached inside an abrasive loading area of the delivery system. The base 776 is configured to temporarily receive the neck 766 of the canister 762. The base 776 may receive the neck 766 upside down (as shown), and in other cases the neck 766 may be positioned right side up or sideways when engaging the base 776. More particularly, the neck 766 and the base 776 are configured for mating engagement so as to provide both a mechanical and a fluid connection between the canister 762 and the receptacle 764. These elements have similar cross sectional shapes and sizes so they fit within one another. In most cases, the neck 766 is secured and sealed to the base 776 in order to prevent the leakage of abrasive material and fluids. This may be accomplished with seals such as o-rings, washers and/or gaskets and fasteners such as bolts and screws. By way of example, a washer may be placed at the interface between the neck 766 and the base 776 and bolts may be placed through several mounting holes located on mating flange portions of the neck 766 and base 776. When bolted together, the washer is sandwiched between the neck 766 and the base 776 thus sealing the interface therebetween.

While fasteners such as bolts and screws work well, it is often necessary to unfasten and remove each of these fasteners in order to mount or remove the neck from the base. Unfortunately, this is time consuming and cumbersome process. Furthermore, it requires tools and more than one hand. In accordance with one embodiment, therefore, the connection between the neck 766 and the base 776 is arranged for insertion and removal with minimal effort and without tools. This may be accomplished with quick release couplings that enable a user to easily and quickly secure and release the head to and from the base. The quick release couplings may take many forms including but not limited to latches, clamps, threads, detents, flexures, snaps and the like. By way of example, the inner periphery of the base 776 may include an internal thread that mates with an external thread on the outer periphery of the neck 766 (or vice versa). In this arrangement, the neck 766 is secured and sealed to the base 776 by screwing the neck 766 onto the base 776. The external thread on the neck 766 may also receive a threaded cap 774.

Moving along, when the neck 766 is mated with the base 776, the tubes 778 extend into the chamber 772 of the body 768. A first tube 778A is configured to carry a fluid such as water into the chamber 772, and a second tube 778B is configured to carry the wetted abrasive material out of the chamber 772. The first tube 778A is fluidly coupled to a fluid source 780 that delivers the fluid at low pressures as for example around 60 psi via a fluid line 782. The second tube 778B is fluidly coupled to a slurry vessel 784 via a slurry line 786. In order to move the wet abrasive through the slurry line 786, the wet abrasive material is typically pressurized as for example using a pump 788. In some cases, the tubes 778 include tapered sections 790 at their ends in order to make insertion into the abrasive material easier, i.e., the tapered sections 790 cut through the abrasive material contained within the chamber 772 better than a blunt end.

The base 776 and tubes 778 may be formed from a wide variety of materials, but generally from materials that are resistant to abrasive materials. By way of example, the base 776 and tubes 778 may be formed from stainless steel or plastic. Furthermore, the tubes 778 may be integrally connected to the base 776 or they may be separate components. When separate, the interface therebetween may need a rubberized seal 792 in order to prevent leaks.

Moreover, in order to facilitate the mounting and removal of the canister 762 to and from the receptacle 764, the canister 762 generally includes one or more handles 794 that allow a user to easily manipulate and move the canister 762. The handles 794 may be separate or integrally formed with the canister 762. When separate, the handle 794 may be attached using fasteners, clamps, straps and the like. When integral (as shown), the body 768 and handle 794 form a single continuous piece. By way of example, the handle 794 and body 768 may be formed from a single piece of material, or the handle 794 may be welded or glued to the surface of the body 768. The handle 794 may be connected to any portion of the body 768 including the top, sides and/or bottom surfaces. The position of the handle 784 generally depends on how the canister 762 is connected to the receptacle 764.

In the illustrated embodiment, the handle 794 is placed on the top of the body 768 and the canister 762 is loaded into the receptacle neck 766 down. Although not shown, a membrane may be attached over the opening 770 in the neck 766 in order to keep the abrasive form pouring out of the neck 766 when positioned neck down. The tapered ends of the tubes 778 pierce through the membrane during placement. In most cases, the membrane is configured to seal the interface between the membrane and the piercing tubes 778 in order to prevent particles from leaking out. By way of example, the membrane may be formed from a flexible film or foil that conforms to the shape of the tubes 778.

Moreover, the neck 766 is coupled to the base 776 via a quick release coupling. The quick release coupling includes a base side mating feature and a neck side mating feature that are cooperatively positioned so that they engage when the neck 766 is inserted into the base 776. Although the mating features may be widely varied, in this particular arrangement the neck 766 (or body) includes a guide 796 and the base 776 (or some other structure) includes a pin 798 that is positionable relative to the guide 796. The guide 796 may be a protrusion that extends outside the periphery of the neck 766 or it may be a recess that extend into the neck 766. In either case, the guide 796 is configured to engage the pin 798 upon insertion of the neck 766 into the base 776 and to capture the pin 798 when the canister 762 is rotated relative to the receptacle 764. Once captured, the neck 766 is secured to the base 776. The canister 762 may be rotated by twisting the canister 762 via the handle 794 located on the top of the body 768.

Figures 34B, 35:
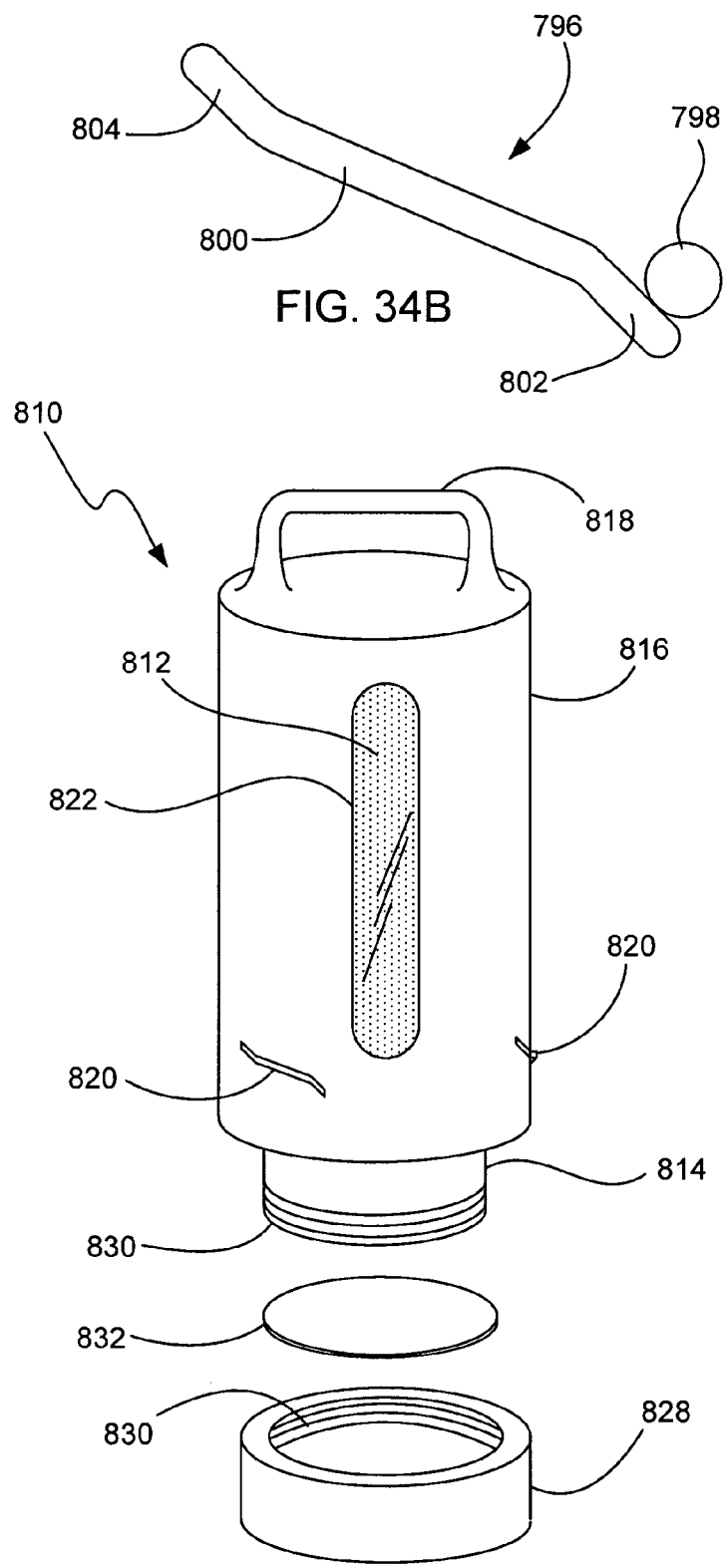
FIG. 35 is an exploded perspective view of an abrasive canister, in accordance with one embodiment of the present invention.

In order to seal the interface between the neck 766 and the base 776, the guide 796 may be configured in such a way as to force the neck 766 against the base 776 when the canister 762 is further rotated via the handle 794. As shown in FIG. 34B, the guide 796 may include a tapered section 800 that moves against the stationary pin 798 during rotation of the canister 762. As the tapered section 800 moves against the pin 798, the canister 762 is forced downwards. In essence, the pin 798 urges the neck 766 into sealed engagement with the base 776. In most cases, the length of the guide 796 is configured to place the neck 766 into sealed engagement upon a slight turn of the canister 762 relative to the stationary base 776. By way of example, about a $\frac{1}{32}$ to about a $\frac{1}{2}$ turn, and more particularly a ¼ turn may be used. One advantage of this arrangement is that the user does not have to use tools or manipulate a locking feature such as a latch.

To elaborate, the guide 796 generally includes an entry point 802 and a final point 804. The entry point 802 represents the area of the guide 796 that initially receives the pin 798. The entry point 802 may be flared downwards in order to facilitate the easy placement of the pin 798 relative to the guide 796. The final point 804 represents the area of the guide 796 that prevents further rotation and that snaps the neck 766 into locked relationship with the base 776. The final point 804 may be flared upwards in order to facilitate the snapping action that locks the neck 766 to the base 776.

During insertion, the pin 798 is placed at the entry point 802 that helps guide the pin 798 into and out of engagement with the guide 796. When the operator first rotates the canister 762, as for example via the handle 794, the guide 796 captures the pin 798. This action also causes the pin 798 to move against the guide 796. Upon further rotation of the canister 762, the tapered section 800 of the guide 796 presses against the pin 798 thereby forcing the canister 762 downwards towards the receptacle 764. When the canister 762 is finally rotated, the pin 798 is located at the final point 804 where the downward force is increased because of the increased slope. As a result, the neck 766 is sealed against the base 776.

Because the tubes may produce a torque on the membrane when the canister is rotated, the membrane may include a moveable portion that can rotate relative to the canister along with the tubes when the canister is rotated. Alternatively, the quick release coupling may be designed in such a way as to secure the neck to the base via a linear motion rather than a rotation thereby eliminating the torque on the membrane. in this embodiment, the canister is placed straight onto the receptacle. Also alternatively, the tubes may be positioned in a manner that reduces torque as for example next to one another. It should also be noted that the membrane may be made from a flexible material so that it can withstand some of the rotation. In addition, the rotation may be minimized so that the torque is small.

FIG. 35 is an exploded perspective view of an abrasive canister 810, in accordance with one embodiment of the present invention. By way of example, the abrasive canister 810 may generally correspond to the abrasive canister shown in FIG. 34. The abrasive canister 810, which is preloaded with abrasive material 812, is a modular unit that can be installed and loaded into a slurry delivery system with simplicity and ease. The abrasive canister 810 includes a neck 814 and a body 816 formed from a single continuous piece of plastic material. The neck and body 814 and 816 may be formed using conventional plastic forming processes such as injection molding.

The body 816 is configured for holding the abrasive material 812. The volume defined by the body 816 may for example be configured to hold about 50 pounds of abrasive material. The body 816 includes a carrying and twisting handle 818 at its top end. The handle 818 is generally dimensioned for receiving a hand, and for providing structural support during twisting motions, as for example when the canister 810 is connected to a receptacle. The body 816 may also include one or more quick lock guides 820 in order to secure and seal the neck 814 relative to a base of a receptacle. In this embodiment, the guides 820 protrude out of the outer surface of the body 816, and are configured to receive a pin on its upper surface. The pin may be attached to the receptacle or some other structure attached to the receptacle. The body 816 may be formed from a clear material or it may include a clear window 822 for visibility in order to determine when the abrasive material 812 is low, i.e., an operator can visual see when the abrasive is low or an optical sensor can be used. By way of example, the optical sensor may transmit and receive light through the clear material or clear window.

The neck 814, which is positioned at the bottom end of the body 816, is configured to receive a cap 828, which acts as a cover for filled canisters when not in use. The cap 828 and the head 814 may include threads 830 so that the cap 828 can be screwed onto the neck 814. The neck 814 is also configured for insertion into a receptacle. When secured together, the abrasive material 812 stored in the canister 810 can be introduced into a slurry vessel. When removed, the canister 810 is free from the delivery system such that it can be refilled, replaced, recycled, destroyed, etc.

In order to further seal the opening in the neck 814, the canister 810 may include a membrane 832 that attaches to the top edge of the neck 814. The membrane 832 adds additionally protection against contamination and leakage. During use, the membrane 832 may be removable (peeled off), or it may be permanently attached (left on). When peeled off, the tubes of the receptacle can be directly introduced through the neck 814. When left on, the tapered ends of the tubes penetrate the membrane 832 thus leaving the canister 810 substantially sealed during use. This also allows the canister 810 to be positioned in the receptacle in the downward facing position, i.e., prevents the abrasive material 812 from pouring out. By way of example, the membrane 832, which is typically a thin film or foil may be formed from various materials including but not limited to paper, rubber, plastic, and/or the like. Furthermore, the membrane 832 may be attached with an adhesive such as glue. The adhesive is generally applied to the upper edge of the neck 814. The amount and type of adhesive generally determines whether or not the membrane 832 can be peeled off.

The advantages of the invention are numerous. Different embodiments or implementations may have one or more of the following advantages. The present invention provides a cost-effective cutting process for fine geometry devices with both straight line and curvilinear edges. In addition, the water jet cutting process is material non-specific; therefore, laminates and coated devices with both ductile a brittle material can be cut in a single pass. Furthermore, the cutting beam interacts with a substrate only along the vertical axis thereby preventing the formation of shear forces. The devices are therefore retained in their intended position and cut geometries remain consistent. Another benefit of this water and slurry-based method is the continual renewal of inexpensive abrasive ($Al_2O_3$ or garnet). The abrasive is never "dulled" by ductile or compliant materials. The process remains inexpensive and robust, even when singulating laminates of very dissimilar materials. Finally, a single nozzle acts as a point source for cutting, thus, enabling curvilinear cut paths as for example photonic devices.

A comparison between a conventional blade saw and a jet stream is shown below in Table 1. The data in Table 1 was obtained using a first generation lab model. The jet stream was produced using a modified Jetsis microjet system.

TABLE 1

|  |  | Jet Stream | Blade Saw |
|---|---|---|---|
| BGA | Minimum Device Size | 0.5 mm × 0.5 mm | 4.0 mm × 4.0 mm |
| 8 × 8 FBGA | Throughput | 160 mm/sec* | 100 mm/sec |
| 144 units/strip | Chipping | <10 μm | <40 μm |
|  | Consumable Cost | 0.001119 USD/unit | 0.022222 USD/unit |
|  |  | 0.000017 USD/pin | 0.000347 USD/pin |
| QFN | Minimum Device Size | 0.5 mm × 0.5 mm | 4.0 mm × 4.0 mm |
| 4 × 4 QFN 176 | Throughput | 160 mm/sec* | 18 mm/sec |
| units/strip | Chipping | <10 μm | <40 μm |
| full copper no etch | Burrs/Smearing | <10 μm | <50 μm |
|  | Consumable Cost | 0.000852 USD/unit | 0.104748 USD/unit |
|  |  | 0.000053 USD/unit | 0.0065467 USD/pin |
| Photonic | Curvilinear Cut | Yes | No |
| 8" Si Wafer | Throughput | 160 mm/sec* | Not Measurable |
|  | Chipping | <10 μm | <50 μm |
|  | Consumable Cost | Low | Acceptable |

*the throughput was limited by prototype table speed

While this invention has been described in terms of several preferred embodiments, there are alterations, permutations, and equivalents, which fall within the scope of this invention. It should also be noted that there are many alternative ways of implementing the methods and apparatuses of the present invention. For example, although the invention has been described in terms of processing integrated circuits (in all its various forms), it should be noted that the invention may be used to process any device. For example, the invention may be used to process semiconductor wafers. In addition, the invention may be used to process discrete electrical components such as resistors, transistors, capacitors and the like. The invention may also be used to process biotechnological devices, optical devices, opto-electrical devices, electromechanical devices (e.g., MEMS-micro electromechanical) or the like. It is therefore intended that the following appended claims be interpreted as including all such alterations, permutations, and equivalents as fall within the true spirit and scope of the present invention.

What is claimed is:

1. A singulation engine for performing cutting operations on semiconductor substrates, comprising:
   a slurry vessel for mixing an abrasive slurry before the abrasive slurry is delivered to a nozzle system;
   an abrasive source configured to introduce new abrasive into the slurry vessel
   a fluid source configured to introduce new fluid into the slurry vessel;
   a recycled slurry source configured to reintroduce previously used abrasive slurry back into the slurry vessel;
   one or more concentration sensing devices configured to perform measurements so that the abrasive slurry concentration can be ascertained;
   a controller configured to control the amount of abrasive, fluid and recycled abrasive slurry introduced into the slurry vessel based on the concentration measurements.

2. The singulation engine as recited in claim 1 wherein the concentration sensing device comprises:
   a sensor that produces signals associated with the slurry concentration; and
   a sensing circuit that acquires the signals from the sensors and supplies a concentration signal to the controller.

3. The singulation engine as recited in claim 2 wherein the sensor is an optical sensor or an ultrasonic sensor.

4. The singulation engine as recited in claim 2 wherein the sensor includes one or more emitters configured to apply a signal transverse to a moving abrasive slurry and one or more detectors configured to detect changes in the signal that are attributable to the slurry concentration.

5. The singulation engine as recited in claim 4 wherein the sensor includes one or more light emitting devices that direct light or radiation at the moving abrasive slurry, and one or more light detectors that detect changes in the light or radiation after intersecting the moving abrasive slurry.

6. The singulation engine as recited in claim 2 wherein the sensing circuit includes an analog to digital converter configured to convert analog signals produced at the sensors into outgoing digital signals for reception at the controller.

7. The singulation engine as recited in claim 1 wherein a concentration sensing device is located at the output of the slurry vessel.

8. The singulation engine as recited in claim 7 wherein the controller compares measured concentration of the outputted abrasive slurry to a desired concentration of the outputted abrasive slurry and changes the output of at least one of the sources if the two are different in order to produce the desired concentration of the outputted abrasive slurry.

9. The singulation engine as recited in claim 8 wherein the sources are controlled as part of a continuous feedback loop in order to maintain the desired concentration of the abrasive slurry during a particular cutting operation.

10. The singulation engine as recited in claim 1 wherein the abrasive source includes multiple containers configured to hold abrasive.

* * * * *